(12) United States Patent
Konno et al.

(10) Patent No.: US 9,455,240 B2
(45) Date of Patent: Sep. 27, 2016

(54) METHOD OF MANUFACTURING SEMICONDUCTOR DEVICE AND SEMICONDUCTOR DEVICE

(71) Applicant: Renesas Electronics Corporation, Kawasaki-shi, Kanagawa (JP)

(72) Inventors: Jumpei Konno, Kanagawa (JP); Takafumi Nishita, Kanagawa (JP); Nobuhiro Kinoshita, Kanagawa (JP); Kazunori Hasegawa, Kanagawa (JP); Michiaki Sugiyama, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/138,164

(22) Filed: Dec. 23, 2013

(65) Prior Publication Data

US 2014/0183759 A1    Jul. 3, 2014

(30) Foreign Application Priority Data

Dec. 27, 2012    (JP) ................. 2012-286078

(51) Int. Cl.
*H01L 23/488*    (2006.01)
*H01L 23/00*    (2006.01)
(Continued)

(52) U.S. Cl.
CPC ......... *H01L 24/81* (2013.01); *H01L 23/49838* (2013.01); *H01L 24/13* (2013.01); *H01L 24/14* (2013.01); *H01L 24/16* (2013.01); *H01L 24/743* (2013.01); *H01L 24/97* (2013.01); *H01L 21/561* (2013.01); *H01L 21/563* (2013.01); *H01L 23/49816* (2013.01); *H01L 23/49894* (2013.01); *H01L 2224/10175* (2013.01); *H01L 2224/13111* (2013.01); *H01L 2224/13116* (2013.01); *H01L 2224/13144* (2013.01);
(Continued)

(58) Field of Classification Search
CPC ................... H01L 23/49838; H01L 23/81
USPC ........ 257/779, 692, 737, 775, 778; 438/108
See application file for complete search history.

(56) References Cited

U.S. PATENT DOCUMENTS

| | | | |
|---|---|---|---|
| 6,229,711 B1* | 5/2001 | Yoneda | 361/760 |
| 2006/0065437 A1* | 3/2006 | Yumoto et al. | 174/260 |

(Continued)

FOREIGN PATENT DOCUMENTS

| | | |
|---|---|---|
| JP | 2000-077471 A | 3/2000 |
| JP | 2009-016451 A | 1/2009 |
| JP | 2012-028437 A | 2/2012 |

OTHER PUBLICATIONS

Office Action, issued May 24, 2016, in Japanese Application No. 2012-286078.

*Primary Examiner* — Wael Fahmy
*Assistant Examiner* — Sarah Salerno
(74) *Attorney, Agent, or Firm* — Shapiro, Gabor and Rosenberger, PLLC

(57) ABSTRACT

Reliability of a semiconductor device is improved. Each of a plurality of terminals formed on a chip mounting surface included in a wiring substrate has a shape in which a narrow width portion is arranged between adjacent wide width portions in plan view. Moreover, a center of a tip end surface of each of a plurality of protruding electrodes formed on a semiconductor chip mounted on the wiring substrate is arranged at a position where it overlaps the narrow width portion in plan view, and the plurality of terminals and the plurality of protruding electrodes are electrically connected to each other via a solder member.

13 Claims, 45 Drawing Sheets

(51) Int. Cl.
*H01L 23/498* (2006.01)
*H01L 21/56* (2006.01)

(52) U.S. Cl.
CPC ............... *H01L 2224/13147* (2013.01); *H01L 2224/16225* (2013.01); *H01L 2224/32225* (2013.01); *H01L 2224/73204* (2013.01); *H01L 2224/81193* (2013.01); *H01L 2224/81801* (2013.01); *H01L 2224/83192* (2013.01); *H01L 2224/92125* (2013.01); *H01L 2924/0132* (2013.01); *H01L 2924/0133* (2013.01); *H01L 2924/12042* (2013.01); *H01L 2924/15184* (2013.01); *H01L 2924/15311* (2013.01); *H01L 2924/181* (2013.01)

(56) References Cited

U.S. PATENT DOCUMENTS

2009/0011617 A1    1/2009    Ebe et al.
2013/0147030 A1*  6/2013    Chang ............... H01L 23/49838
                                                        257/737

* cited by examiner

FIG. 13
(S1)
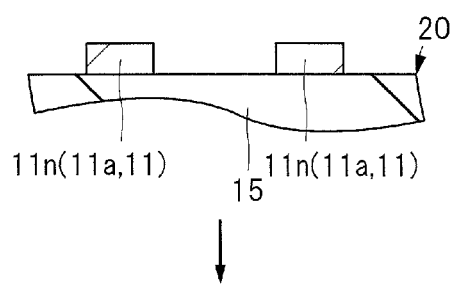
(S2)
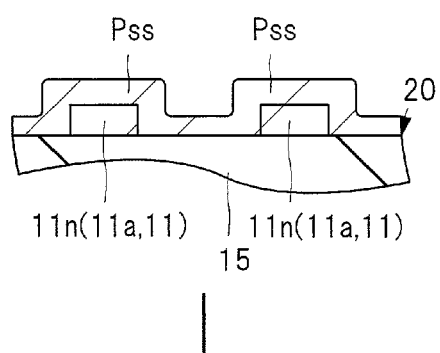
(S3)
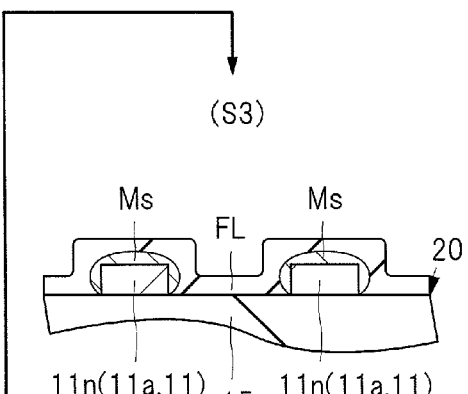
(S4)
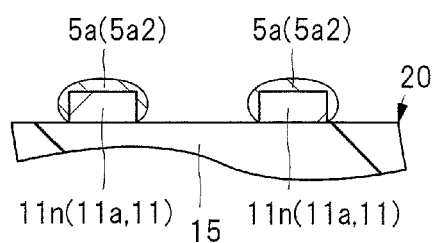

METHOD OF MANUFACTURING SEMICONDUCTOR DEVICE AND SEMICONDUCTOR DEVICE

CROSS-REFERENCE TO RELATED APPLICATION

The present application claims priority from Japanese Patent Application No. 2012-286078 filed on Dec. 27, 2012, the content of which is hereby incorporated by reference into this application.

TECHNICAL FIELD OF THE INVENTION

The present invention relates to a semiconductor device and a manufacturing technique thereof, and, for example, relates to a technique effectively applied to a semiconductor device in which a protruding electrode of a semiconductor chip is connected to a terminal on a substrate via a solder member.

BACKGROUND

Japanese Patent Application Laid-Open Publication No. 2000-77471 (Patent Document 1) describes a mounting method (flip-chip mounting system) in which a bump electrode made of gold formed on a semiconductor chip and a connection pad of a wiring substrate are connected to each other via a solder member.

SUMMARY

The inventors of the present application have studied about a so-called flip-chip connection system in which a wiring substrate and a semiconductor chip are electrically connected to each other via a plurality of protruding electrodes formed on an electrode forming surface of the semiconductor chip.

In the flip-chip mounting system, a plurality of protruding electrodes formed on a plurality of pads of a semiconductor chip and a plurality of terminals (bonding leads) formed on a chip mounting surface of a wiring substrate are electrically connected to each other via a connection member (bonding member) such as a solder member. However, when a layout pitch between terminals (such as the protruding electrodes) adjacent to each other is shortened, existence of a problem has been found out in a viewpoint of reliability of the connection between the protruding electrodes and the terminals.

The above and other preferred aims and novel characteristics will be apparent from the description of the present specification and the accompanying drawings.

A method of manufacturing a semiconductor device according to one embodiment is to provide a configuration in which a narrow width portion is arranged between adjacent wide width portions in plan view in each of a plurality of terminals formed on a chip mounting surface of a wiring substrate. Moreover, a method of manufacturing a semiconductor device according to one embodiment is to electrically connect between the terminals and a plurality of protruding electrodes via a solder member so that center of a tip surface of each of the protruding electrodes formed on a semiconductor chip overlaps the narrow width portion in plan view.

According to the one embodiment, reliability of the semiconductor device can be improved.

BRIEF DESCRIPTION OF THE DRAWINGS

FIG. 13 is an explanatory view schematically illustrating one example of a method of forming the solder member illustrated in FIG. 12;

Figure 1:
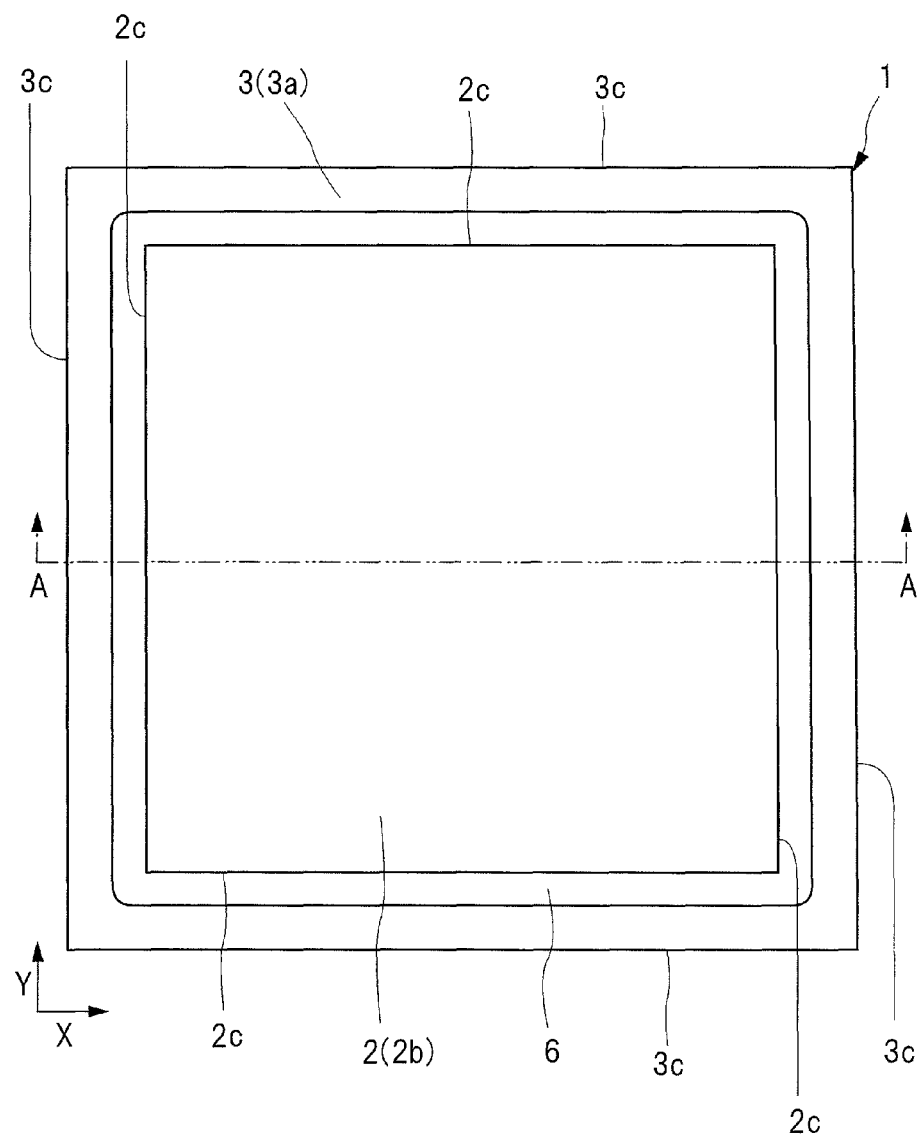
FIG. 1 is a plan view illustrating the entire structure of a chip mounting surface side of a semiconductor device according to one embodiment.

DETAILED DESCRIPTION (Explanation of Description Format, Basic Term, and Usage in Present Application)

In the present application, aspects will be described in a plurality of sections for convenience when required as a matter of convenience. However, these sections are not separately independent from each other unless otherwise stated, and the one of each part of a single example relates to a detailed part, a part of, or the entire of the other as a modification example and others regardless of the context of the description. Also, the repetitive descriptions of the same parts are omitted. Further, each component in the aspects is dispensable unless otherwise stated, when being logically limited to the number thereof, and except the case where the number is apparently limited to a specific number from the context.

Similarly, in the description of the aspects or others, when "formed of A" or others is described for materials, compositions, or others, components other than A are not eliminated unless otherwise or except the case where they are apparently not so from the context. For example, when referring to components, "X containing A as a main component" or others is meant. For example, even when referring to "silicon member" or others, this is not limited to pure silicon, and it is needless to say that this also includes SiGe (silicon germanium) alloy, multi metal alloy containing other-type silicon as a main component, and a member containing other additive and others. In addition, even when referring to gold plating, Cu layer, nickel-plating, and others, they include not only pure components but also members containing gold, Cu, nickel, and others as a main component, respectively, unless otherwise stated or except the case where they are apparently not so.

Further, when referring to the specific number and amount, range, and the like), the number may be larger or smaller than the specific number unless otherwise stated, the case where the number is logically limited to the specific number, or except the case where the number is apparently limited to a specific number from the context.

Still further, in each drawing of the embodiments, the same or similar parts are denoted by the same or similar reference symbols or reference numbers, and the description thereof is not repeated.

Still further, in the present application, terms of an upper surface and a lower surface are sometimes used. However, there are various aspects as mounting aspects of the semiconductor package, and therefore, for example, the upper surface may be arranged below the lower surface in some cases after the semiconductor package is mounted. In the present application, a plane on an element formation surface side of a semiconductor chip is referred to as a front surface, and a plane on an opposite side to the front surface is referred to as a rear surface. Moreover, a plane on a chip mounting surface side of a wiring substrate is referred to as the upper surface or the front surface, and a plane positioned on an opposite side to the upper surface is referred to as the lower surface.

Moreover, in the accompanying drawings, hatching or others is omitted even in a cross-sectional surface in some cases in which it makes the drawings more complicated or in which a space is clearly distinguished. With reference to this, a background contour line is omitted even in a closed hole in plan view in some cases in which it is clear from explanations or others. Further, hatching or a dot pattern is applied even not in a cross-sectional surface in order to clearly indicate that the corresponding portion is not the space or to clearly indicate a border of a region.

First Embodiment

Semiconductor Device

Figure 2:
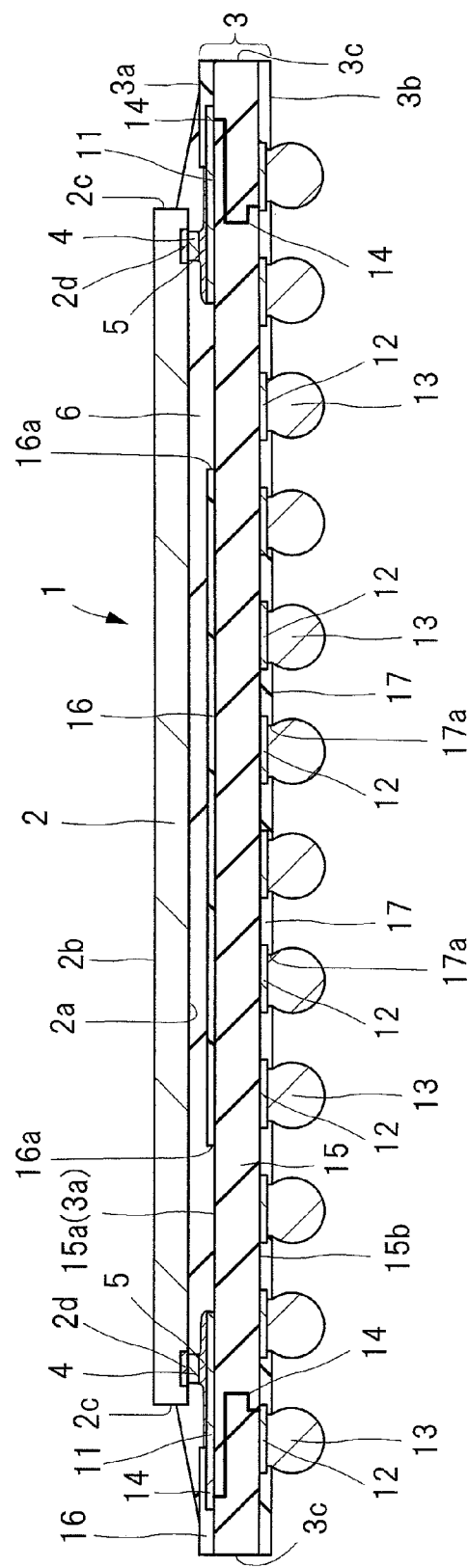
FIG. 2 is a cross-sectional view taken along a line A-A of FIG. 1.
Figure 3:
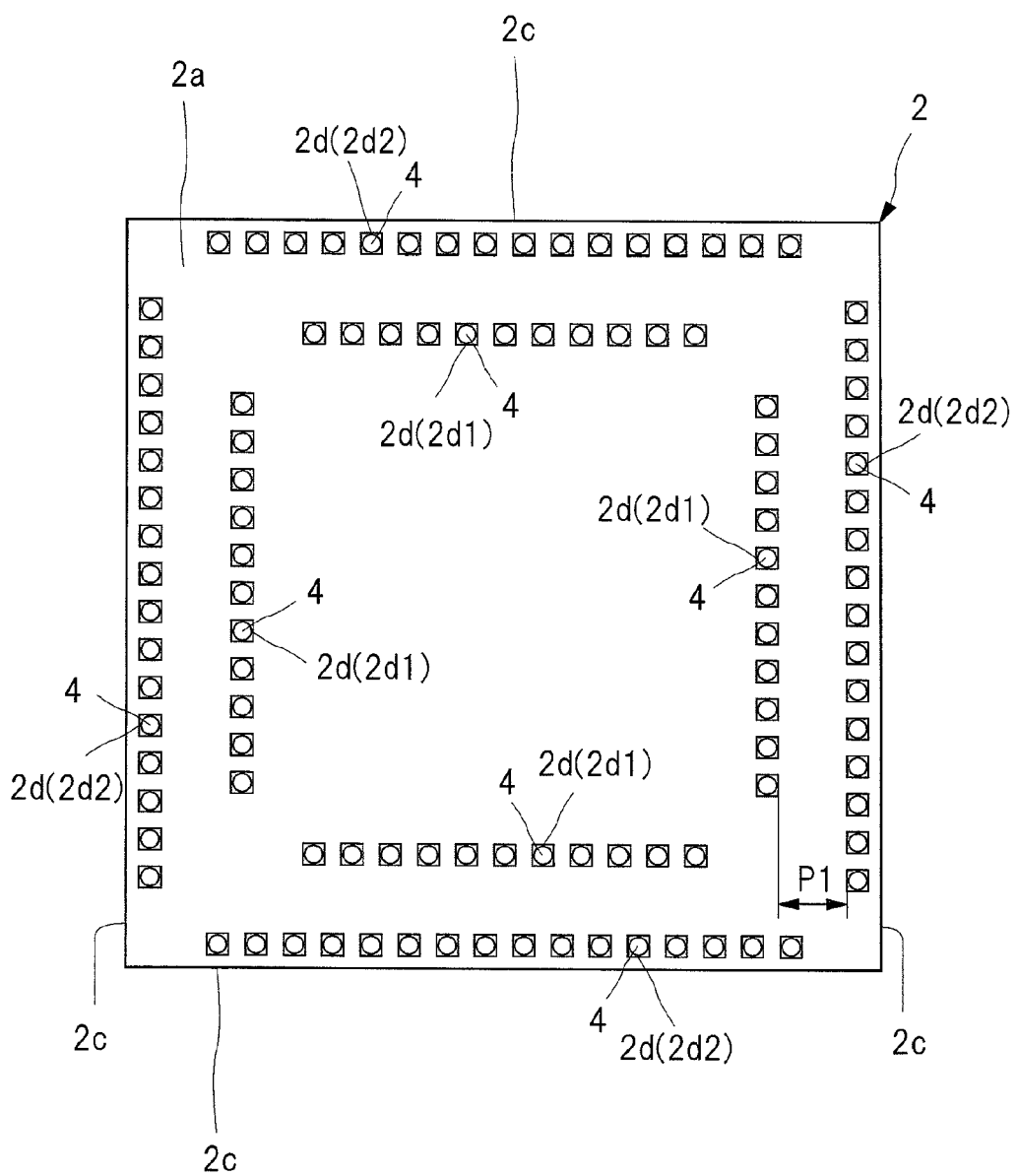
FIG. 3 is a plan view illustrating a front surface (a surface facing a wiring substrate) side of the semiconductor chip illustrated in FIG. 1.
Figure 4:
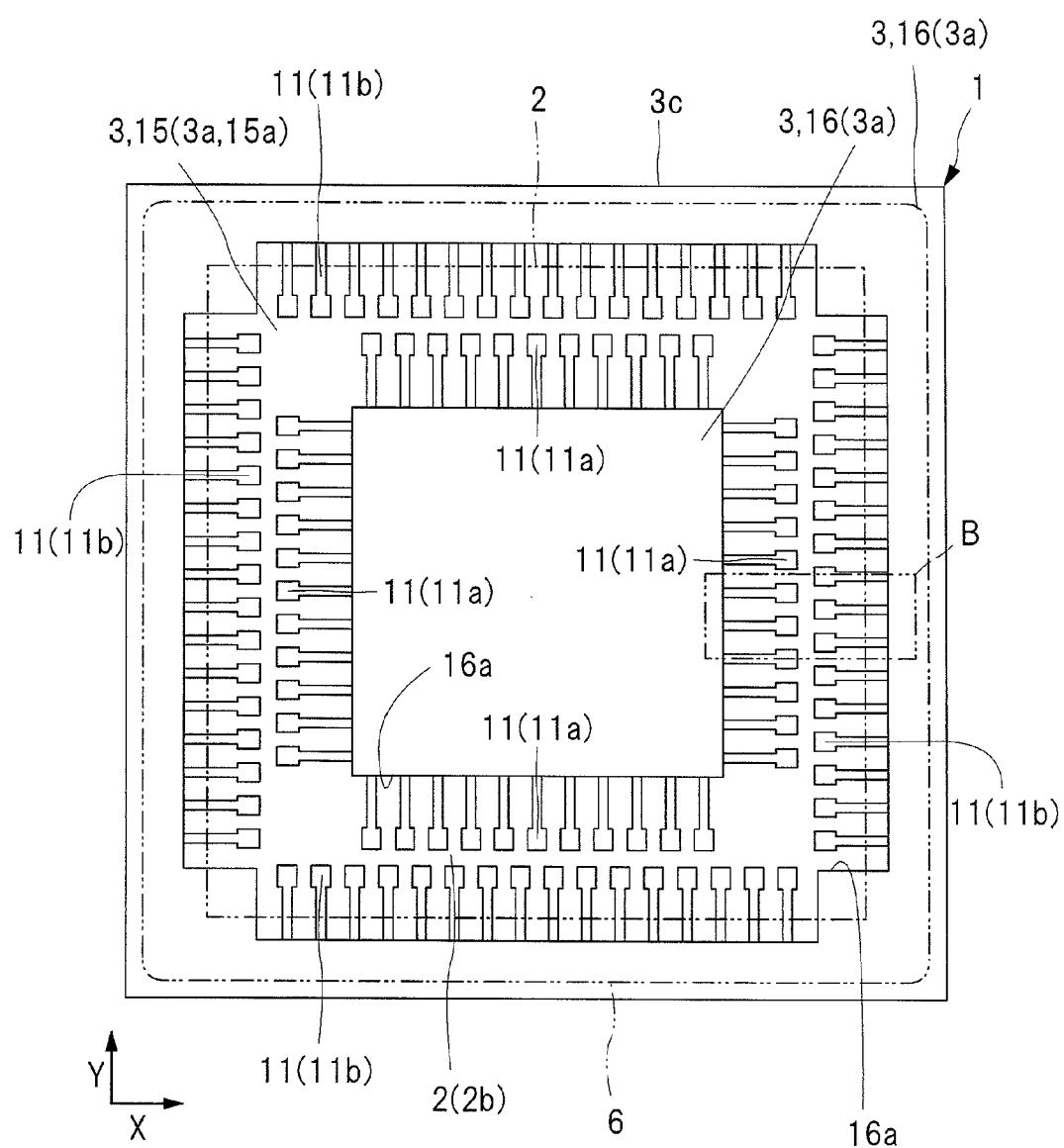
FIG. 4 is a plan view illustrating a chip mounting surface side of the wiring substrate from which the semiconductor chip illustrated in FIG. 1 is removed.
Figure 5:
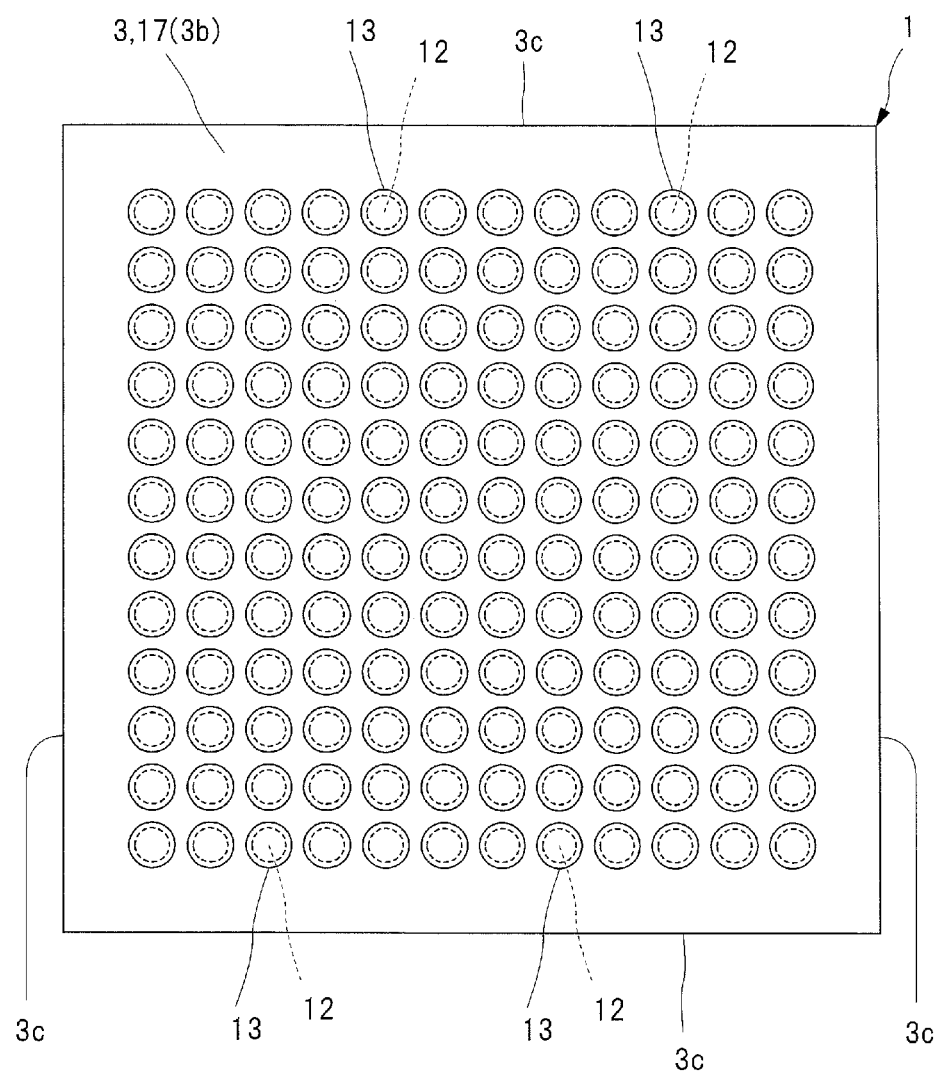
FIG. 5 is a plan view illustrating a rear surface (mounting surface) side of the semiconductor device illustrated in FIG. 1.

FIG. 1 is a plan view illustrating the entire structure of a chip mounting surface side of a semiconductor device of the present embodiment. FIG. 2 is a cross-sectional view taken along a line A-A of FIG. 1. Moreover, FIG. 3 is a plan view illustrating a front surface side (a surface facing a wiring substrate) of the semiconductor chip illustrated in FIG. 1. Further, FIG. 4 is a plan view illustrating a chip mounting surface side of the wiring substrate from which the semiconductor chip illustrated in FIG. 1 is removed, and FIG. 5 is a plan view illustrating a rear surface side (a mounting surface side) of the semiconductor device illustrated in FIG. 1. Note that, in FIGS. 2 to 5, in order to easily illustrate shapes of a pad $2d$ and a terminal 11 included in the semiconductor device 1 of the present embodiment, plane dimensions of a plurality of the pads $2d$ and terminals 11 are illustrated to be larger than those dimensions explained as exemplified below.

As illustrated in FIG. 1, the semiconductor device 1 of the present embodiment has a semiconductor chip 2 and a wiring substrate (referred to also as a base member or an interposer) 3 that is a base member on which the semiconductor chip 2 is mounted and which is electrically connected to the semiconductor chip 2.

The semiconductor chip 2 has a front surface $2a$ (see FIGS. 2 and 3) and a rear surface $2b$ (see FIGS. 1 and 2) positioned on an opposite side of the front surface $2a$, which form a quadrangular shape in plan view. For example, in an example illustrated in FIG. 3, a plane shape of the semiconductor chip 2 is square having a side length of about 5 mm. Moreover, the semiconductor chip 2 has a side surface $2c$ (see FIG. 2) positioned between the front surface $2a$ and the rear surface $2b$.

Moreover, the semiconductor chip 2 is provided with a semiconductor substrate (whose illustration is omitted) made of, for example, silicon, and a plurality of semiconductor elements (whose illustration is omitted) such as transistors are formed on a main surface serving as an element formation surface of the semiconductor substrate. On the main surface of the semiconductor substrate, a wiring layer (whose illustration is omitted) provided with a plurality of wires and an insulating film for electrically insulating between the plurality of wires is stacked. The plurality of wires on the wiring layer are electrically connected to the plurality of semiconductor elements to form an integrated circuit.

Moreover, on the front surface $2a$ (see FIG. 3) of the semiconductor chip 2, a plurality of pads (referred to also as electrode pads, bonding pads, and chip electrodes) $2d$ are formed. The plurality of pads $2d$ are formed on the uppermost layer of the wiring layer stacked on the semiconductor substrate, and are electrically connected to the plurality of semiconductor elements via the plurality of wires of the wiring layer. Further, the front surface $2a$ of the semiconductor chip 2 is covered with an insulating film made of, for example, silicon oxide ($SiO_2$) or others. However, on the plurality of pads $2d$, an opening is formed in the insulating film covering the front surface $2a$. And, the pad $2d$ is exposed from the insulating film in the opening. In this manner, the plurality of pads $2d$ formed on the front surface $2a$ of the semiconductor chip 2 are electrically connected to the plurality of semiconductor elements included in the semiconductor chip 2, and are functioned as external terminals (in other words, electrodes) of the semiconductor chip 2.

In the present embodiment, for example, as illustrated in FIG. 3, the plurality of pads $2d$ are arranged along four side surfaces $2c$ (sides) of the semiconductor chip 2. The front surface $2a$ of the semiconductor chip 2 is partitioned, for example, into a main circuit formation region (logical circuit formation region) on which a main circuit (referred to also as a core circuit) such as a logical circuit is formed and into an input/output terminal formation region (referred to also as an I/O region) in which the plurality of pads $2d$ are arranged. Moreover, in the example illustrated in FIG. 3, the main circuit formation region is formed in a center portion of the front surface $2a$, and the input/output terminal formation region is arranged so as to surround the main circuit formation region. Even when, for example, a stress occurs in the plurality of pads $2d$, influence of the stress on the main circuit can be suppressed by partitioning the main circuit formation region and the input/output terminal formation region from each other as described above. Moreover, by collecting the input/output terminal formation region on a peripheral edge portion of the front surface $2a$, the number of the pads $2d$ serving as the external terminals can be increased, and an area of the main circuit formation region can be enlarged.

Moreover, in the present embodiment, the plurality of pads $2d$ are arranged in a plurality of rows (two rows in FIG. 3) along the four side surfaces $2c$ of the semiconductor chip 2. In other words, the semiconductor chip 2 is provided with a plurality of first-row pads $2d1$ arranged along the side surfaces $2c$ and a plurality of second-row pads $2d2$ arranged between the first-row pads $2d1$ and the side surfaces $2c$. Note that in the present embodiment, the first-row pads $2d1$ and the second-row pads $2d2$ (whose illustration is omitted) are arranged outside the main circuit formation region. However, if a configuration capable of relaxing the stress is adopted to the pads $2d$ or if the stress is not considered, for example, the first-row pads $2d1$ may be arranged inside the main circuit formation region.

The first-row pads 2*d*1 and the second-row pads 2*d*2 are provided so as to correspond to the respective four side surfaces 2*c* of the semiconductor chip 2. By arranging the pads 2*d* along the respective side surfaces 2*c* in the plurality of rows as described above, the number of the pads 2*d* can be increased more than that in a case of arrangement in a single row. When the pads 2*d* are arranged in the plurality of rows as described above, it is preferred to arrange them in a so-called zigzag (chidori in Japanese) arrangement in which the first-row pads 2*d*1 and the second-row pads 2*d*2 are alternately arranged along the side surfaces 2*c* as illustrated in FIG. 3. By arranging the pads 2*d* in the zigzag arrangement, a wire 2*e* (see FIG. 8 described later) is arranged between the first-row pads 2*d*1 adjacent to each other so as to be electrically connected to the second-row pads 2*d*2. In other words, the first-row pad 2*d*1 can be arranged between the wires connected to the second-row pads 2*d*2. Therefore, a wiring layout on the main surface of the semiconductor chip 2 is efficiently performed (provides a narrower pitch), and therefore, the number of the pads 2*d* serving as the external terminals can be increased, and the area of the main circuit formation region can be enlarged.

As illustrated in FIGS. 1 and 2, the semiconductor chip 2 is mounted on the wiring substrate 3. The wiring substrate 3 has an upper surface (referred to also as a chip mounting surface or a front surface) 3*a* (see FIGS. 2 and 4) and a lower surface (referred to also as a mounting surface or a rear surface) 3*b* (see FIGS. 2 and 5) positioned on an opposite side of the upper surface 3*a*, which form a quadrangular shape in plan view. For example, in an example illustrated in FIG. 3, a plane shape of the wiring substrate 3 is square having a side length of about 7 mm to 8 mm. Moreover, the wiring substrate 3 also has a side surface 3*c* (see FIG. 2) positioned between the upper surface 3*a* and the lower surface 3*b*.

As illustrated in FIG. 4, on the upper surface 3*a* of the wiring substrate 3, a plurality of terminals (for example, bonding leads) 11 are arranged. More specifically, the wiring substrate 3 has an insulating layer 15 that is a base member referred to as a core layer or a core material, and conductor patterns made of, for example, copper (Cu) including a plurality of terminals 11 and wires connected to the terminals 11 are formed on the upper surface 15*a* of the insulating layer 15. These conductor patterns covered with a solder resist film (referred to also as an insulating film and a protective film) 16 formed on the upper surface 15*a*. Moreover, in the solder resist film 16, openings 16*a* are formed at positions where the plurality of terminals 11 are arranged, and the plurality of terminals 11 are exposed from the solder resist film 16 in the openings 16*a*.

Moreover, in plan view, the plurality of terminals 11 are arranged at positions where they overlap the plurality of pads 2*d* of the semiconductor chip 2 (see FIG. 3). Therefore, in the present embodiment, the plurality of terminals 11 are arranged along the respective sides of the chip mounting region which is the region overlapping the semiconductor chip 2 (more specifically, respective sides of a chip mounting portion forming the quadrangular shape in plan view). Moreover, in the present embodiment, the plurality of pads 2*d* are arranged in a plurality of rows (two rows in FIG. 4) along the respective sides of the chip mounting region which is the region overlapping the semiconductor chip 2. In other words, the upper surface 3*a* of the wiring substrate 3 is provided with a plurality of first-row terminals (first-row bonding leads) 11*a* which are arranged along the respective sides of the chip mounting region and a plurality of second-row terminals (second-row bonding leads) 11*b* which are arranged between the first-row terminals 11*a* and the respective sides of the chip mounting region. In still other words, the plurality of terminals 11 include the plurality of first-row terminals 11*a* electrically connected to the plurality of first-row pads 2*d*1 and the plurality of second-row terminals 11*b* electrically connected to the plurality of second-row pads 2*d*2. Moreover, the first-row terminals 11*a* and the second-row terminals 11*b* are arranged at positions where they face to the pads 2*d* (see FIG. 3) of the semiconductor chip 2, respectively. Therefore, they are arranged in the zigzag arrangement so as to correspond to the arrangement of the pads 2*d*.

Meanwhile, as illustrated in FIG. 5, a plurality of lands 12 serving as external terminals of the semiconductor device 1 are arranged on the lower surface 3*b* of the wiring substrate 3, and the plurality of lands 12 are bonded to a plurality of solder balls 13 serving as mounting terminals when the semiconductor device 1 is mounted on a mounting substrate not illustrated. More specifically, as illustrated in FIG. 2, the wiring substrate 3 has the insulating layer 15, and conductor patterns made of, for example, copper (Cu) including the plurality of lands 12 and wires connected to the lands 12 are formed on the lower surface 15*b* of the insulating layer 15. These conductor patterns are covered with a solder resist film (referred to also as an insulating film or a protective film) 17 formed in a manner so as to cover the lower surface 15*b*. Moreover, in the solder resist film 17, openings 17*a* are formed at positions where the lands 12 are arranged, and the plurality of lands 12 are exposed from the solder resist film 17 in the openings 17*a*. Further, the solder balls 13 to be bonded to the lands 12 are conductive bonding members used for electrically connecting the plurality of terminals on the mounting substrate side with the plurality of lands 12 when the semiconductor device 1 is mounted on the mounting substrate not illustrated.

Moreover, as illustrated in FIG. 5, in plan view, the plurality of lands 12 and the solder balls 13 are arranged in a line-column shape (referred to also as an array shape or a matrix shape). As the semiconductor device 1, a package in which the plurality of lands 12 (or the solder balls 13) serving as external terminals are arranged in the matrix shape on a mounting surface is referred to as an area-array type of a semiconductor device. In the area-array type of the semiconductor device 1, the lower surface 3*b* of the wiring substrate 3 to be the mounting surface can be effectively utilized as a layout space for the external terminals, and therefore, the number of terminals can be increased while suppressing the increase in the mounting area.

Further, as schematically illustrated in FIG. 2, the plurality of terminals 11 of the wiring substrate 3 are electrically connected to the plurality of lands 12 via the plurality of wires 14 electrically connecting between the upper surface 3*a* side and the lower surface 3*b* side of the wiring substrate 3. In this manner, when the mounting substrate not illustrated and the semiconductor chip 2 are electrically connected to each other, the wiring substrate 3 is functioned as an interposer for intermediating between the mounting substrate and the semiconductor chip 2.

Note that FIG. 2 schematically illustrates the plurality of wires 14 each indicated by using a straight line. However, the plurality of wires 14 include a wire that is drawn in each wiring layer included in the wiring substrate 3 and an interlayer wire (via wire) that electrically connects between the plurality of wiring layers included in the wiring substrate 3. Moreover, as one example, FIG. 2 illustrates the wiring substrate 3 provided with four wiring layers (total four layers including the first layer in the upper surface 15*a* of the insulating layer 15, the second layer and the third layer formed between the upper surface 15a and the lower surface 15b, and the fourth layer in the lower surface 15b). However, the number of the wiring layers is not limited to the four layers, and can be changed in accordance with the number of terminals and the wiring layout.

In the present embodiment, as illustrated in FIG. 2, the mounting is performed so that the semiconductor chip 2 is mounted on the wiring substrate 3 in a state that the front surface 2a of the semiconductor chip 2 faces to the upper surface 3a of the wiring substrate 3, that is, performed by a so-called flip-chip mounting method (face-down mounting method). The plurality of terminals 11 are arranged at positions where they face to the plurality of pads 2d of the semiconductor chip 2, and are electrically connected thereto as illustrated in FIG. 2 via a plurality of protruding electrodes (for example, pillar-shaped electrodes) 4 and solder members 5. Moreover, the semiconductor chip 2 is fixed onto the upper surface 3a of the wiring substrate 3 via the plurality of protruding electrodes 4 and the solder members 5. That is, the semiconductor chip 2 is fixed onto the wiring substrate 3 and is electrically connected to the wiring substrate 3 by bonding the protruding electrodes 4 formed on the pads 2d to the terminals 11 via the solder members 5.

Each of the protruding electrodes 4 of the present embodiment is made of, for example, copper (Cu), and is a pillar-shaped electrode formed in a column shape. Note that the shape of the protruding electrode 4 is not limited to the column shape but may be formed in a rectangular column shape. Moreover, as a component material of the protruding electrode bonded to the electrode pad of the semiconductor chip, not only copper (Cu) but also, for example, gold (Au) may be used. However, by using the protruding electrodes 4 made of copper (Cu) as in the present embodiment, a material cost can be reduced remarkably.

Moreover, each of the solder members 5 and the solder balls 13 of the present embodiment is made of a so-called lead-free solder that does not practically contain lead (Pb), such as only tin (Sn), tin-bismuth (Sn—Bi), tin-silver (Sn—Ag), tin-silver-copper (Sn—Ag—Cu), or others. Here, the lead-free solder refers to a compound having a content of lead (Pb) of 0.1 wt % or less, and this content is defined as a standard of RoHs (Restriction of Hazardous Substances) directive.

Moreover, an under fill resin (sealing body) 6 is arranged between the front surface 2a of the semiconductor chip 2 and the upper surface 3a of the wiring substrate 3, and a bonding portion between the pad 2d and the terminal 11 is sealed by the under fill resin 6. In this manner, by sealing the bonding portion between the pad 2d and the terminal 11 by using the under fill resin 6, a stress applied on the periphery of the bonding portion between the pad 2d and the terminal 11 can be dispersed and relaxed. However, the flip-chip mounting method is not limited to the aspect in which the under fill resin 6 is arranged between the semiconductor chip 2 and the wiring substrate 3 as illustrated in FIG. 2, and can be applied to a configuration in which the under fill resin 6 is not arranged as a modified example.

Peripheral Structure of Terminal Bonding Portion

Figure 6:
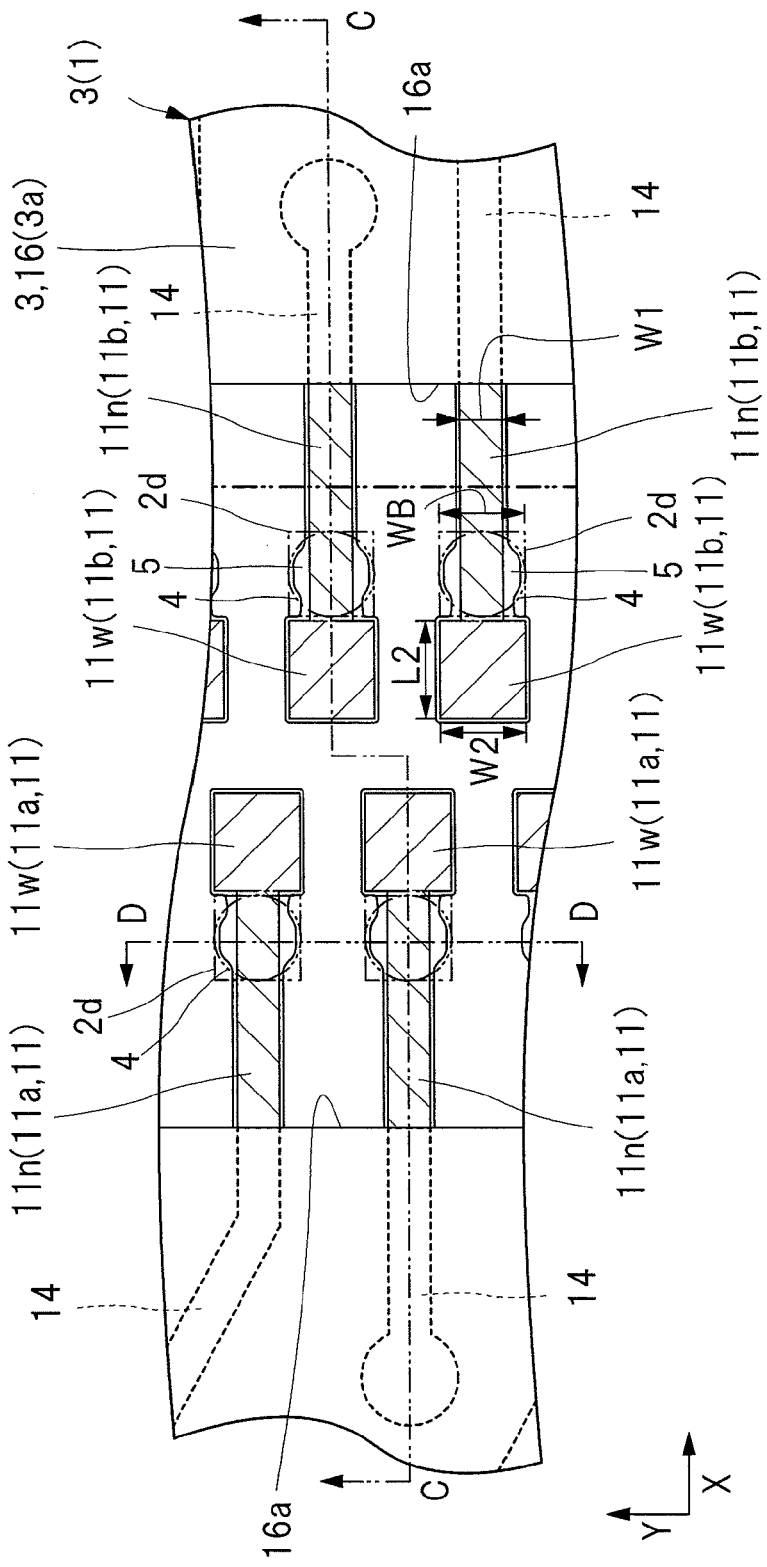
FIG. 6 is an enlarged plan view illustrating a planar positional relation between a terminal and a protruding electrode on a B portion of FIG. 4.
Figure 7:
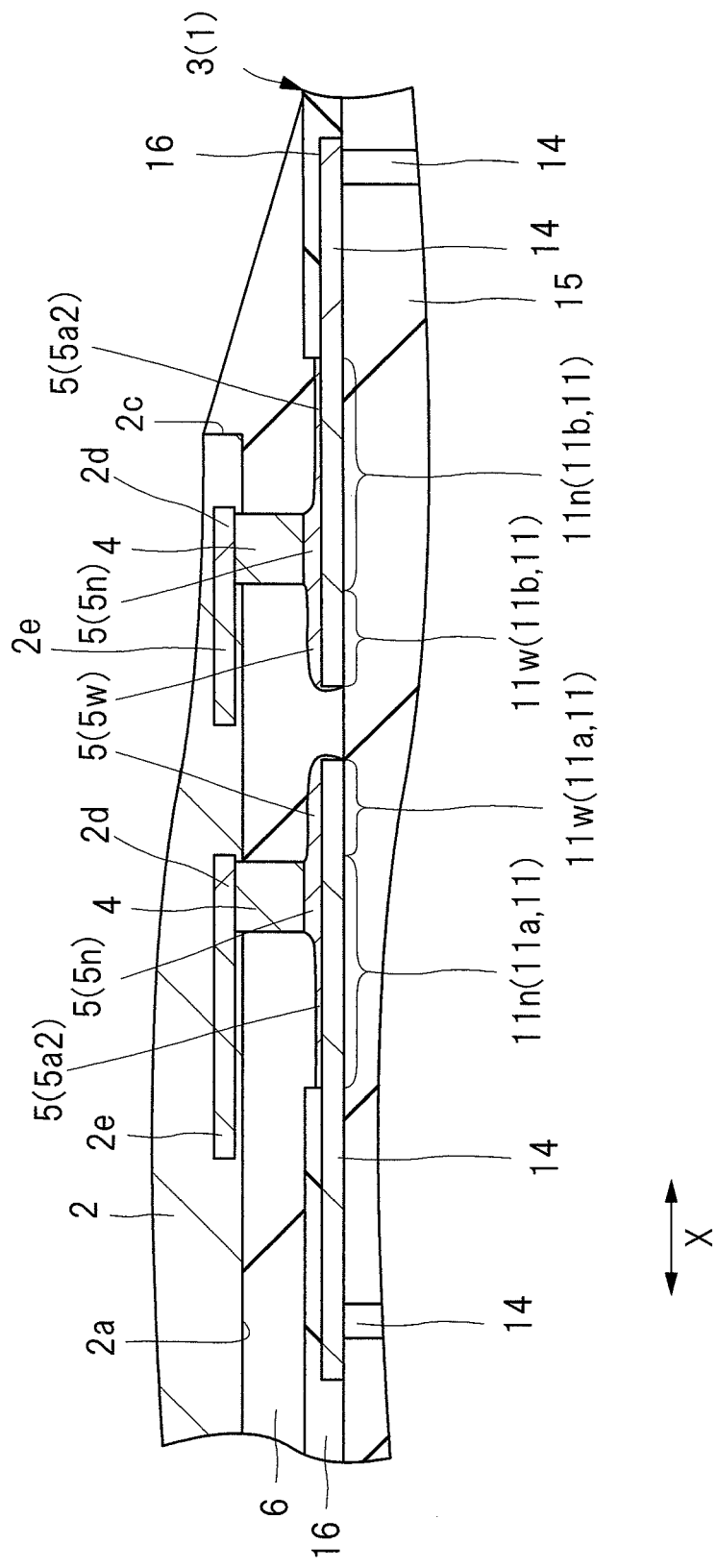
FIG. 7 is an enlarged cross-sectional view taken along a line C-C of FIG. 6.
Figure 8:
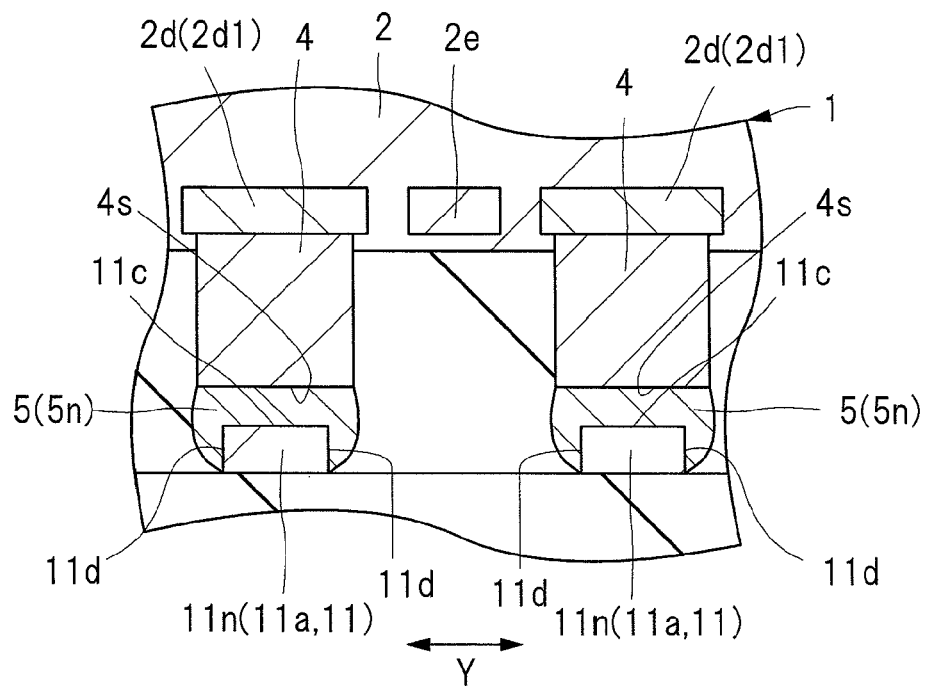
FIG. 8 is an enlarged cross-sectional view taken along a line D-D of FIG. 6.
Figure 9:
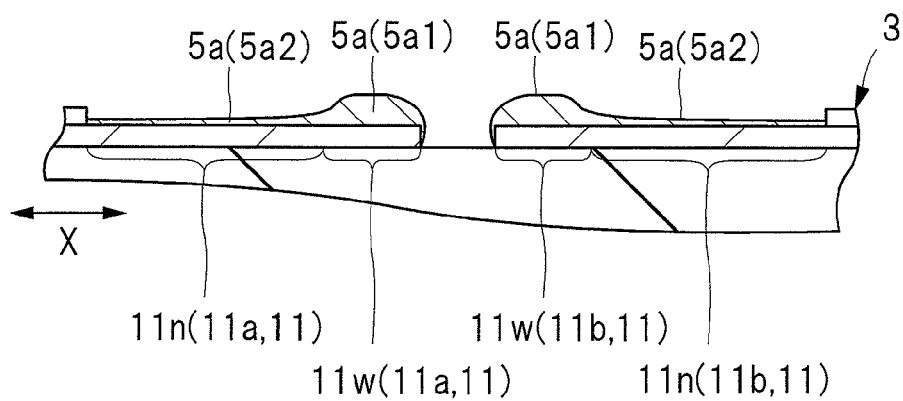
FIG. 9 is an enlarged cross-sectional view illustrating a state in which a solder member is previously applied prior to connection of the protruding electrode to the wiring substrate illustrated in FIG. 7.

Next, a detailed structure of the periphery of the bonding portion between the pad 2d and the terminal 11 illustrated in FIG. 2 will be explained. FIG. 6 is an enlarged plan view illustrating a planar positional relation between the terminal and the protruding electrode in a "B" portion of FIG. 4. Moreover, FIG. 7 is an enlarged cross-sectional view taken along a line C-C of FIG. 6, and FIG. 8 is an enlarged cross-sectional view taken along a line D-D of FIG. 6. Also, FIG. 9 is an enlarged cross-sectional view illustrating a state in which a solder member is previously applied prior to connection of the protruding electrode to the wiring substrate illustrated in FIG. 7.

The plurality of terminals 11 illustrated in FIG. 6 are electrically connected to the plurality of wires 14 formed on the upper surface 3a of the wiring substrate 3 and covered with a solder resist film 16, respectively. The plurality of terminals 11 and the plurality of wires 14 are conductor patterns which are made of the same material as each other and can be formed as one batch. In the present embodiment, it is explained that a portion of the conductor pattern formed on the upper surface 3a of the wiring substrate 3, which is covered with the solder resist film 16, is as the wire 14, and a portion thereof which is exposed from the solder resist film 16 is as the terminal 11.

As illustrated in FIG. 6, each of the plurality of terminals 11 has a wide width portion (referred to also as a thick width portion) 11w formed of a portion having a width (a length in a Y direction orthogonal to an X direction in which the terminal 11 extends in an example illustrated in FIG. 6) W2 in plan view. Moreover, each of the plurality of terminals 11 has a narrow width portion (referred to also as a thin width portion) 11n formed integrally with the wide width portion 11w and formed of a portion having a width (a length in the Y direction orthogonal to the X direction in which the terminal 11 extends) W1 smaller than the width W2 in the planar view. In the present embodiment, the width W2 of the wide width portion 11w is almost the same as the width WB of the protruding electrode 4, and is, for example, about 30 μm to 35 μm. On the other hand, the width W1 of the narrow width portion 11n is smaller (narrower) than the width W2, and is, for example, about 20 μm. And, the plurality of protruding electrodes 4 (in other words, the pads 2d) are arranged at positions where they overlap the narrow width portions 11n of the plurality of terminals 11, and are connected thereto via the solder member 5 illustrated in FIGS. 7 and 8. Note that, when each protruding electrode 4 has the column shape, the width WB of the protruding electrode 4 is defined by a bottom surface of the column shape or a diameter of the bottom surface. Moreover, when each protruding electrode 4 has a quadrangular column shape, the width WB of the protruding electrode 4 is defined by a bottom surface of the quadrangular column shape or a length of one side of the bottom surface.

Incidentally, from a viewpoint of increasing a bonding area between the solder member 5 and the terminal 11 in the region facing the protruding electrode 4, the protruding electrode 4 is preferred to be arranged at the position where it overlaps the wide width portion 11w. However, in the present embodiment, the protruding electrode 4 is arranged at the position where it overlaps the narrow width portion 11n because of the following reasons. Each protruding electrode 4 of the present embodiment is made of copper (Cu) that is more easily oxidized than gold (Au). And, if an oxide film is formed on a surface of each protruding electrode 4, the wettability of the solder member 5 is lowered, and therefore, the bonding strength between the solder member 5 and the protruding electrode 4 is lowered. Therefore, the surface of each protruding electrode 4 is subjected to a heating treatment (local reflow treatment) while being previously covered with a solder member (solder member to be a raw material of the solder member 5) so as to be bonded to the terminal 11.

Meanwhile, the terminals 11 of the present embodiment are made of copper (Cu) as described above. Therefore, as the same as the case of the protruding electrodes 4, if the oxide film is formed on a surface of each terminal 11, the wettability of the solder member 5 is lowered, and therefore, the bonding strength between the solder member 5 and the terminal 11 is lowered. Therefore, the surface of each terminal 11 is subjected to a heating treatment (local reflow treatment) while being previously covered with a solder member (solder member to be a raw material of the solder member 5) so as to be bonded with the protruding electrode 4. In this manner, by the bonding step in the state in which the raw material of the solder member 5 is previously applied to the surface of each protruding electrode 4 and the surface of each terminal 11, the bonding strength of the bonding portion between the protruding electrode 4 and the terminal 11 can be improved.

However, in the case of the bonding step in the state in which the solder member to be the raw material of the solder member 5 is previously applied to the surface of each protruding electrode 4 and the surface of each terminal 11, a large amount of the solder member is required in order to securely cover the surfaces of each terminal 11 and each protruding electrode 4. More particularly, when the solder member to be the raw material of the solder member 5 is applied to the surface of each terminal 11 by using a printing method (described in detail later), a thickness of, for example, about 15 µm to 18 µm is formed.

This case increases the amount of the solder member 5 formed by integrally combining the solder members applied to each protruding electrode 4 and each terminal 11 to each other. Therefore, it has been found that, when a distance between a tip surface 4s of each protruding electrode 4 (see FIG. 8) and the upper surface of each terminal 11 is narrowed by the mounting of the semiconductor chip 2, a part of the solder member 5 interpolated between the tip surface 4s of each protruding electrode 4 and the upper surface of each terminal 11 undesirably protrudes on the periphery of the bonding region (for example, between the protruding electrodes 4 adjacent to each other, illustrated in FIG. 8).

And, when the part of the solder member 5 protrudes on the periphery of the bonding region, the terminals 11 adjacent to each other are electrically connected to each other via the protruded solder member 5 depending on the distance between the adjacent terminals 11 (or between the protruding electrodes 4), and a possibility of short circuit is caused. That is, this is a cause of reduction of the reliability in the semiconductor device. In other words, a configuration in which the short circuit between the adjacent terminals 11 (or between the protruding electrodes 4) is prevented even when the part of the solder member 5 protrudes becomes an obstructive factor in improving a degree of integrity of the terminals by shortening the distance among many terminals. That is, it becomes an obstructive factor in a sophisticated (or downsized) semiconductor device.

As countermeasures to the above-described problem, the following methods are considered. In order to prevent or suppress the formation of the oxide film on the surface of each terminal 11, one method in which the surface of the terminal 11 is coated with a metal film made of a material such as gold (Au) that is more hardly oxidized than copper (Cu) is considered. In this case, even when the solder member to be the raw material of the solder member 5 is not previously applied on the surface of the terminal 11, the lowering of the wettability of the solder member 5 on the surface of the terminal 11 can be suppressed. However, in this case, the solder member 5 flows to the periphery of the bonding region in the reflow treatment, which results in a cause of conduction failure between the protruding electrode 4 and the terminal 11.

Moreover, another method in which the solder member to be the raw material of the solder member 5 is applied (formed) on the surface of each terminal 11 by using a plating method is considered. For example, according to an electrolytic plating method, the solder member (solder film) to be the raw material of the solder member 5 can be applied with a thickness of about 5 µm. However, in order to apply (form) the solder member by the electrolytic plating method, it is required to connect each of the plurality of terminals 11 to a wire (power supply line) used for carrying a current. That is, in the wiring substrate 3, it is required to secure a space for arranging the power supply line for the electrolytic plating, and therefore, the downsizing of the wiring substrate is difficult. Moreover, the degree of freedom for layout for the wires 14 to be connected to the terminals 11 of the wiring substrate 3 is lowered.

Moreover, when the solder member is applied by using an electroless plating method, while it is not required to arrange the power supply line, the solder member tends to be unevenly applied. In other words, the solder member is not formed at the positions facing the protruding electrodes 4 of the terminals 11 in some cases. Moreover, in the electroless plating method, a plated film is deposited through a reduction action, and therefore, the terminals 11 made of copper (Cu) are eroded by the used plating solution, and the bonding failure tends to occur when the protruding electrodes 4 are bonded to the narrow width portions 11n of the terminals 11 as in the present embodiment.

Accordingly, the present inventors of the present application have studied in view of the above-described problems, and have found out the configurations as illustrated in FIGS. 6 to 8. That is, each of the plurality of terminals 11 has the wide width portion (section) 11w having the width W2 in the planar view and the narrow width portion 11n being formed integrally with the wide width portion 11w and having the width W1 smaller than the width W2 in the planar view. And, the protruding electrodes 4 are arranged at the positions where they overlap the narrow width portions 11n and are bonded thereto via the solder member 5. In other words, bonding regions for bonding the protruding electrodes 4 overlap the narrow width portions 11n of the terminals 11.

In the method of applying the solder member to the surfaces of the plurality of terminals 11 by using the printing method, a solder paste containing a solder component and a flux component (component for activating the solder component) or many solder particles (solder powder) with a flux paste (paste containing the flux component) is/are applied to the surfaces of the terminals 11. Then, the heating treatment (reflow treatment) is performed while the flux component and the solder component are in contact with each other, so that the solder component is melted to be formed integrally therewith. At this time, the melted solder component (melted solder) is influenced by the surface tension of the melted solder itself so as to be deformed as having a physically stable shape.

Here, when the plane shape of each terminal 11 on which the solder member is applied is not a simple shape such as a quadrangular shape, the melted solder is deformed by the influence of the surface tension in accordance with the shape of the terminal 11. That is, when there are a wide width portion and a narrow width portion in a metal pattern extending in a certain direction, the melted solder tends to be easily gathered toward the wide width portion.

When this tendency is adapted to an example illustrated in FIG. 6, much melted solder is gathered to the wide width portion 11w, so that a dome-shaped (or hemispherical) solder member (solder mass) 5a1 is formed in accordance with the shape of the wide width portion 11w as illustrated in FIG. 9. On the other hand, on the narrow width portion 11n illustrated in FIG. 6, more particularly, on the region adjacent to the wide width portion 11w, an amount of the solder member (in other words, solder film) 5a2 formed by the melted solder as illustrated in FIG. 9 is less than that on the wide width portion 11w since the melted solder is moved toward the wide width portion 11w.

And, the melted solder is cooled, and residues of the flux component and others are removed by rinsing, so that the solder member (more specifically, the solder member to be the raw material of the solder member 5) is applied on the terminals 11 while the shape formed by the surface tension of the melted solder is maintained. That is, of the solder member 5a previously applied onto the surface of each terminal 11, the amount (or the thickness) of the solder member 5a2 formed on the narrow width portion 11n is smaller than the amount (or the thickness) of the solder member 5a1 formed on the wide width portion 11w. In other words, in the present embodiment, each of the plurality of terminals 11 has the shape having the wide width portion 11w and the narrow width portion 11n, so that the solder member 5a2 can be stably thinly formed even when, for example, the method of applying the solder member 5a by the printing method is used.

For example, in the present embodiment, the thickness of the solder member 5a1 (a distance from the upper surface of the terminal 11 to the highest point of the solder member 5a1) is 10 μm or larger. However, when the solder member 5a is applied by the printing method, it is particularly preferred that the thickness of the solder member 5a1 be 15 μm or larger. On the other hand, the thickness of the solder member 5a2 (a distance from the upper surface of the terminal 11 to the highest point of the solder member 5a2) is 7 μm or smaller. However, when the thickness of the solder member 5a1 is set to 20 μm or larger, the thickness of the solder member 5a2 is 10 μm or smaller in some cases.

In this manner, according to the present embodiment, the thickness of the solder member 5a2 applied onto the narrow width portion 11n can be stably thinly formed. Therefore, by arranging the protruding electrode 4 (see FIG. 7) on the thinly-formed solder member 5a2 (that is, at the position where it overlaps the narrow width portion 11n) and bonding it to the solder member 5a2, the amount of the solder member 5 for connecting the protruding electrode 4 with the terminal 11 as illustrated in FIGS. 7 and 8 can be controlled to an appropriate amount.

Therefore, the reduction of the reliability of the semiconductor device 1 caused by the protruded solder member 5 on the periphery of the bonding region can be prevented or suppressed. In other words, the reliability of the semiconductor device 1 can be improved. Moreover, in the present embodiment, since the solder member 5a can be stably formed by the printing method, the wire (more specifically, the power supply line) for the electrolytic plating is not formed on the wiring substrate 3. Therefore, the layout space for the power supply line and the peripheral space can be eliminated, and therefore, a planar size of the wiring substrate 3 can be downsized. In other words, the mounting area of the semiconductor device 1 can be reduced. Moreover, since the power supply line is not provided, the degree of freedom for designing the wiring layout can be improved.

Further, according to the present embodiment, since the printing method can be adopted as the method of applying the solder member 5a, the wiring substrates can be stably mass-produced even when they need to be mass-produced. In the case of the adoption of the above-described method, a part of the solder member 5a1 of the solder member 5a illustrated in FIG. 9, which is arranged on the wide width portion 11w, is moved toward the protruding electrode 4 side by bonding with the protruding electrode 4. However, as illustrated in FIG. 7, much of it remains on the wide width portion 11w. On the other hand, the thickness of the solder member 5a2 of the solder member 5a illustrated in FIG. 9, which is arranged between the bonding portion with the protruding electrode 4 and the region covered with the solder resist film 16 is not largely changed by bonding with the protruding electrode 4, and it remains thereon as the solder member 5a2 as illustrated in FIG. 7.

Therefore, in the semiconductor device 1 of the present embodiment to which the above-described method is adopted, the thickness of the solder member 5w of the solder member 5 for bonding the protruding electrode 4 and the terminal 11, which is arranged closer to the wide width portion 11w side than the bonding portion with the protruding electrode 4 (the region sandwiched by the tip surface 4s and each terminal 11) is thicker than the thickness of the solder member 5a2 thereof, which is arranged closer to the narrow width portion 11n side (on an opposite side to the wide width portion 11w) than the bonding portion with the protruding electrode 4. However, the thickness of the solder member 5n of the solder member 5, which is arranged in the bonding portion with the protruding electrode 4 (the region sandwiched by the tip surface 4s and the narrow width portion 11w) is thicker than the solder member 5w thereof, which is arranged on the wide width portion 11w, because of the influence of the surface tension in some cases.

As a modified example of the present embodiment, note that, even when the solder member 5a is formed by adopting a different method from the printing method, the melted solder is deformed in accordance with the shape of each terminal 11 as described above by performing a thermal treatment (heating treatment) to the solder member applied onto the terminals 11 so that the solder member is melted. Therefore, even in the case of adopting, for example, the plating method (electrolytic plating method or electroless plating method), when the plated film of the solder member is formed so as to have a thickness of, for example, about 10 μm or larger, it is effective to adopt the configuration of the present embodiment so that the solder member is melted prior to the bonding with the protruding electrode 4 to form the solder member 5a illustrated in FIG. 9.

Moreover, from the viewpoint of stably thinly forming the thickness of the solder member 5a2, it is only required to form the widths of the wide width portion 11w and the narrow width portion 11n formed on each terminal 11 so as to have relatively different widths from each other. Therefore, as a modified example of the terminal 11 illustrated in FIG. 6, it is also allowed that, for example, the width W2 of the wide width portion 11w is wider than the width WB of each protruding electrode 4, and the width W1 of the narrow width portion 11n is almost the same as the width of each protruding electrode 4. However, from the viewpoint of downsizing the planar dimensions of the plurality of terminals 11, it is preferred to form the width W2 of the wide width portion 11w as almost the same as the width WB of each protruding electrode 4, and form the width W1 of the narrow width portion 11n to be narrower than the width of each protruding electrode 4 as illustrated in FIG. 6.

In this case, as illustrated in FIG. 8, a part of the tip surface 4s of each protruding electrode 4 is arranged so as to protrude outside the terminal 11. Therefore, from the viewpoint of suppressing the lowering of the bonding strength due to the bonding of the protruding electrode 4 at the position where it overlaps the narrow width portion 11n, it is preferred to form the solder member 5n so as to cover the upper surface 11c and the two side surfaces 11d of the terminal 11. In this manner, the contact area between the solder member 5n and the terminal 11 can be increased, and therefore, the lowering of the bonding strength can be suppressed.

Method of Manufacturing Semiconductor Device

Figure 10:
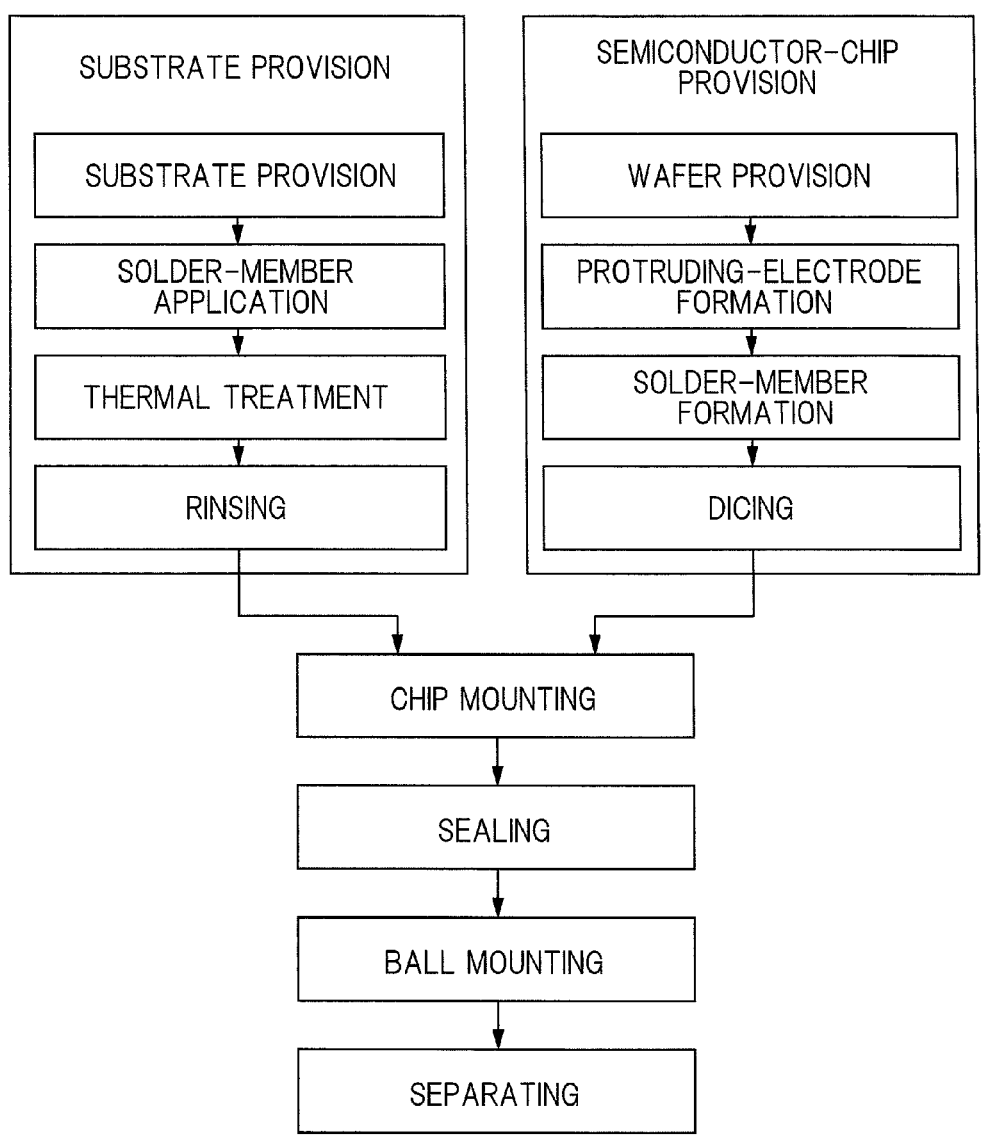
FIG. 10 is an explanatory diagram illustrating outline of manufacturing steps of a semiconductor device.

Next, a method of manufacturing the semiconductor device of the present embodiment will be explained. The semiconductor device 1 of the present embodiment is manufactured so as to follow a flow illustrated in FIG. 10. FIG. 10 is an explanatory diagram illustrating an outline of the manufacturing steps of the semiconductor device of the present embodiment. Each step will be explained in detail below with reference to FIGS. 11 to 31.

Substrate Provision Step

Figure 11:
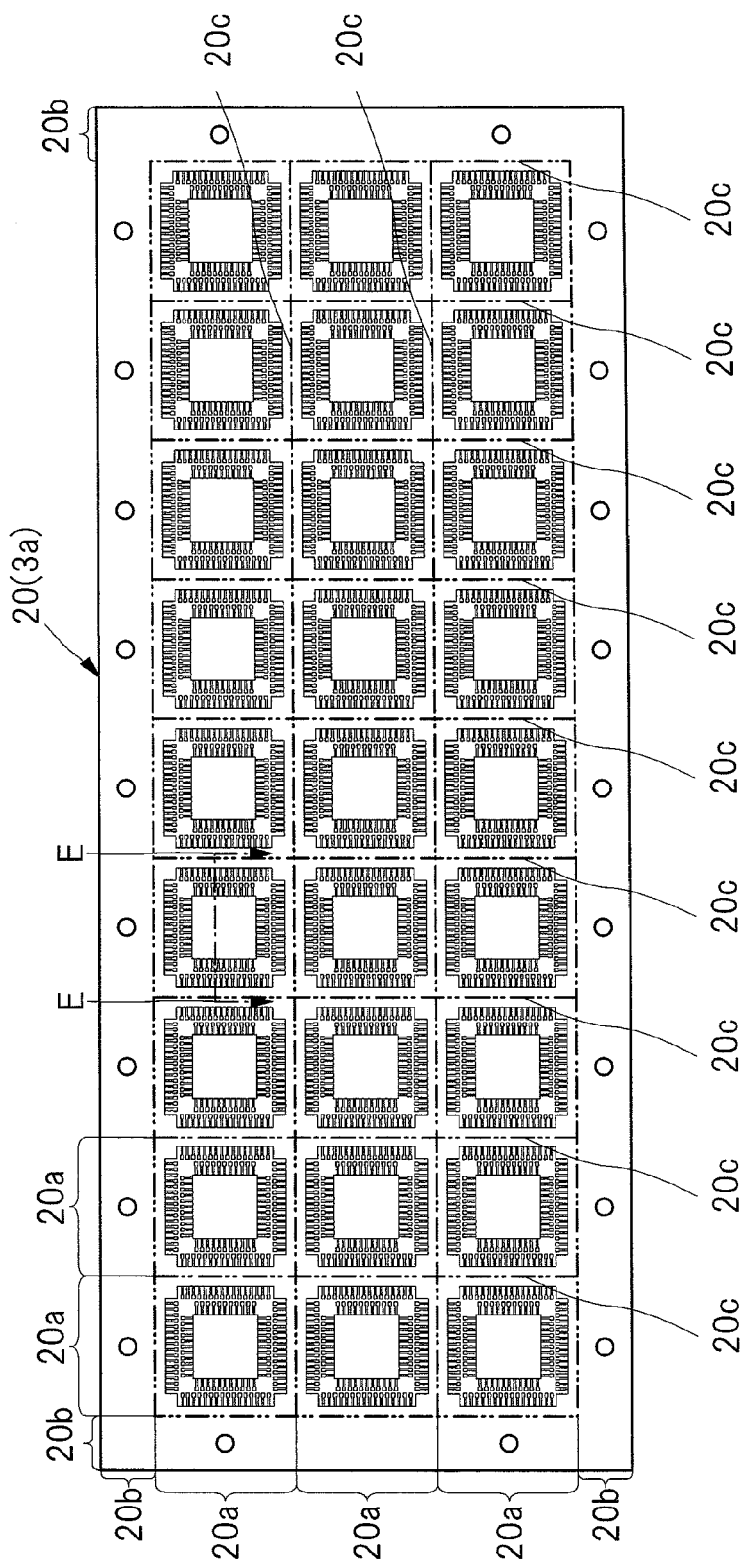
FIG. 11 is a plan view illustrating the entire structure of a wiring substrate provided in a substrate provision step illustrated in FIG. 10.
Figure 12:
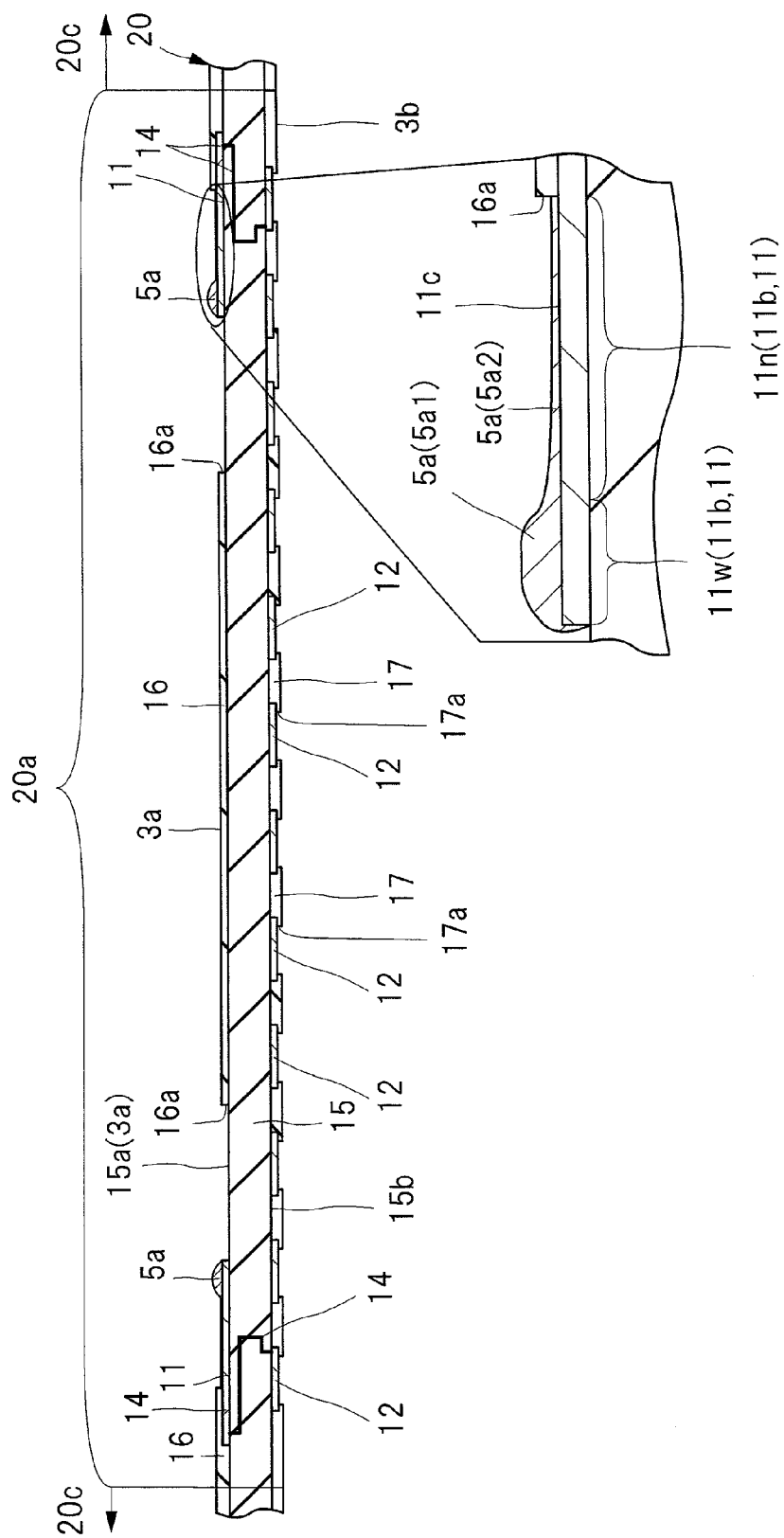
FIG. 12 is an enlarged cross-sectional view taken along an E-E line of FIG. 11.

First, in a substrate provision step illustrated in FIG. 10, a wiring substrate 20 illustrated in FIGS. 11 and 12 is provided. FIG. 11 is a plan view illustrating the entire configuration of the wiring substrate provided in the substrate provision step illustrated in FIG. 10, and FIG. 12 is an enlarged cross-sectional view taken along a line E-E of FIG. 11.

As illustrated in FIG. 11, the wiring substrate 20 provided in the present step is provided with a plurality of product formation regions 20a inside a frame portion (referred to also as a frame body) 20b. More specifically, the plurality of (in FIG. 11, 27) product formation regions 20a are arranged in the row-column pattern. The wiring substrate 20 is a so-called multiple-piece taking substrate having the plurality of product formation regions 20a each corresponding to the wiring substrate 3 illustrated in FIG. 1 and dicing lines (referred to also as dicing regions) 20c formed between the respective product formation regions 20a. In this manner, by using the multiple-piece taking substrate provided with the plurality of product formation regions 20a, the production efficiency can be improved.

Moreover, as illustrated in FIG. 12, in each of the product formation regions 20a, configuration members of the wiring substrate 3 explained with reference to FIGS. 1 to 9 are formed. More specifically, the wiring substrate 20 is provided with an insulating layer 15, which is made of, for example, a resin and which has an upper surface 15a and a lower surface 15b on a side opposite to the upper surface 15a.

Moreover, each of the product formation regions 20a of the wiring substrate 20 is provided with a plurality of terminals 11 arranged on the upper surface 3a side, a plurality of lands 12 arranged on the lower surface 3b side, and a plurality of wires 14 for electrically connecting between the plurality of terminals 11 and lands 12. Further, an upper side of the upper surface 15a and a lower side of the lower surface 15b of the insulating layer 15 are covered with solder resist films 16 and 17, respectively, and a plurality of terminals (bonding leads) 11 are exposed from the solder resist film 16 in openings 16a formed in the solder resist film 16. In the present embodiment, the plurality of terminals 11 are exposed in one opening 16a. Moreover, in a plurality of openings 17a formed in the solder resist film 17, the plurality of lands 12 are respectively exposed from the solder resist film 17.

Moreover, each of conductor patterns (the terminals 11, the lands 12, and the wires 14) provided in the wiring substrate 20 is made of a metal material containing copper (Cu) as a main component. In the present embodiment, as a method of forming these conductor patterns, for example, a subtract method, a semi-additive method, or others is used. According to such a method, as illustrated in FIG. 6 described above, the shape of each terminal 11 can be formed so as to have the wide width portion 11w having the width W2 in the planar view and the narrow width portion 11n being formed integrally with the wide width portion 11w and having the width W1 smaller than the width W2 in the planar view. Therefore, each of the plurality of terminals 11 included in the wiring substrate 20 provided in the present step has a plane shape having the wide width portion 11w and the narrow width portion 11n as illustrated in FIG. 6.

Further, onto the upper surfaces 11c of the plurality of terminals 11, a plurality of solder members 5a are previously applied. These solder members 5a are a raw material of the solder members 5 illustrated in FIG. 2 as described above. Moreover, each solder member 5a is applied so that the amount of the solder member 5a2 of the solder member 5a previously applied (formed) on the surface of each terminal 11, which is formed on the narrow width portion 11n, is smaller than the amount of the solder member 5a1 thereof, which is formed on the wide width portion 11w. In other words, each of the plurality of terminals 11 is provided with a region (narrow width portion 11n) on which the solder member 5a2 is applied thinly (for example, to have a thickness of 7 μm or smaller) adjacent to the wide width portion 11w.

Figure 14:
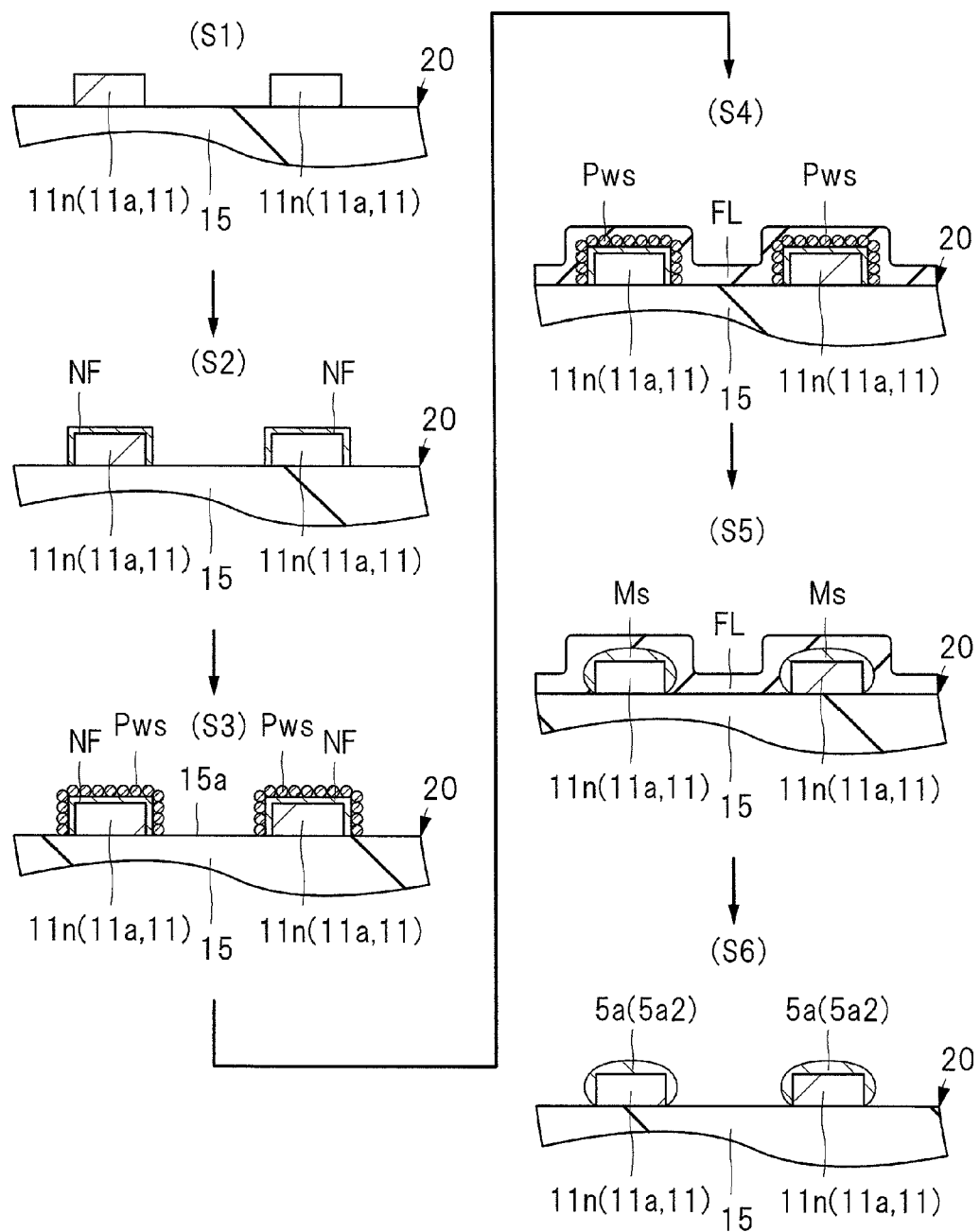
FIG. 14 is an explanatory view schematically illustrating one example of the method of forming the solder member illustrated in FIG. 12 by using another method of the method illustrated in FIG. 13.

The solder member 5a is formed by using, for example, the printing method as described above. Hereinafter, a method of forming the solder member 5a2 by using the printing method will be explained. FIG. 13 is an explanatory view schematically illustrating one example of the method of forming the solder member illustrated in FIG. 12, and FIG. 14 is an explanatory view schematically illustrating one example of the method of forming the solder member illustrated in FIG. 12 by using a different method from the method illustrated in FIG. 13.

In the method of forming the solder member illustrated in FIG. 13, first, in step S1 (a substrate provision step illustrated in FIG. 10), the wiring substrate 20 provided with the plurality of terminals 11 formed thereon is provided. Next, in step S2 (a solder-member application step illustrated in FIG. 10), a solder paste "Pss" is applied (for example, printed) onto the plurality of terminals 11. This solder paste Pss is a solder member containing a solder component and a flux component for activating the solder component, and exerting a paste property at a room temperature. In the present embodiment, the solder paste Pss is not applied independently onto each of the plurality of terminals 11, but is applied so as to cover the plurality of terminals 11 as one batch. By adopting such an applying method, the application step can be simplified.

Next, in step S3 (a thermal treatment step illustrated in FIG. 10), the solder paste Pss is subjected to a thermal treatment (referred to also as a heating treatment or a reflow treatment) so that the solder component contained in the solder paste Pss is melted. Note that a heating temperature at this time depends on a melting point of the solder component. However, when, for example, a tin-silver (Sn—Ag)-based lead-free solder is adopted, it is heated at 240° C. to 280° C. In the present step, a flux (flux component) "FL" contained in the solder paste Pss activates the solder component of the solder paste Pss, so that the wettability of the melted solder Ms for the terminals 11 can be improved.

Moreover, in the present step, the melted solder Ms is influenced by the surface tension, and is deformed so as to form the physically stable shape. Therefore, as the solder member 5a illustrated in FIG. 9 or 12, much of the melted solder Ms (see FIG. 13) is gathered on the wide width portion 11w. As a result, the thickness of the melted solder Ms on the narrow width portion 11n illustrated in FIG. 13 can be stably thinly formed with, for example, 7 μm or smaller. Next, in step S4 (a rinse step illustrated in FIG. 10), the melted solder Ms is solidified by cooling the melted solder Ms so as to form the solder member 5a. Moreover, by rinsing the peripheral portion of each terminal 11, residues of the flux FL remaining on the periphery of the solder members 5a are removed, so that a wiring substrate 20 with the solder members 5a formed thereon as illustrated in FIG. 12 is obtained.

On the other hand, the method of forming the solder member illustrated in FIG. 14 is as follows. First, in the step S1 illustrated in FIG. 14 (substrate provision step illustrated in FIG. 10), a wiring substrate 20 with a plurality of terminals 11 formed thereon is provided. Next, in the step S2 (the substrate provision step illustrated in FIG. 10), the plurality of terminals 11 formed on the wiring substrate 20 are soaked in treatment liquid, and then, is dried, so that an adhesive film "NF" is formed on surfaces (upper surface and side surfaces) of each terminal 11. The adhesive film NF is formed by a chemical reaction between the metal on the surfaces of the terminal 11 and the treatment liquid, and therefore, the adhesive film NF can be formed on the exposed surfaces (upper surface and side surfaces) of the terminal 11.

Next, in the step S3 (the solder-member application step illustrated in FIG. 10), a large number of solder particles (solder powder, solder member) "Pws" are applied (printed) onto the plurality of terminals 11, and are adhered onto the adhesive film NF. Since the adhesive film NF is selectively formed on the surfaces of the terminals 11, the solder particles Pws are not adhered onto the upper surface 15a of the insulating layer 15 even when the solder particles Pws are applied onto the plurality of terminals 11 as one batch. Therefore, the solder particles Pws can be selectively adhered onto the terminals 11. Thus, in the method illustrated in FIG. 14, the amount of the solder component adhered onto the periphery of each terminal 11 can be reduced more than that in the method illustrated in FIG. 13. Moreover, by adjusting an average particle size of the solder particles Pws, the amount of the solder component adhered to the periphery of the terminal 11 can be controlled. That is, by decreasing the average particle size of the solder particles Pws, the amount of the solder component adhered onto the periphery of the terminal 11 can be decreased. On the other hand, by increasing the average particle size of the solder particles Pws, the amount of the solder component adhered onto the periphery of the terminal 11 can be increased.

Next, in step S4 (the solder-member application step illustrated in FIG. 10), a paste containing the flux FL (flux paste) is applied (printed) so as to cover the plurality of terminals 11 and the solder particles Pws. Since the flux FL is applied in order to activate the solder particles (solder component) Pws to improve the wettability for the terminals 11, it is applied so as to, for example, cover the plurality of terminals 11 as one batch from the viewpoint of simplifying the application step. Next, in step S5 (a thermal treatment step illustrated in FIG. 10), the solder particles Pws are subjected to a thermal treatment (a heating treatment, or a reflow treatment) so that the solder component is melted.

Note that a heating temperature at this time depends on the melting point of the solder component. However, when a tin-silver (Sn—Ag)-based lead-free solder is adopted, it is heated at 240° C. to 280° C. In the present step, the flux FL applied onto the solder particles Pws activates the solder component, so that the wettability of the melted solder Ms for the terminals 11 can be improved. Moreover, in the present step, as described above, the melted solder Ms is influenced by the surface tension, and is deformed so as to form the physically stable shape. Therefore, as the solder member 5a illustrated in FIG. 9 or 12, much of the melted solder Ms (see FIG. 13) is gathered onto the wide width portion 11w. Next, in step S6 (a rinsing step illustrated in FIG. 10), the melted solder Ms is solidified by cooling the melted solder Ms so as to form the solder members 5a. Moreover, by rinsing the peripheral portion of each terminal 11 and removing the residues of the flux FL remaining on the periphery of the solder members 5a, a wiring substrate 20 with the solder members 5a formed thereon as illustrated in FIG. 12 is obtained.

Note that the above-described methods of forming the solder members 5a are explained by exemplifying two methods that are considered to be particularly preferable among methods studied by the inventors of the present application. Therefore, it is needless to say that various modifications can be made within the scope of the invention.

Semiconductor-Chip Provision Step

Figure 15:
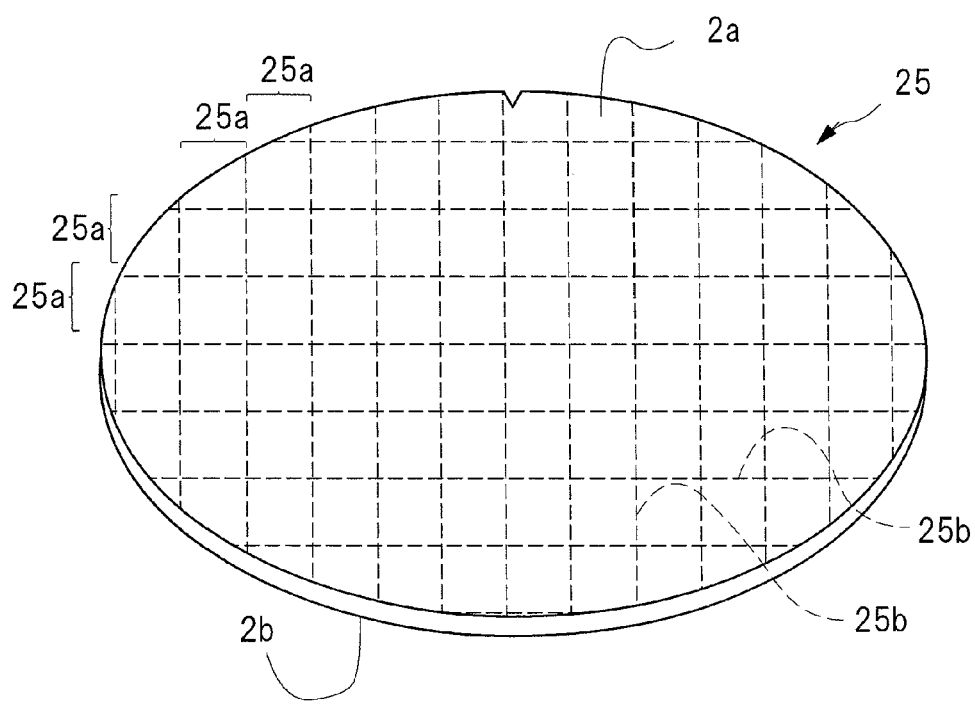
FIG. 15 is a perspective view illustrating a semiconductor wafer provided in a wafer provision step illustrated in FIG. 10.
Figure 16:
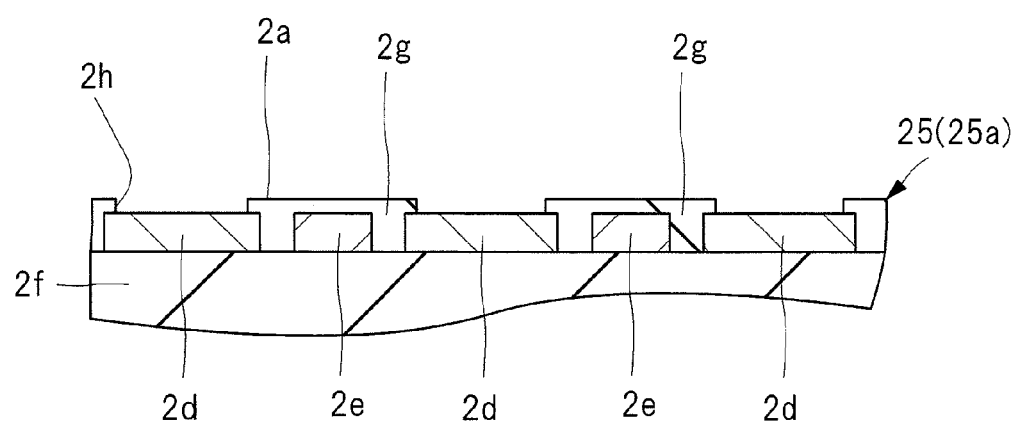
FIG. 16 is an enlarged cross-sectional view illustrating a periphery of a pad formed in one chip region of the semiconductor wafer illustrated in FIG. 15.
Figure 18:
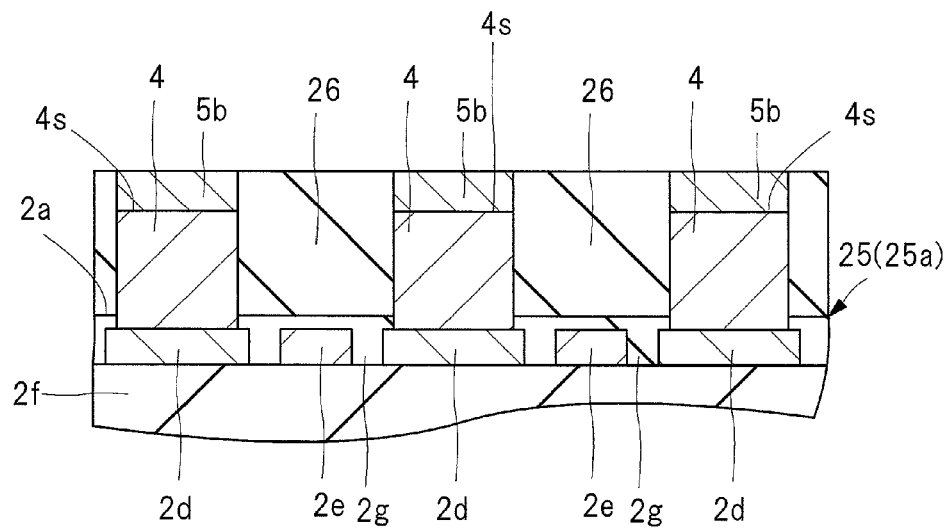
FIG. 18 is an enlarged cross-sectional view illustrating a state in which the solder member is attached onto a tip surface of the protruding electrode illustrated in FIG. 17.
Figure 19:
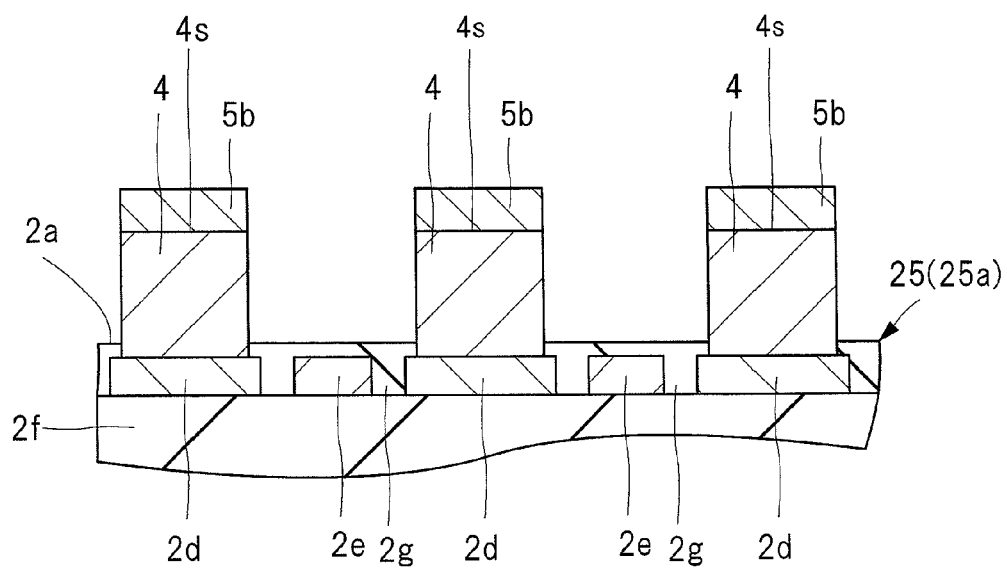
FIG. 19 is an enlarged cross-sectional view illustrating a state from which a mask illustrated in FIG. 18 is removed.
Figure 20:
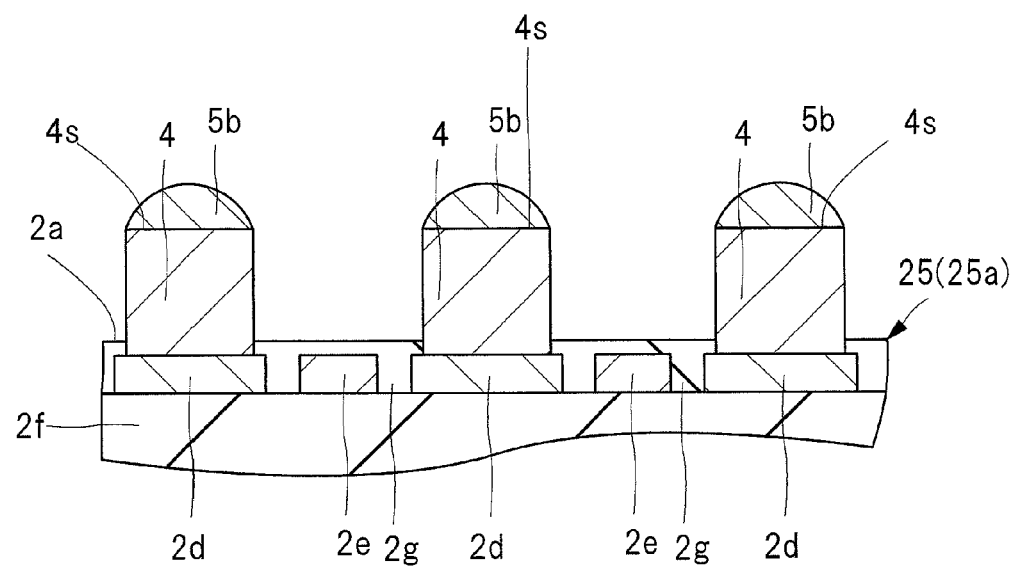
FIG. 20 is an enlarged cross-sectional view illustrating a state in which the solder member illustrated in FIG. 19 is heated to be deformed into a dome shape.

In a semiconductor-chip provision step illustrated in FIG. 10, the above-described semiconductor chip 2 illustrated in FIG. 3 is provided. FIG. 15 is a perspective view illustrating a semiconductor wafer provided in a wafer provision step illustrated in FIG. 10, and FIG. 16 is an enlarged cross-sectional view illustrating the periphery of the pads formed in one chip region of the semiconductor wafer illustrated in FIG. 15. Moreover, FIG. 17 is an enlarged cross-sectional view illustrating a state in which the protruding electrodes are formed on the plurality of pads illustrated in FIG. 16, FIG. 18 is an enlarged cross-sectional view illustrating a state in which the solder member is attached to the tip surfaces of the protruding electrodes illustrated in FIG. 17, FIG. 19 is an enlarged cross-sectional view illustrating a state in which a mask illustrated in FIG. 18 is removed, and FIG. 20 is an enlarged cross-sectional view illustrating a state in which the solder member illustrated in FIG. 19 is heated to be deformed into the dome shape.

The semiconductor chip illustrated in FIG. 3 is manufactured as, for example, follows. First, in the wafer provision step illustrated in FIG. 10, a wafer (semiconductor wafer) 25 illustrated in FIG. 15 is provided. The wafer 25 provided in the present step has the front surface 2a and the rear surface 2b positioned on the side opposite to the front surface 2a, each of which has a substantially round plane shape as illustrated in FIG. 15. Moreover, the wafer 25 has a plurality of chip regions (device regions) 25a, and each of the chip regions 25a corresponds to the semiconductor chip 2 illustrated in FIG. 3. Further, a scribe line (scribe region) 25b is formed between the adjacent chip regions 25a. The scribe lines 25b are formed into a lattice shape so as to partition the front surface 2a of the wafer 25 into the plurality of chip regions 25a. Moreover, on the scribe line 25b, a plurality of conductor patterns such as a TEG (Test Element Group) and an alignment mark are formed for checking whether or not the semiconductor element or others formed inside the chip region 25a is correctly formed.

In the wafer 25 provided in the present step, a plurality of semiconductor elements (whose illustration is omitted) such as transistors are formed on the main surface (element formation surface) of the semiconductor substrate made of, for example, silicon (Si). Moreover, on the main surface of the semiconductor substrate, as illustrated in FIG. 16, wiring layers (whose illustrations are omitted) each provided with a plurality of wires 2e and an insulating film 2f for insulating between the adjacent wires 2e are stacked, and a plurality of pads (referred to also as electrode pads, bonding pads, or chip electrodes) 2d electrically connected to the plurality of wires 2e are formed in the uppermost layer of the layers. The plurality of pads 2d are electrically connected to the plurality of semiconductor elements via the plurality of wires 2e of the wiring layer. That is, in the wafer 25 provided in the present step, an integrated circuit is previously formed on the main surface of the semiconductor substrate. Moreover, while the front surface 2a of the semiconductor chip 2 is covered with an insulating film 2g made of, for example, silicon oxide ($SiO_2$) or others, openings 2h are formed on the plurality of pads 2d in the insulating film 2g covering the front surface 2a. And, the pads 2d are exposed from the insulating film in the openings 2h.

Figure 17:
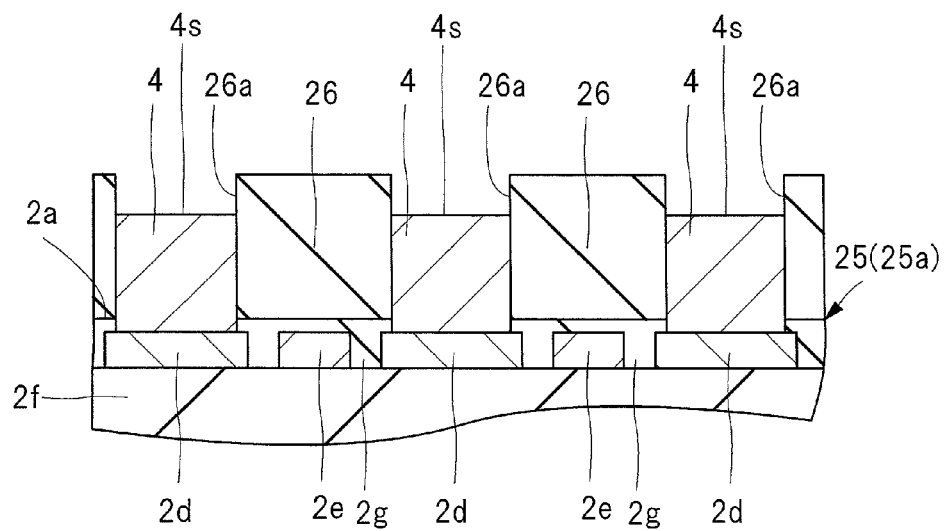
FIG. 17 is an enlarged cross-sectional view illustrating a state in which protruding electrodes are formed on a plurality of pads illustrated in FIG. 16.

Next, in the protruding-electrode formation step illustrated in FIG. 10, the metal film is deposited on each of the plurality of pads 2d as illustrated in FIG. 17 to form the protruding electrodes 4. In the present embodiment, as illustrated in FIG. 17, a mask 26 is arranged (more specifically, fixed) onto the front surface 2a of the wafer 25. And, through holes 26a are formed at positions where the protruding electrodes 4 are formed. The through holes 26a can be formed by using, for example, a photolithography technique and an etching technique.

Subsequently, by depositing the metal film inside the through holes 26a, the protruding electrodes 4 are formed. In the present embodiment, a copper film is deposited. A method of depositing the metal film is not particularly limited, and the deposition step may be performed by using, for example, a plating method. Moreover, when a metal film different from the copper film is formed on an interface between the copper film and the pads 2d or on the tip surfaces 4s of the protruding electrodes 4, the film can be easily formed by sequentially depositing a different metal material.

In this manner, when the protruding electrodes 4 are formed by depositing the metal film, stress applied onto the pads 2d caused in bonding the protruding electrodes 4 and the pads 2d can be reduced. More particularly, the stress can be significantly reduced as compared with a method of press-bonding (including thermally press-bonding) the protruding electrodes onto the pads. Therefore, the reduction of the reliability due to damage of the chip regions 25a in forming the protruding electrodes can be suppressed.

Moreover, by depositing the metal film while the plurality of through holes 26a are formed in the mask 26, the plurality of (large number of) protruding electrodes 4 can be formed as one batch. Therefore, the protruding electrodes 4 can be efficiently formed. Moreover, since the protruding electrodes 4 are formed prior to partitioning the wafer 25, the protruding electrodes 4 can be formed on the plurality of chip regions 25a as one batch. Therefore, the protruding electrodes 4 can be formed efficiently. In this manner, the protruding electrodes 4 which are formed by depositing the metal film inside the through holes 26a of the mask 26 become column-shaped electrodes each having a three-dimensional column shape. Further, the planar shape of the protruding electrode 4 is formed in accordance with the opening shape of the through hole 26a. For example, in the present embodiment, by forming the through hole 26a having a round opening shape, the protruding electrode 4 having the column shape can be obtained.

Next, in a solder-member formation step illustrated in FIG. 10, by depositing the solder film on each of the tip surfaces 4s of the protruding electrodes 4 as illustrated in FIG. 18, the solder members 5b are formed thereon. In the above-described protruding-electrode formation step in the present embodiment, the metal film is deposited in the middle of each through hole 26a (see FIG. 17), and then, a solder film is successively deposited thereon (without removing the mask 26). Thus, by, for example, depositing the copper film, and then, successively depositing the solder film, the formation of the oxide film on the copper film prior to forming the solder film can be prevented. Therefore, the bonding strength of the bonding interfaces between the solder members 5b and the protruding electrodes 4 can be improved.

Moreover, by covering the tip surfaces 4s of the protruding electrodes 4 with the solder members 5b in the present step, exposure of the tip surfaces 4s to the atmosphere can be prevented, and therefore, a state in which the oxide film is difficult to be formed on the tip surfaces 4s can be maintained. Therefore, the bonding strength of the bonding interfaces between the solder members 5b and the protruding electrodes 4 can be improved. As a result, as illustrated in FIG. 8, the bonding strength of the bonding interfaces between the solder members 5 and the tip surfaces 4s can be improved.

In order to more securely suppress the oxidation of the protruding electrodes 4, note that a nickel (Ni) film may be formed on the tip surfaces 4s of the protruding electrodes 4. However, when the nickel film is formed, the number of plating steps (step time) increases, and therefore, it is preferred to directly form the solder members 5b onto the tip surfaces 4s of the protruding electrodes 4 as in the present embodiment.

Next, by removing the mask 26 (see FIG. 18), and then, performing the rinsing, the side surfaces of the protruding electrodes 4 are exposed as illustrated in FIG. 19. In this state, each solder member 5b has the column shape as similar to each protruding electrode 4. However, by performing the thermal treatment (heating treatment) so as to melt at least a part of each solder member 5b, the shape of the solder member 5b is deformed by the influence of the surface tension of the melted solder so as to form the dome shape as illustrated in FIG. 20. In this manner, by performing the thermal treatment, the tip surfaces 4s of the protruding electrodes 4 and the solder members 5b are firmly bonded to each other. Moreover, the solder members 5b are more stable in the dome shape as illustrated in FIG. 20, and therefore, are suppressed from dropping off from the protruding electrodes and being damaged.

By using each of the steps as described above, a wafer 25 is obtained so that the plurality of protruding electrodes 4 are formed (bonded) onto the front surfaces (upper surfaces) of the plurality of pads 2d, and besides, the plurality of solder members 5b are formed on the tip surfaces 4s of the plurality of protruding electrodes 4.

Next, a tape (whose illustration is omitted) for the back grind is pasted onto the front surface of the wafer 25 on which the plurality of protruding electrodes 4 are formed, and the rear surface of the wafer 25 is polished (ground), so that a wafer 25 having a desired thickness is obtained. Note that, when the thickness of the provided wafer 25 is already thin in the wafer provision stage, or when it is not required to be thin, this grinding step can be eliminated.

Next, in a dicing step illustrated in FIG. 10, the wafer 25 illustrated in FIG. 20 is divided (diced) for each of the chip regions 25a so that a plurality of pieces of the semiconductor chips 2 illustrated in FIG. 3 are obtained. In the present step, the wafer 25 is cut and divided along the scribe lines 25b illustrated in FIG. 15. As a cutting method, although not particularly limited, a cutting method using a dicing blade (rotary blade) or a cutting method using a laser irradiation can be adopted.

Chip Mounting Step

Figure 21:
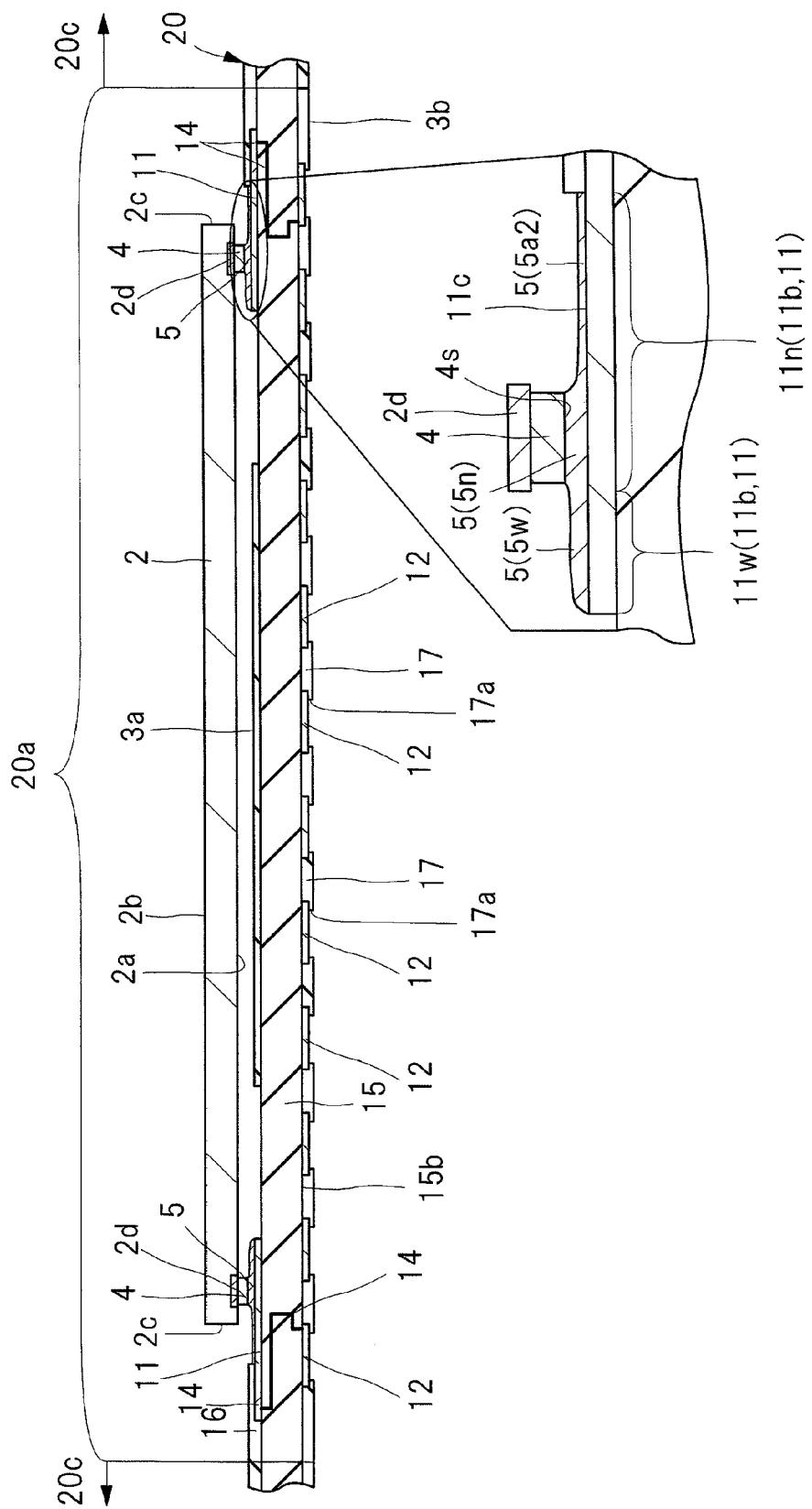
FIG. 21 is an enlarged cross-sectional view illustrating a state in which a semiconductor chip is mounted on the wiring substrate illustrated in FIG. 12.
Figure 22:
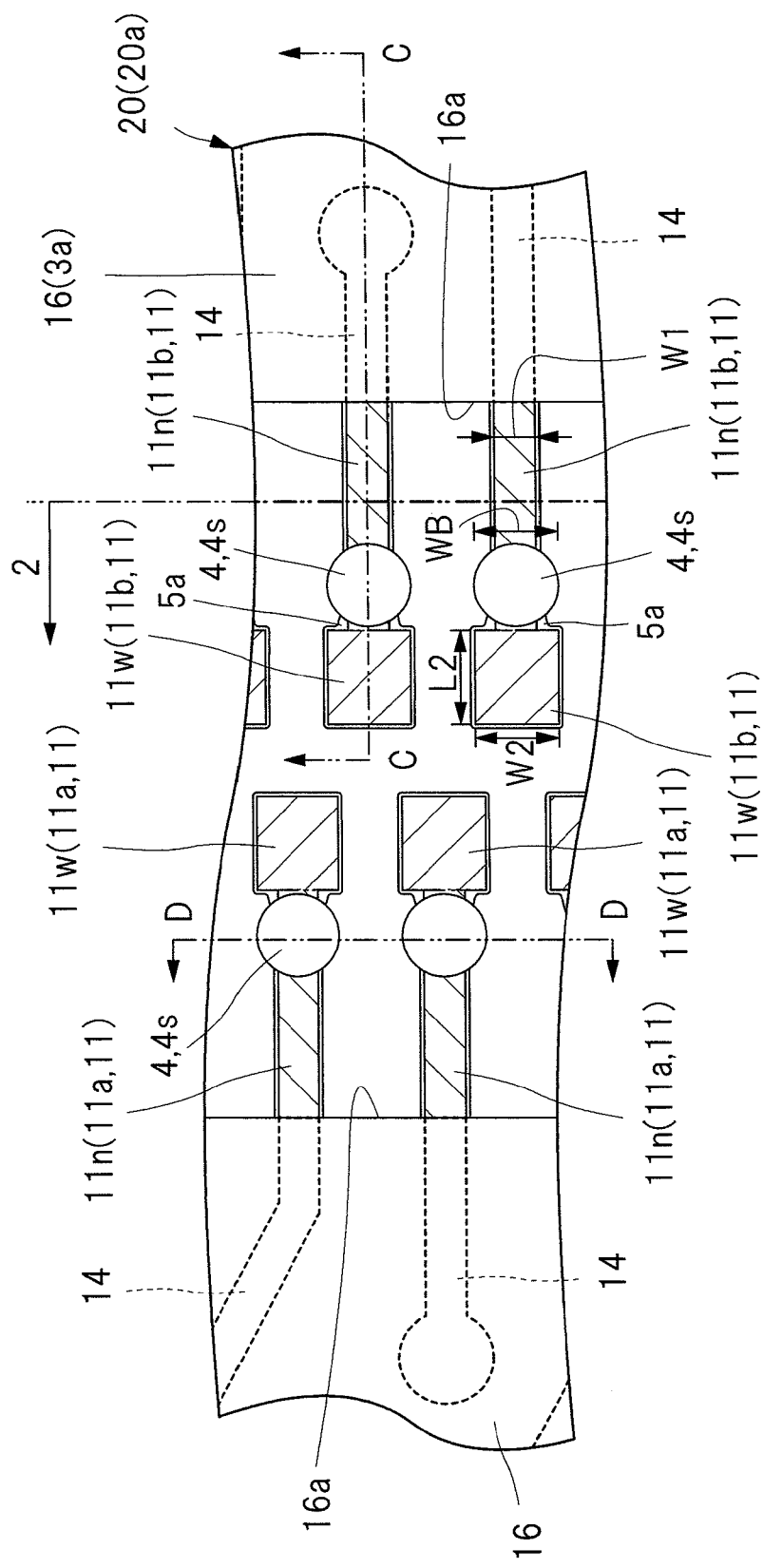
FIG. 22 is an enlarged plan view illustrating a planar positional relation between a protruding electrode and a terminal when a semiconductor chip is arranged on the wiring substrate.
Figure 23:
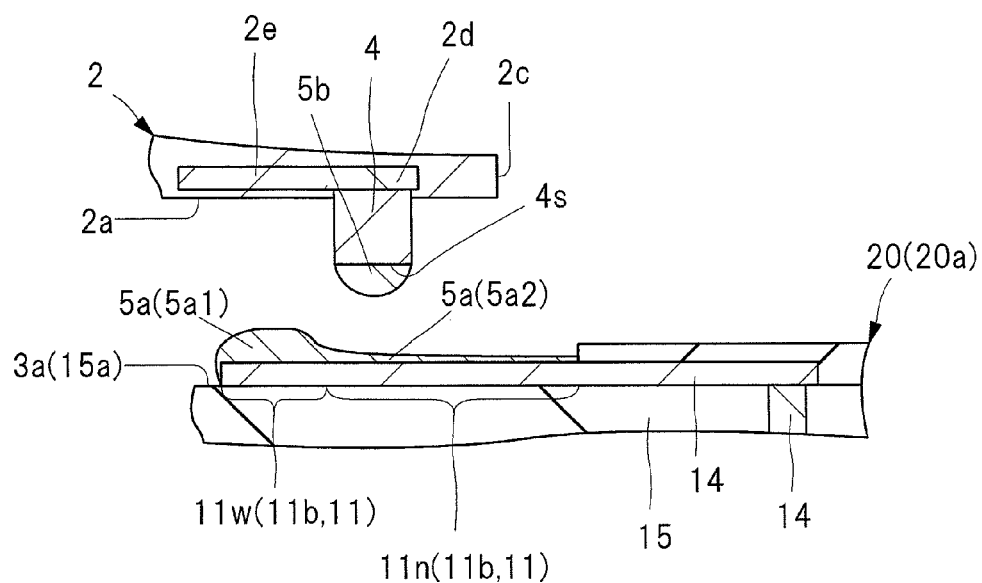
FIG. 23 is an enlarged cross-sectional view taken along a line C-C of FIG. 22.
Figure 24:
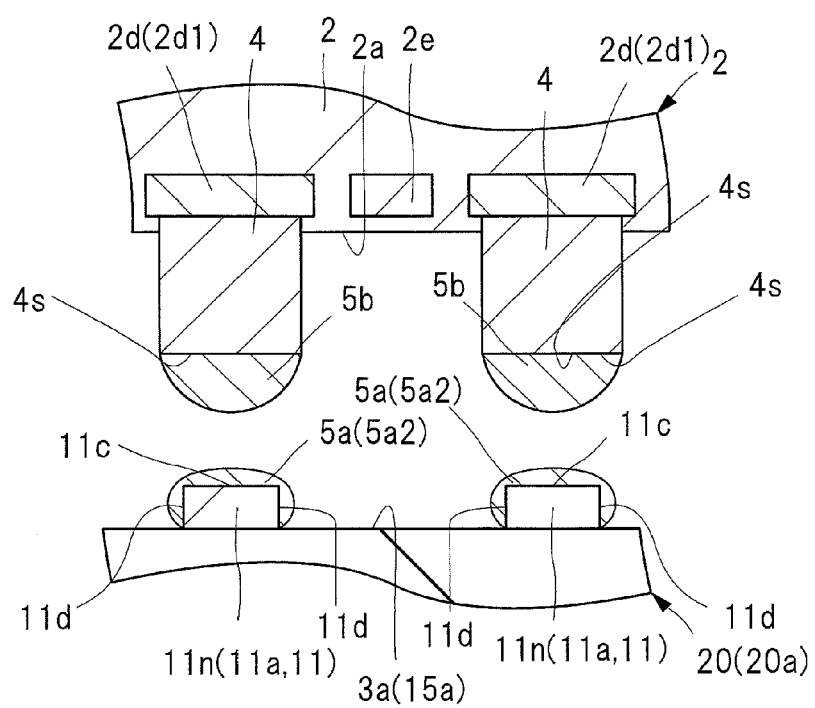
FIG. 24 is an enlarged cross-sectional view taken along a line D-D of FIG. 22.
Figure 25:
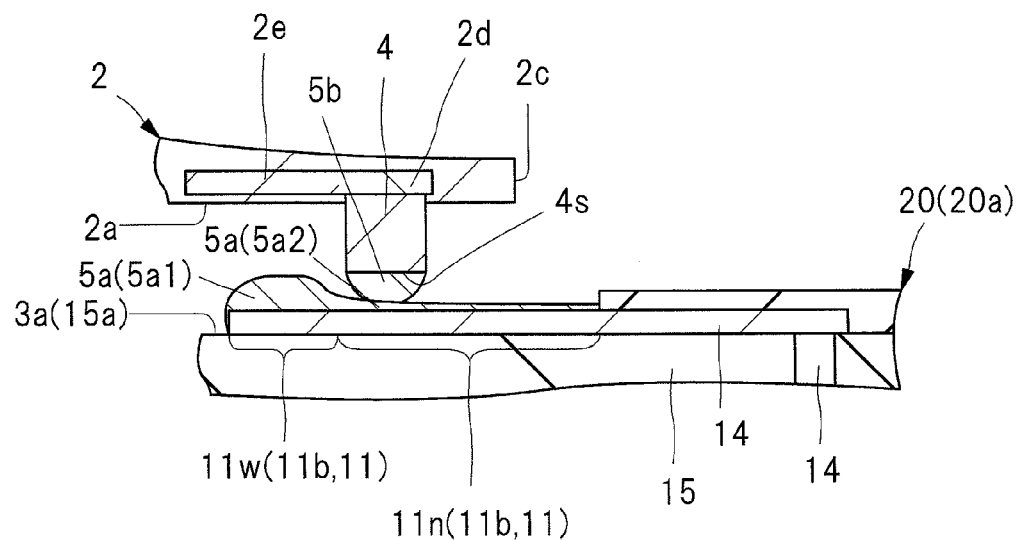
FIG. 25 is an enlarged cross-sectional view illustrating a state in which facing-arranged solder members as illustrated in FIG. 23 are in contact with each other.
Figure 26:
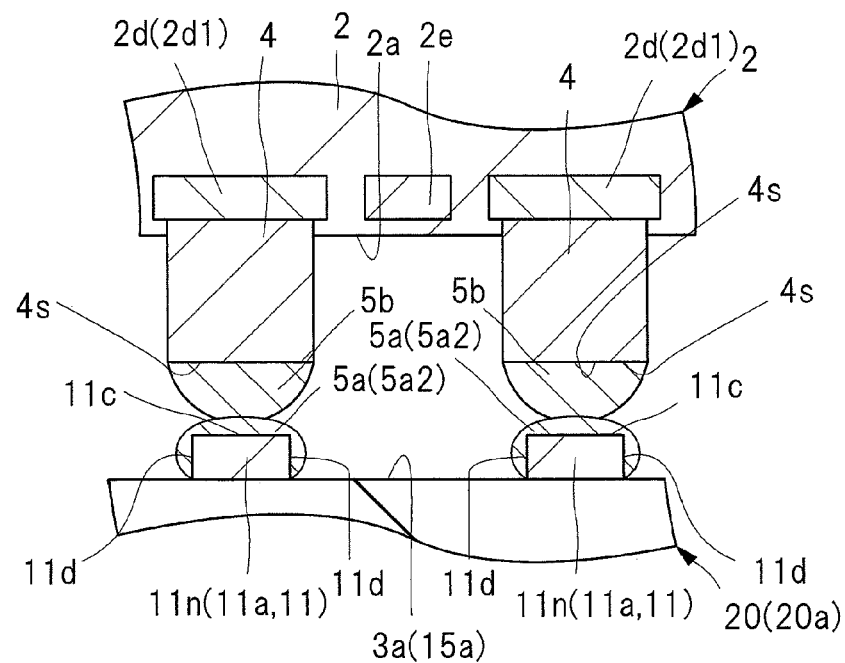
FIG. 26 is an enlarged cross-sectional view illustrating a state in which facing-arranged solder members as illustrated in FIG. 24 are in contact with each other.
Figure 27:
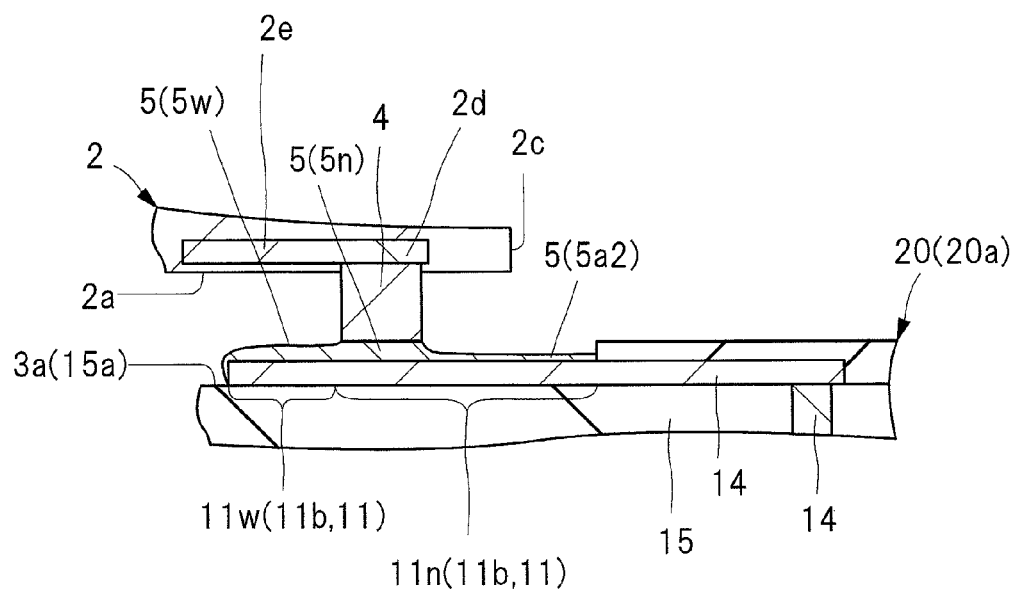
FIG. 27 is an enlarged cross-sectional view illustrating a state in which the contacted solder members as illustrated in FIG. 25 are integrated with each other.
Figure 28:
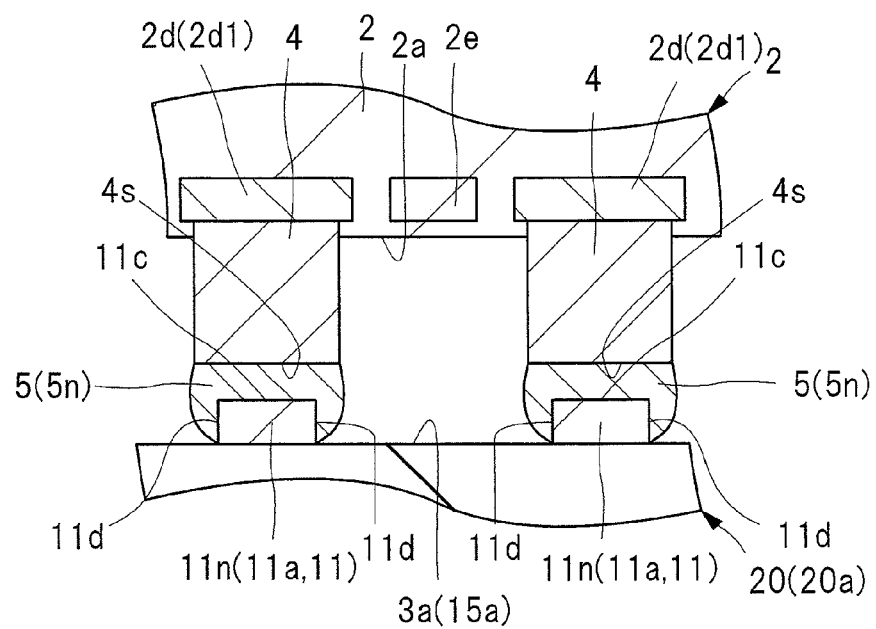
FIG. 28 is an enlarged cross-sectional view illustrating a state in which the contacted solder members as illustrated in FIG. 26 are integrated with each other.

In a chip mounting step illustrated in FIG. 10, the semiconductor chip 2 is arranged on the wring substrate 20 so that the front surface 2a faces to the upper surface 3a of the wiring substrate 20, as illustrated in FIG. 21, and the plurality of terminals 11 and the plurality of pads 2d are electrically connected to each other. FIG. 21 is an enlarged cross-sectional view illustrating a state in which the semiconductor chip is mounted on the wiring substrate illustrated in FIG. 12. Moreover, FIG. 22 is an enlarged plan view illustrating a planar positional relation between the protruding electrodes and the terminals obtained when the semiconductor chip is arranged on the wiring substrate. Further, FIG. 23 is an enlarged cross-sectional view taken along a line C-C of FIG. 22, and FIG. 24 is an enlarged cross-sectional view taken along a line D-D of FIG. 22. Still further, FIG. 25 is an enlarged cross-sectional view illustrating a state in which facing-arranged solder members as illustrated in FIG. 23 are in contact to each other, and FIG. 26 is an enlarged cross-sectional view illustrating a state in which facing-arranged solder members as illustrated in FIG. 24 are in contact to each other. Moreover, FIG. 27 is an enlarged cross-sectional view illustrating a state in which the contacted solder members illustrated in FIG. 25 are integrally formed with each other, and FIG. 28 is an enlarged cross-sectional view illustrating a state in which the contacted solder members illustrated in FIG. 26 are integrally formed with each other.

In the present step, first, as illustrated in FIGS. 22 to 24, the semiconductor chips 2 are arranged on the wiring substrate 20 so that the front surfaces 2a face to the upper surface 3a of the wiring substrate 20 (in a semiconductor-chip arrangement step). At this time, as illustrated in FIGS. 23 and 24, each of the tip surfaces 4s of the plurality of protruding electrodes 4 is arranged on each of the narrow width portions 11n (positions where they overlap the narrow width portions 11n) of the terminals 11. In other words, the solder member 5b attached to each tip surface 4s of the protruding electrodes 4 is arranged so as to face to each of the narrow width portions 11n of the terminals 11. This arrangement is for bonding the protruding electrode 4 to the region where the solder member 5a is thinly formed, that is, to the bonding region on the narrow width portion 11n.

Moreover, as illustrated in FIG. 23, in the present embodiment, the tip surface 4s of each protruding electrode 4 is arranged so as not to overlap the wide width portion 11w of each terminal 11. However, as illustrated in FIG. 23, the solder member 5a1 arranged on the wide width portion 11w has the dome shape whose top portion is located in the center of the wide width portion 11w. Therefore, the thickness of the solder member 5a1 in a peripheral edge portion of the wide width portion 11w (that is, in a foot portion of the solder member 5a1) is thinner that in the center thereof. Therefore, even when a part of the peripheral edge portion of the tip surface 4s of the protruding electrode 4 overlaps the wide width portion 11w, the amount of the protruding portion of the solder member 5 (see FIG. 21) from the terminal 11 can be reduced further than that in the case in which the center portion of the tip surface 4s is arranged on the wide width portion 11w.

However, from a viewpoint of securely reducing the amount of the protruding portion of the solder member 5 from the terminal 11 for securely suppressing the short-circuiting failure, it is preferred to arrange the entire tip surface 4s of the protruding electrode 4 so as not to overlap the wide width portion 11w of the terminal 11 as illustrated in FIG. 23. Moreover, from a viewpoint of shortening a period of time taken when the temperatures of the solder members 5a and 5b reach their melting points or higher in a thermal step (thermal treatment process, local reflow treatment) described later, it is preferred to previously heat the solder members 5a and 5b in the state as illustrated in FIGS. 23 and 24 (to perform a previous thermal step).

However, at this stage, it is not required to melt the solder members 5a and 5b but only required to previously heat them. As a method of heating the solder members 5a, the wiring substrate 20 is fixed to a heat stage (a substrate holding base provided with a heating unit such as a heater; whose illustration is omitted), and a temperature of the heat stage is set to, for example, about 100° C. Thus, the solder members 5a can be heated via the conductor patterns (the terminals 11, etc.) formed on the wiring substrate 20. Moreover, by heating the semiconductor chips 2 by the heating unit such as the heater (whose illustration is omitted), the solder member 5b attached to the semiconductor chip 2 can be heated. The semiconductor chip 2 can be heated at a temperature higher than that of the wiring substrate 20, and therefore, is previously heated at a temperature higher than that of the wiring substrate 20, for example, at about 200° C.

Next, as illustrated in FIGS. 25 and 26, a distance between the semiconductor chips 2 and the wiring substrate 3 is made shorter so that the solder members 5a and 5b are in contact with each other (in a solder-member contact step). At this time, as illustrated in FIG. 25, the solder member 5b is made in contact with the solder member 5a2 of the solder member 5a, which is arranged on the narrow width portion 11n of each terminal 11. Moreover, as illustrated in FIG. 26, in order to make the plurality of solder members 5b and the plurality of solder members 5a in contact with each other, it is preferred to heat at least either one of the solder members 5a and the solder members 5b so as to be hardened as hard as being deformed after the contact. This is because, even when the thicknesses of the protruding electrodes 4 and the solder members 5a and 5b are varied, all the solder members 5a and 5b can be in contact with each other by contacting the solder members 5a and 5b so that either one thereof is dug into the other.

Moreover, in this state, the solder members 5a and 5b are further heated up to their melting points or higher (in the heating step (referred to also as a thermal treatment step or a local reflow step)). Although the heating temperature is varied depending on the melting points of the solder members 5a and 5b, they are heated at a temperature of 240° C. to 280° C. when the tin-silver (Sn—Ag)-based lead-free solder is adopted. In the present step, they are heated while the solder members 5a and 5b are in contact with each other, and therefore, the solder member 5a can be heated by, for example, heat transfer from the solder member 5b. Then, when each of the solder members 5a and 5b is melted, the solder members 5a and 5b are formed integrally with each other. That is, the solder members 5a and 5b are in a so-called "wet state". And, by cooling the melted solder after they are formed integrally with each other, the solder member 5 (more specifically, the solder member 5n) illustrated in FIGS. 27 and 28 is formed.

In this manner, by bringing the solder members 5a and 5b into the wet state, they can be firmly bonded to each other. Moreover, when the solder members 5a and 5b are formed integrally with each other, they are deformed so as to have the physically stable shape by the surface tension of the integrated melted solder. Therefore, as illustrated in FIG. 27, a part of the solder members arranged on the wide width portions 11w of the terminals 11 are moved toward the protruding electrodes 4. However, as described above, the melted solder tends to be gathered toward the wide width portion 11w having a wider plane area due to the influence of the surface tension, and therefore, much of the melted solder remains on the wide width portion 11w. That is, the amount of the melted solder moved toward the tip surfaces 4s (see FIG. 28) of the protruding electrodes 4 is limited.

Therefore, the shape of the solder member 5 formed in the present step tends to have a shape exemplified in FIGS. 27 and 28. That is, the thickness of the solder member 5n of the solder member 5, which is arranged on the bonding portion with the protruding electrode 4 (the region sandwiched by the tip surface 4s and the terminal 11), is substantially equal to (the solder member 5n is slightly thicker than) the thickness of the solder member 5w thereof, which is arranged on the wide width portion 11w. On the other hand, the thickness of the solder member 5a2 of the solder member 5, which is arranged adjacent to the bonding portion with the protruding electrode 4 and arranged on a side opposite to the solder member 5w, is hardly changed, and is thinner than those of the solder members 5w and 5n.

Moreover, in a cross-sectional surface of the bonding portion with the protruding electrode 4 in a width direction (a direction orthogonal to a direction of extending the terminal 11), the amount of the solder member 5n is smaller as illustrated in FIG. 28, and therefore, the amount of the protrusion of the solder member 5n in the width direction can be suppressed. As a result, the short-circuit (short) between the adjacent solder members 5n can be suppressed. That is, the reduction of the reliability of the semiconductor device can be suppressed. In other words, by suppressing the amount of the protrusion of the solder member 5n, the distance between the adjacent terminals 11 (the distance between the protruding electrodes 4, and the distance between the pads 2d) can be made shorter, and therefore, the degree of integration can be improved.

Sealing Step

Figure 29:
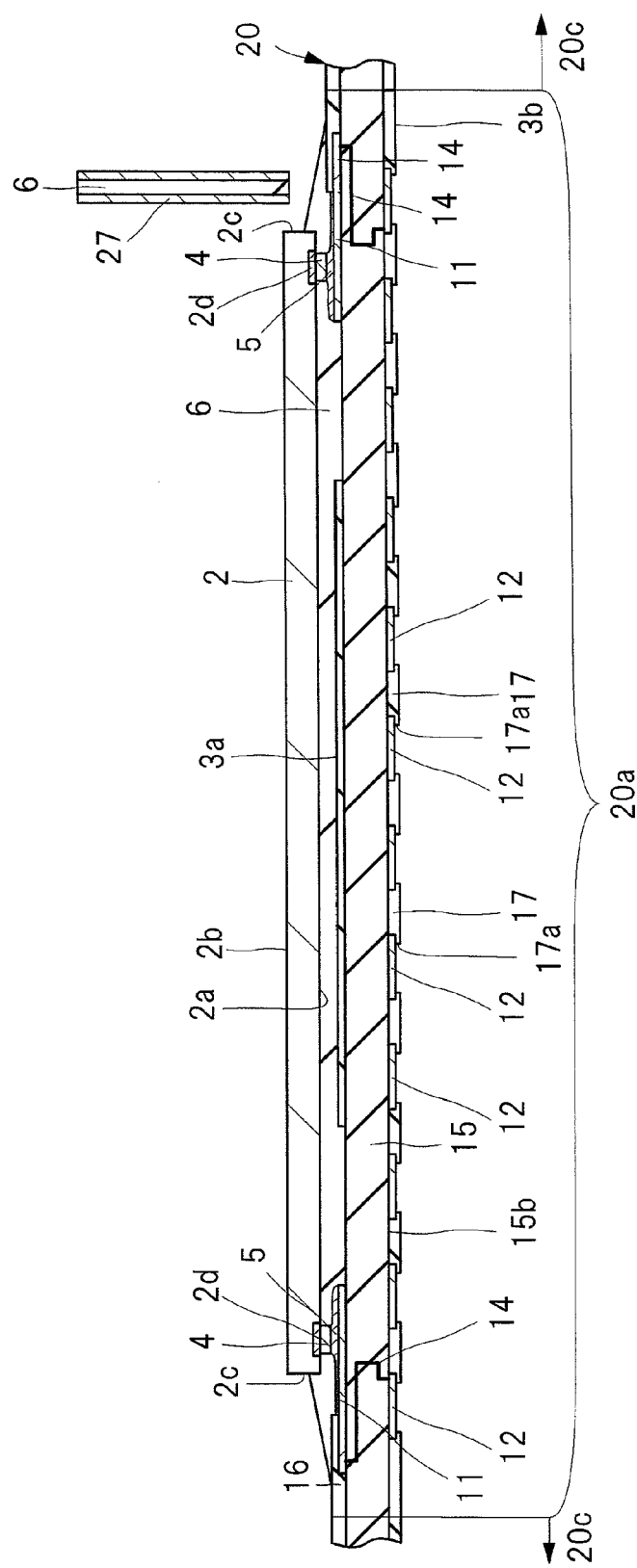
FIG. 29 is an enlarged cross-sectional view illustrating a state in which an under fill resin is supplied between the semiconductor chip and the wiring substrate illustrated in FIG. 21.

Next, in a sealing step illustrated in FIG. 10, an under fill resin 6 is supplied between the front surface 2a of the semiconductor chip 2 and the upper surface 3a of the wiring substrate 20 as illustrated in FIG. 29 so as to seal the bonding portion between the pad 2d and the terminal 11. FIG. 29 is an enlarged cross-sectional view illustrating a state in which the under fill resin is supplied between the semiconductor chip and the wiring substrate as illustrated in FIG. 21. In the present step, for example, a nozzle 27 for supplying the resin is arranged outside the side surface 2c of the semiconductor chip 2, and the under fill resin 6 that is, for example, a thermosetting resin is supplied between the front surface 2a of the semiconductor chip 2 and the upper surface 3a of the wiring substrate 20. In this manner, the respective bonding portions among the pads 2d, the protruding electrodes 4, the solder members 5, and the terminals 11, can be sealed as one batch. By sealing the bonding portions between the pads 2d and the terminals 11 with the under fill resin 6 as described above, the stress applied to the bonding portions can be dispersed via the under fill resin 6, and therefore, this manner is preferable from a viewpoint of improving the connection reliability between the pads 2d and the terminals 11. However, the application of the technique explained in the present embodiment is not limited to the semiconductor device using the under fill resin 6, and the technique can be also applied to a semiconductor device without arranging the under fill resin 6 illustrated in FIG. 29 as a modified example to the present embodiment. In this case, the sealing step illustrated in FIG. 10 can be eliminated. Moreover, even when the under fill resin 6 is used, as different from the present embodiment in which the under fill resin 6 is supplied between the semiconductor chip 2 and the wiring substrate 20 subsequent to the arrangement of the semiconductor chip 2 on the wiring substrate 20, the semiconductor chip 2 may be arranged on the wiring substrate 20 subsequent to the previous arrangement of the under fill resin 6 on the chip mounting region of the wiring substrate 20.

Ball Mounting Step

Figure 30:
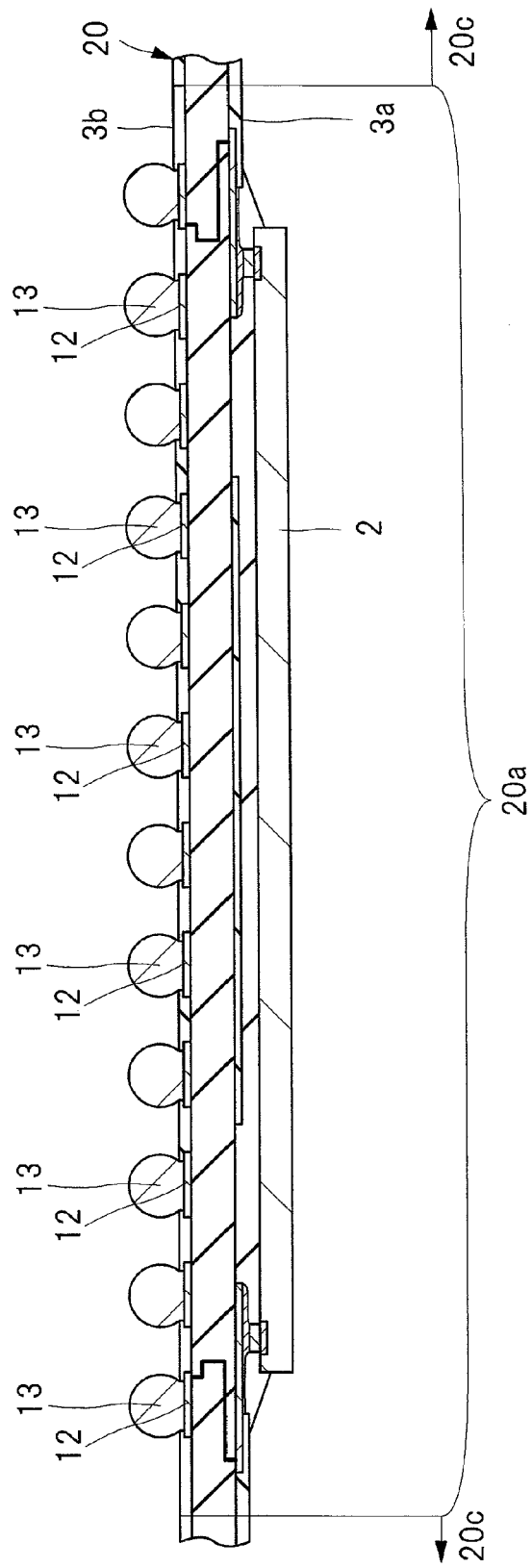
FIG. 30 is an enlarged cross-sectional view illustrating a state in which a solder ball is bonded onto a plurality of lands after the wiring substrate illustrated in FIG. 29 is turned upside down.

Next, in a ball mounting step illustrated in FIG. 10, the plurality of solder balls 13 are bonded onto the plurality of lands 12 formed on the lower surface 3b of the wiring substrate 20 as illustrated in FIG. 30. FIG. 30 is an enlarged cross-sectional view illustrating a state in which the solder balls are bonded onto the plurality of lands after the wiring substrate illustrated in FIG. 29 is turned upside down. In the present step, after the wiring substrate 20 is turned upside down as illustrated in FIG. 30, the solder balls 13 are arranged on the plurality of lands 12 exposed from the lower surface 3b of the wiring substrate 20, respectively, and then, they are heated, so that the plurality of solder balls 13 and the lands 12 are bonded to each other. By the present step, the plurality of solder balls 13 are electrically connected to the semiconductor chips 2 via the wiring substrate 20. However, the application of the technique explained in the present embodiment is not limited to the so-called BGA (Ball Grid Array) type semiconductor device with bonding of the solder balls 13. For example, as a modified example of the present embodiment, the technique may be applied to a so-called LGA (Land Grid Array) type semiconductor device to be shipped in a state in which the lands 12 are exposed without forming the solder balls 13 or a state in which a solder paste is applied onto the lands 12 so as to be thinner than that onto the solder balls 13.

Separating Step

Figure 31:
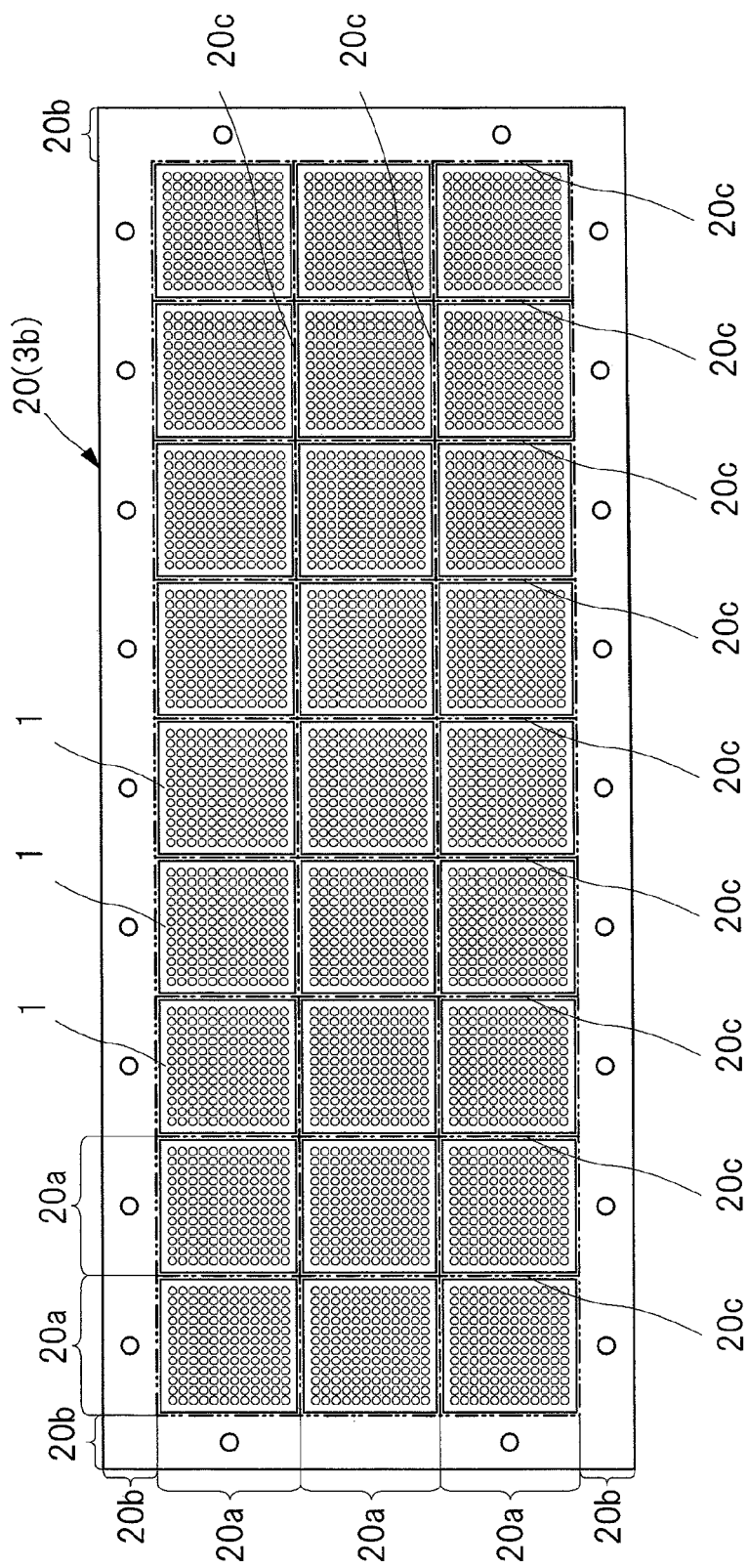
FIG. 31 is a plan view (lower surface view) illustrating a state in which the wiring substrate illustrated in FIG. 30 from which multiple pieces are taken is separated.

Next, in a separating step as illustrated in FIG. 10, the wiring substrate 20 is separated into pieces for each of the product formation regions 20a as illustrated in FIG. 31. FIG. 31 is a plan view (bottom view) illustrating a state in which the multiple-piece taking wiring substrate illustrated in FIG. 30 is separated. In this step, as illustrated in FIG. 31, the wiring substrate 20 is cut along dicing lines (dicing regions) 20c so that a plurality of separated semiconductor devices 1 are obtained. Although a cutting method is not particularly limited, a method of cutting the wiring substrate using, for example, a dicing blade (rotary blade) can be used.

By using each of the above-described steps, the semiconductor device 1 explained with reference to FIGS. 1 to 4 is obtained. Then, necessary inspections and tests such as an appearance inspection and an electrical test are performed thereon, and then, shipping or mounting on a not-illustrated mounting substrate is performed.

Second Embodiment

The above-described first embodiment has explained the technique of reducing the amount of the protrusion of the solder member 5 by bonding each protruding electrode 4 at the position where it overlaps the narrow width portion 11n of each terminal 11 having the wide width portion 11w and the narrow width portion 11n. The present embodiment will explain a technique of further stably controlling the amount of the protrusion of the solder member 5 by bonding each protruding electrode 4 at a position where it overlaps the narrow width portion 11n of each terminal 11 having the narrow width portion 11n formed between adjacent wide width portions 11w.

Figure 32:
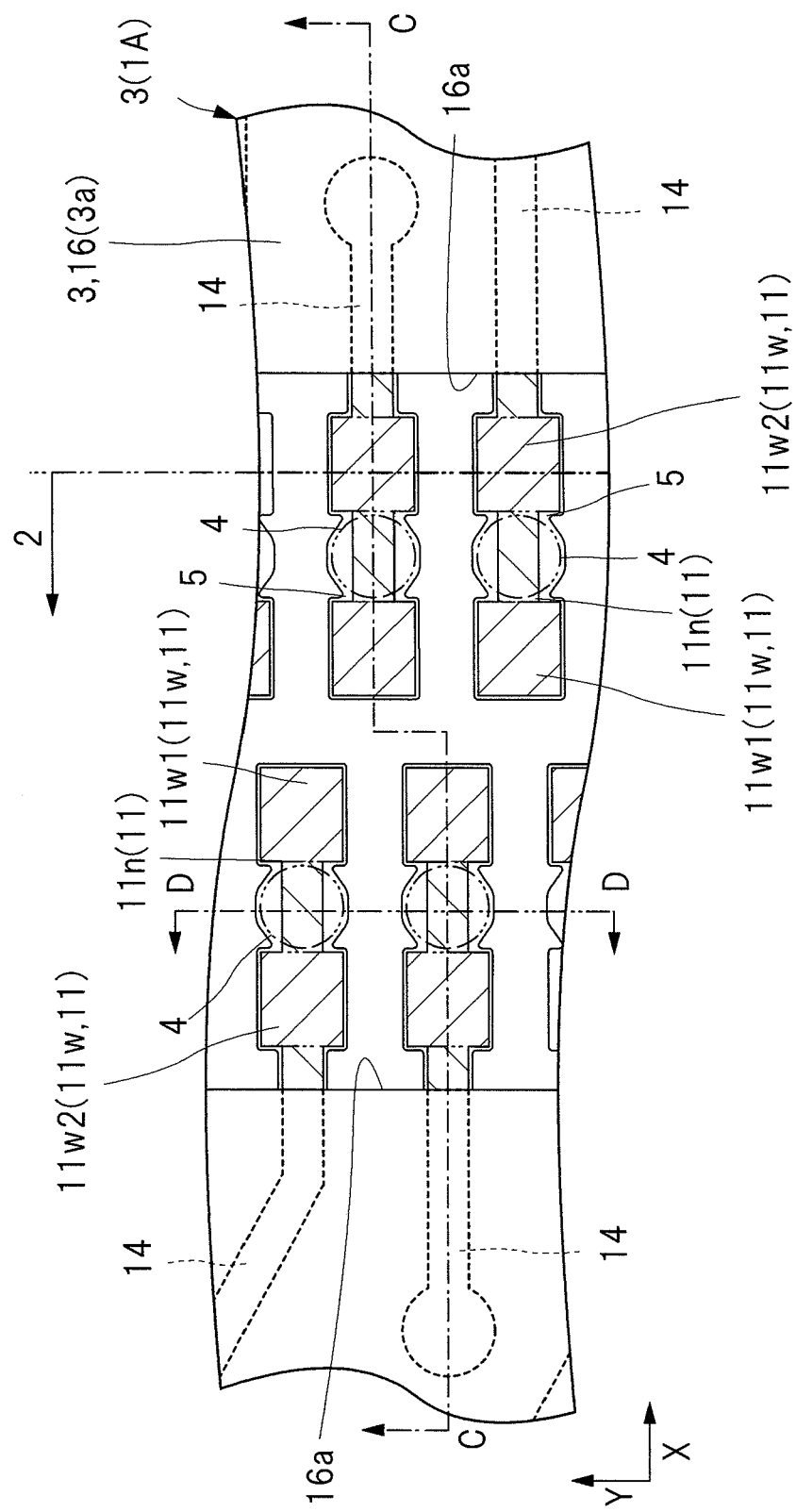
FIG. 32 is an enlarged plan view illustrating a planar positional relation between a terminal and a protruding electrode of the present embodiment, which is a modified example relative to FIG. 6.
Figure 33:
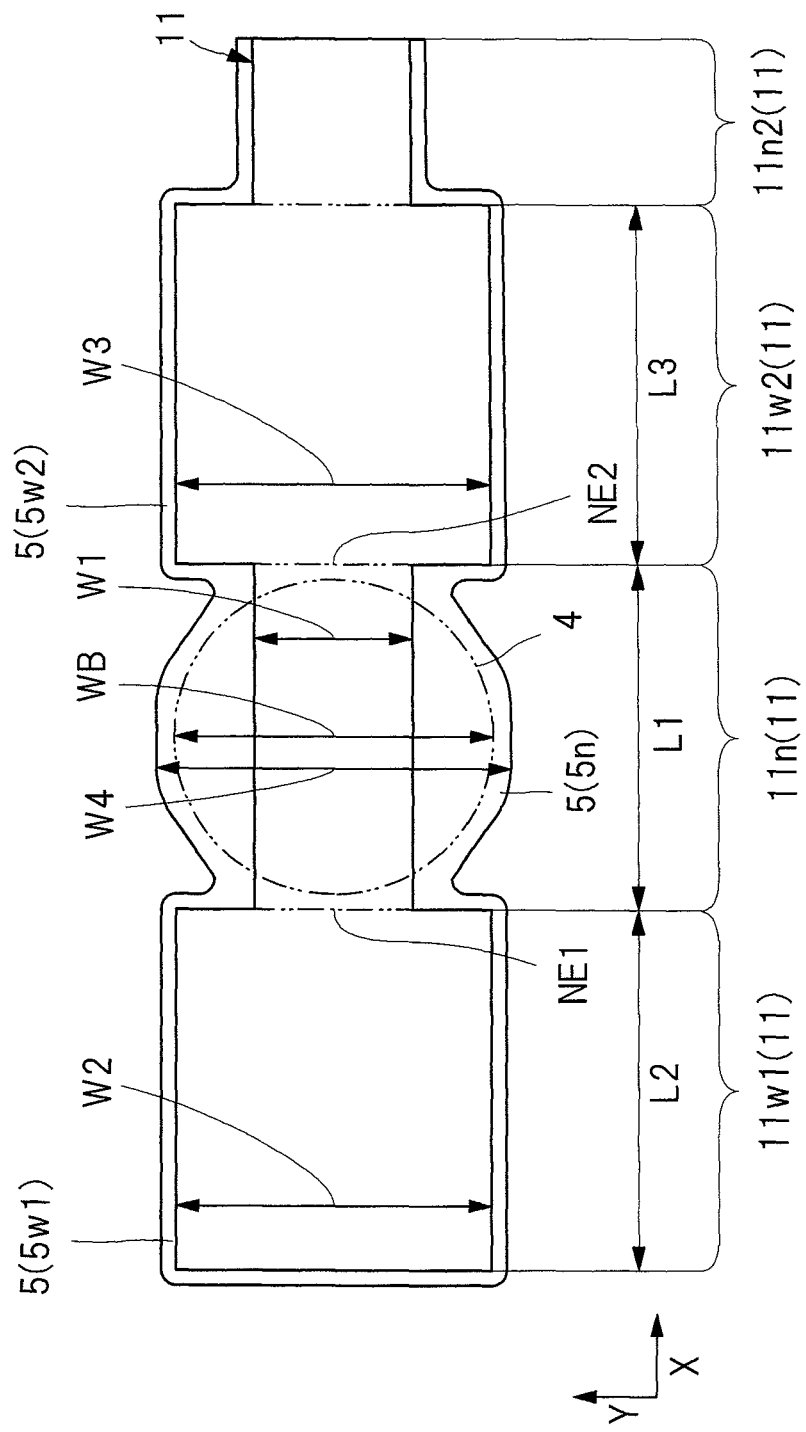
FIG. 33 is an enlarged plan view illustrating to enlarge one of the plurality of terminals illustrated in FIG. 32.
Figure 34:
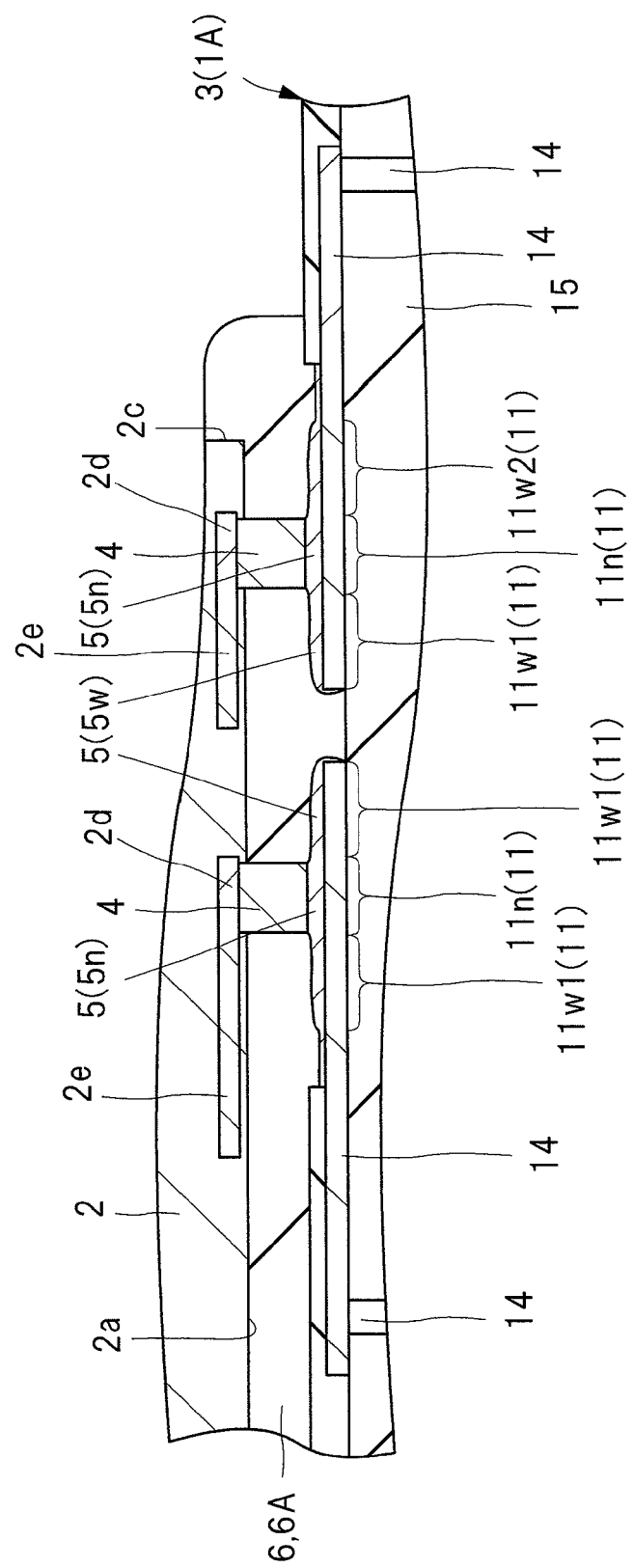
FIG. 34 is an enlarged cross-sectional view taken along a line C-C of FIG. 32.
Figure 35:
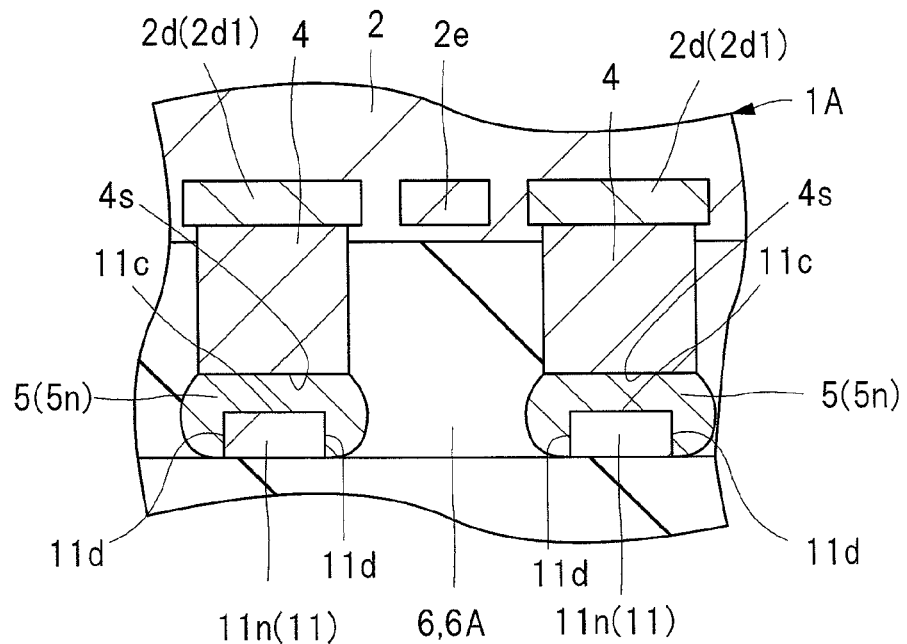
FIG. 35 is an enlarged cross-sectional view taken along a line D-D of FIG. 32.
Figure 36:
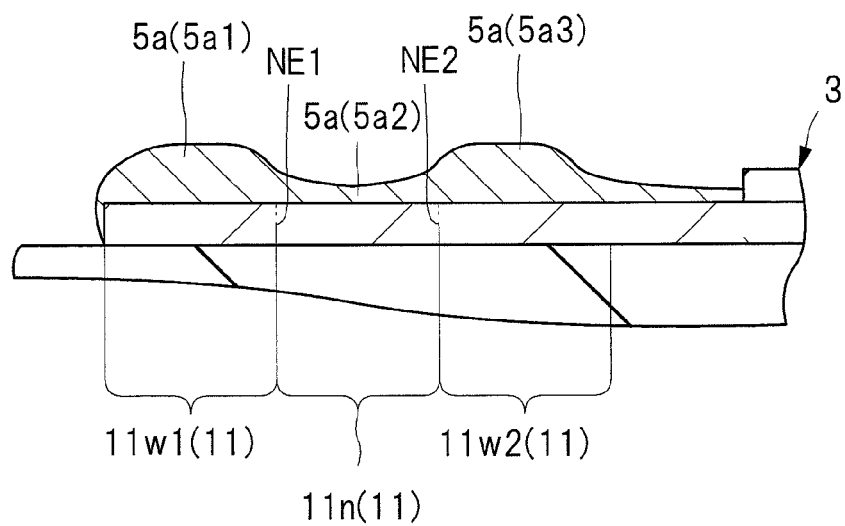
FIG. 36 is an enlarged cross-sectional view illustrating a state in which the solder member is previously applied prior to connection of the protruding electrode to the wiring substrate illustrated in FIG. 34.
Figure 37:
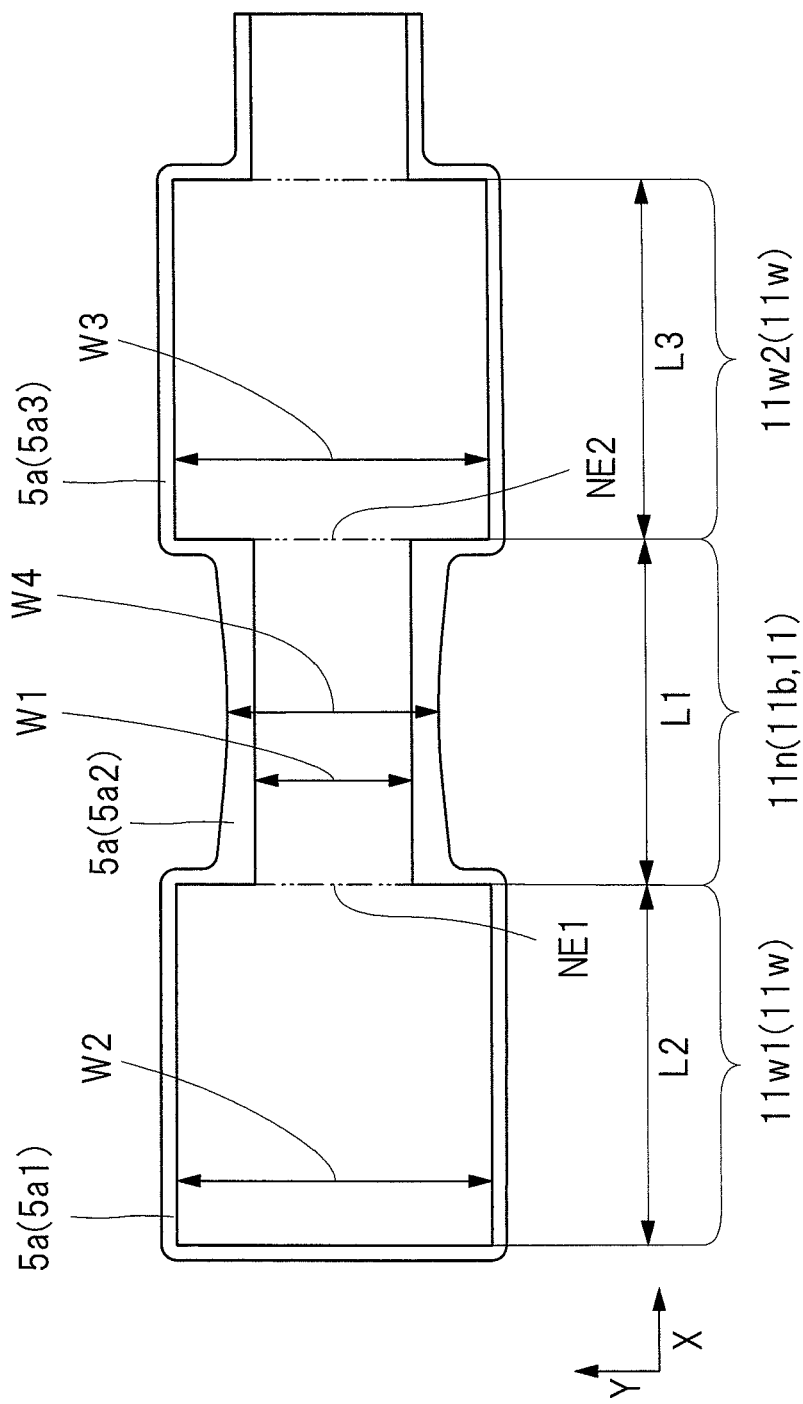
FIG. 37 is an enlarged plan view illustrating a state in which the solder member is previously applied prior to connection of the protruding electrode to the wiring substrate illustrated in FIG. 33.
Figure 38:
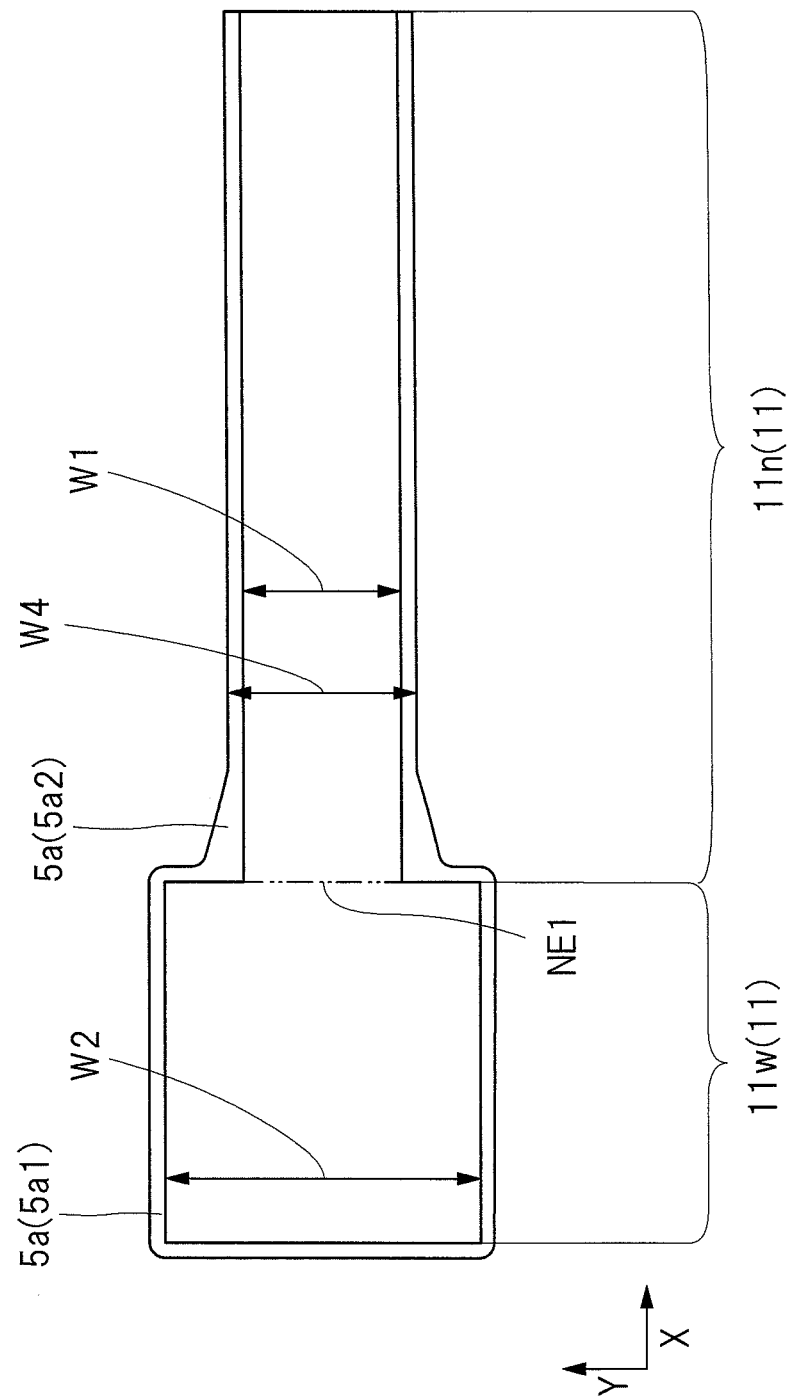
FIG. 38 is an enlarged plan view illustrating a state in which the solder member is previously applied prior to connection of the protruding electrode to the wiring substrate illustrated in FIG. 6.
Figure 39:
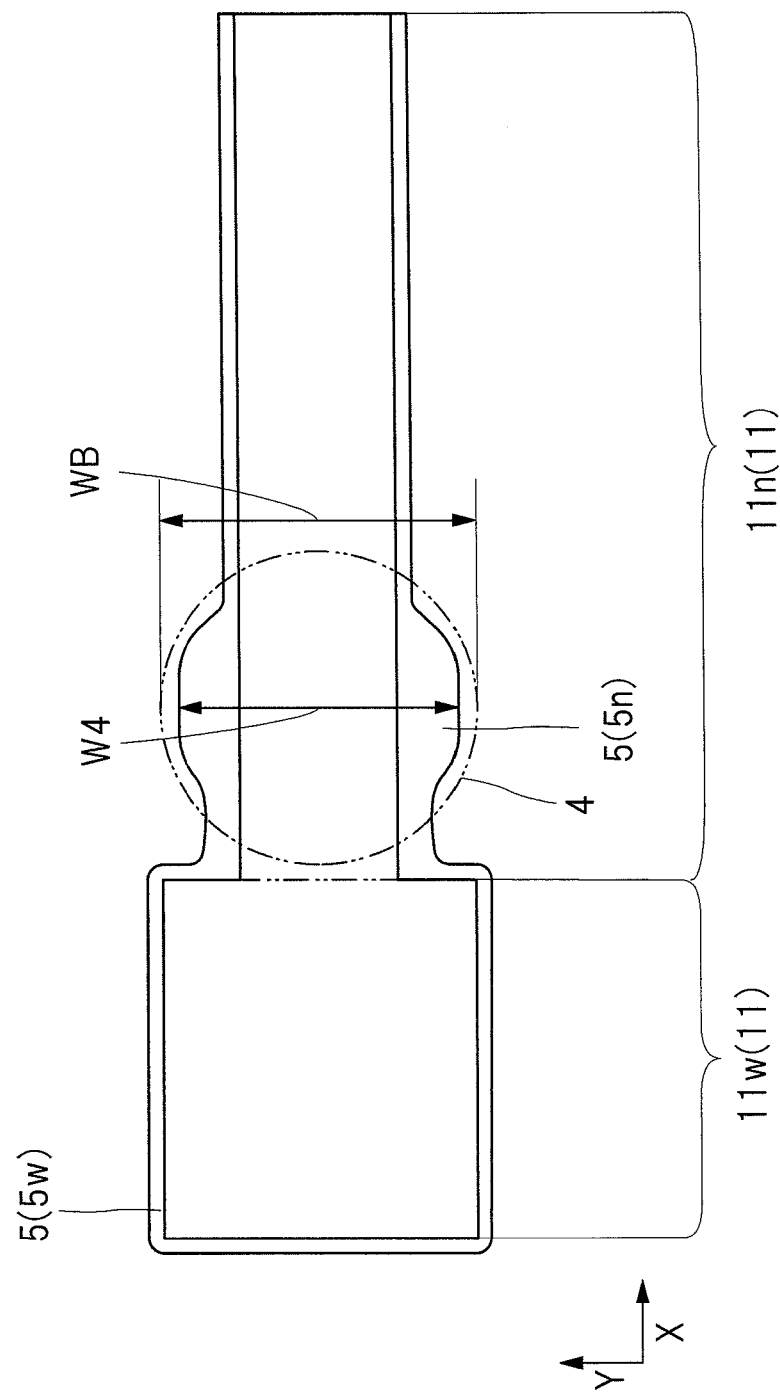
FIG. 39 is an enlarged plan view illustrating a state in which the protruding electrode is connected to the terminal illustrated in FIG. 38.

FIG. 32 is an enlarged plan view illustrating a planar positional relation between the terminals and the protruding electrodes of the present embodiment that is a modified example of FIG. 6. Moreover, FIG. 33 is an enlarged plan view illustrating one of the plurality of terminals illustrated in FIG. 32 so as to be enlarged. Further, FIG. 34 is an enlarged cross-sectional view taken along a line C-C of FIG. 32, and FIG. 35 is an enlarged cross-sectional view taken along a line D-D of FIG. 32. Moreover, FIG. 36 is an enlarged cross-sectional view illustrating a state in which a solder member is previously applied prior to connecting protruding electrodes to a wiring substrate illustrated in FIG. 34. Further, FIG. 37 is an enlarged plan view illustrating a state in which a solder member is previously applied prior to connecting protruding electrodes to a wiring substrate illustrated in FIG. 33. Still further, FIG. 38 is an enlarged plan view illustrating a state in which a solder member is previously applied prior to connecting protruding electrodes to a wiring substrate illustrated in FIG. 6. Still further, FIG. 39 is an enlarged plan view illustrating a state in which protruding electrodes are connected to terminals illustrated in FIG. 38.

Note that the present embodiment is a modified example of the above-described first embodiment, and the technique explained in the above-described first embodiment can be applied to the present embodiment except for differences explained below. Therefore, in the present embodiment, the differences between the above-described first embodiment and the present embodiment will be focused for explanation, and repetitive explanations will be omitted.

Moreover, the plurality of terminals 11 illustrated in FIG. 32 are electrically connected to a plurality of wires 14 formed on the upper surface 3a of the wiring substrate 3 and coated with the solder resist film 16, respectively. Each of the plurality of terminals 11 and the plurality of wires 14 are conductor patterns which are made of the same material as each other and can be formed as one batch. In the present embodiment, as similar to the above-described first embodiment, a portion of the conductor patterns formed on the upper surface 3a of the wiring substrate 3, which is covered with the solder resist film 16 will be explained as the wire 14, and a portion thereof which is exposed from the solder resist film 16 will be explained as the terminal 11. Also, the same goes for a modified example explained below.

As illustrated in FIG. 32, in a semiconductor device 1A of the present embodiment, each of the plurality of terminals 11 in the planar view is different in the shape from that of the semiconductor device 1 of the above-described first embodiment illustrated in FIG. 6. As illustrated in FIG. 32, each of the plurality of terminals 11 included in the semiconductor device 1A of the present embodiment has a plurality of wide width portions 11w and a narrow width portion whose width (length in a Y direction illustrated in FIG. 32) is narrower than those of the wide width portions 11w. More specifically, in each terminal 11, two wide width portions 11w are arranged, and a narrow width portion 11n is arranged between these two wide width portions 11w, and each protruding electrode 4 is connected at a position where it overlaps this narrow width portion 11n. In other words, wide width portions 11w1 and 11w2 are provided (connected) on both sides of the narrow width portion 11n which is the bonding portion with the protruding electrode 4.

More specifically, as illustrated in FIG. 33, each of the plurality of terminals 11 included in the semiconductor device 1A has a narrow width portion 11n having an end portion (connecting portion) NE1 and an end portion (connecting portion) NE2 in the X direction in plan view, and besides, having a width (a length along the Y direction orthogonal to the X direction) W1. Moreover, each of the plurality of terminals 11 has a wide width portion 11w1 having a width W2 (a length along the Y direction) larger than the width W1, and besides, being connected to the end portion NE1 of the narrow width portion 11n. Further, each of the plurality of terminals 11 has a wide width portion 11w2 having a width W3 (a length along the Y direction) larger than the width W1, and besides, being connected to the end portion NE2 of the narrow width portion 11n. And, in the planar view, the center of the tip surface 4s (see FIG. 35) of each protruding electrode 4 is arranged between the wide width portion 11w1 and the wide width portion 11w2 of the terminal 11.

The present embodiment is the same as the above-described first embodiment in that the center of the tip surface 4s of each protruding electrode 4 is arranged at the position where it overlaps the narrow width portion 11n in each terminal 11 having the wide width portion 11w and the narrow width portion 11n. Therefore, the same effects as those of the above-described first embodiment can be obtained.

Moreover, according to the present embodiment, the narrow width portion 11n is arranged between the adjacent wide width portions 11w1 and 11w2, and therefore, the following effects can be obtained in addition to the effects explained in the above-described first embodiment.

First, in the present embodiment, since the narrow width portion 11n is bonded between the adjacent wide width portions 11w1 and 11w2, the thickness of the solder member 5a previously formed in the terminal 11 as illustrated in FIGS. 36 and 37 is easily controlled. As explained in the above-described first embodiment, when the solder member 5a is melted, the melted solder is influenced by the surface tension of the melted solder itself, and therefore, the melted solder tends to be gathered toward the region having the relatively large area. When this tendency is adapted to the present embodiment, much of the melted solder is gathered to the wide width portion 11w1 as illustrated in FIG. 36, and a dome-shaped (or a hemispherical-shaped) solder member (solder mass) 5a1 is formed in accordance with the shape of the wide width portion 11w1. Moreover, much of the melted solder is gathered to the wide width portion 11w2, and a dome-shaped (or a hemispherical-shaped) solder member (solder mass) 5a3 is formed in accordance with the shape of the wide width portion 11w2. On the other hand, on the narrow width portion 11n, the melted solder is moved toward the wide width portion 11w, and therefore, the amount of the solder member 5a2 formed on the narrow width portion 11n becomes less than those of the solder members 5a1 and 5a3 formed on the wide width portions 11w1 and 11w2.

Here, in the aspect explained in the above-described first embodiment, as illustrated in, for example, FIG. 38, the amount of the solder member 5a2 is gradually less as it is distant further from the border between the wide width portion 11w and the narrow width portion 11n. Therefore, depending on the position of the tip surface of the protruding electrode 4 (see FIG. 7), the amount of the solder member 5a2 in the step of bonding with the protruding electrode 4 is too small in some cases. For example, when the bonding position between the protruding electrode 4 and the terminal 11 in the planar view illustrated in FIG. 22 is distant from the border between the wide width portion 11w and the narrow width portion 11n but is in vicinity of the solder resist film 16, it is difficult to control the amount of the solder member 5a. Therefore, when the amount of the solder member 5a at the bonding position with the protruding electrode 4 is extremely small, this is a cause of the reduction in the bonding strength.

Meanwhile, according to the present embodiment, the thickness of the solder member 5a2 bonded onto the narrow width portion 11n sandwiched by the wide width portions 11w1 and 11w2 can be controlled by a separated distance L1 between the end portions NE1 and NE2 (in other words, a separated distance L1 between the wide width portions 11w1 and 11w2). Therefore, the thickness of the solder member 5a2 can be controlled within a predetermined range at any position as long as the position is located between the wide width portions 11w1 and 11w2, that is, the position where it overlaps the narrow width portion 11n. That is, the thickness of the solder member 5a2 to be formed on the narrow width portion 11n can be made stably thinner than that of the above-described first embodiment. Therefore, according to the present embodiment, by arranging each protruding electrode 4 (see FIG. 34) on the thinly-formed solder member 5a2 (that is, between the wide width portions 11w1 and 11w2) to be bonded to the solder member 5a2, the amount of the solder member 5 (more specifically, the solder member 5n) for bonding the protruding electrode 4 and the terminal 11 can be controlled to be an appropriate amount.

Moreover, in an example illustrated in FIG. 37, an area of the wide width portion 11w1 and an area of the wide width portion 11w2 are made equal to each other in the planar view. By forming the areas of the wide width portion 11w1 and the wide width portion 11w2 so as to be equal to each other as described above, the amount of the solder member 5a (more specifically, the amounts of the solder member 5a1 and the solder member 5a3) gathered to each of the wide width portions 11w1 and 11w2 can be equal to each other. In this case, the thickness of the solder member 5a2 formed on the narrow width portion 11n can be further easily controlled.

Also, by forming the areas of the wide width portions 11w1 and 11w2 so as to be equal to each other, the amounts of solder members 5 obtained after the bonding with the protruding electrode 4 can be equal to each other as illustrated in FIG. 33. More specifically, the amount of the solder member 5w1 formed on the wide width portion 11w1 and the amount of the solder member 5w2 formed on the wide width portion 11w2 as illustrated in FIG. 33 can be equal to each other. By controlling the amounts of the solder members 5w1 and 5w2 in this manner, it becomes possible to easily control the amount of the solder member 5n formed between the solder members 5w1 and 5w2. Therefore, as illustrated in FIG. 33, it is possible to easily control the amount of the solder member 5n formed on the periphery of the bonding portion between the protruding electrode 4 and the terminal 11.

Moreover, in the example illustrated in FIG. 33, the width W2 of the wide width portion 11w1 and the width W3 of the wide width portion 11w2 are made equal to each other. More specifically, in the example illustrated in FIG. 33, in the planar view, the area of the wide width portion 11w1 and the area of the wide width portion 11w2 are made equal to each other, and the width W2 of the wide width portion 11w1 and the width W3 of the wide width portion 11w2 are made equal to each other. In other words, in the example, illustrated in FIG. 33, in the plan view, the wide width portions 11w1 and 11w2 have the same shape as each other. By forming the wide width portions 11w1 and 11w2 to have the same shape, the shapes of the solder members 5a to be gathered to the wide width portions 11w1 and 11w2 respectively (more specifically, the shapes of the solder member 5a1 and the solder member 5a3) can be made equal to each other, as illustrated in FIG. 36 and FIG. 37. In this case, the thickness of the solder member 5a2 to be formed on the narrow width portion 11n can be more easily controlled.

As seen from comparison of FIG. 8 explained in the above-described first embodiment with FIG. 35 of the present embodiment, according to the present embodiment, it is possible to increase the amount of the solder members 5 flowing round to the side surface 11d of the narrow width portion 11n arranged on the region to which the protruding electrode 4 is bonded. Thus, according to the present embodiment, the bonding strength between the solder member 5 and the narrow width portion 11n can be improved.

As illustrated in FIG. 38, when the wide width portion 11w is bonded to only one end portion NE1 of the narrow width portion 11n, the width W4 of the solder member 5a2 arranged in the periphery of the narrow width portion 11n is smaller in the planar view as being farther from the vicinity of the end portion NE1. In this case, as illustrated in FIG. 39, when the protruding electrode 4 is bonded, the solder member 5b (see FIG. 26) previously formed on the protruding electrode 4 and the solder member 5a2 (see FIG. 38) are formed integrally with each other. Therefore, the width W4 of the solder member 5n in the planar view is locally larger in the periphery of the protruding electrode 4. However, since the amount of the solder members 5a2 previously formed on the bonding portion with the protruding electrode 4 is small, and since the melted solder tends to gather onto the wide width portion 11w, the width W4 of the solder member 5n is not so large.

On the other hand, in the case of the present embodiment, as illustrated in FIG. 37, since the wide width portions 11w are arranged on the both end portions of the narrow width portion 11n, the width W4 of the solder member 5a2 arranged in the periphery of the narrow width portion 11n in the planar view is larger than that of the aspect illustrated in FIG. 38. That is, in the present embodiment, prior to the bonding with the protruding electrode 4, the width W4 of the solder member 5a2 in the planar view is already larger as illustrated in FIG. 37. When the protruding electrode 4 is bonded onto the narrow width portion 11n in this state, the width W4 of the solder member 5n in the planar view is further larger in the periphery of the protruding electrode 4 as illustrated in FIG. 33. As a result, as illustrated in FIG. 35, it is possible to increase the amount of the solder member 5n flowing round to the side surface 11d of the narrow width portion 11n arranged in the region to which the protruding electrode 4 is bonded.

When the amount of the solder member 5n flowing round to the side surface 11d of the narrow width portion 11n is excessively large, this excess is a cause of reduction of reliability since a part of the solder member 5n protrudes onto the periphery of the bonding region so that the adjacent terminals are connected electrically to each other. However, according to the present embodiment, the width W4 of the solder member 5a2 arranged in the periphery of the wide width portion 11n in the planar view can be controlled by the width W2 of the wide width portion 11w1, the width W3 of the wide width portion 11w2, and the separated distance L between the end portions NE1 and NE2. That is, according to the present embodiment, it is possible to increase the amount of the solder member 5n flowing round to the side surface 11d of the narrow width portion 11n, and besides, to prevent the excess protrusion of the solder member 5n onto the periphery of the bonding region. As a result, since the short-circuit between the adjacent terminals 11 or others can be suppressed, and since the bonding strength between the terminals 11 and the solder members 5 can be improved, the reliability can be further improved than that of the aspect explained in the above-described first embodiment.

Method of Manufacturing Semiconductor Device

Next, a method of manufacturing a semiconductor device of the present embodiment illustrated in FIGS. 32 to 35 will be explained. The semiconductor device of the present embodiment can be manufactured by using the same method of manufacturing the semiconductor device explained in the above-described first embodiment. More specifically, in the substrate provision step illustrated in FIG. 10, the present embodiment is different from the above-described first embodiment in that, in each of the plurality of terminals 11 formed in the product formation regions 20a of the wiring substrate 20 (see FIG. 11), the narrow width portion 11n is connected between the plurality of wide width portions 11w as illustrated in FIGS. 32 to 35. Moreover, in the above-described chip mounting step, the present embodiment is different from the above-described first embodiment in that the center of the tip surface 4s of the protruding electrode 4 is positioned between the adjacent wide width portions 11w1 and 11w2. It can be manufactured as similar to the above-described first embodiment in the other points, and therefore, the repetitive explanations will be omitted.

Figure 40:
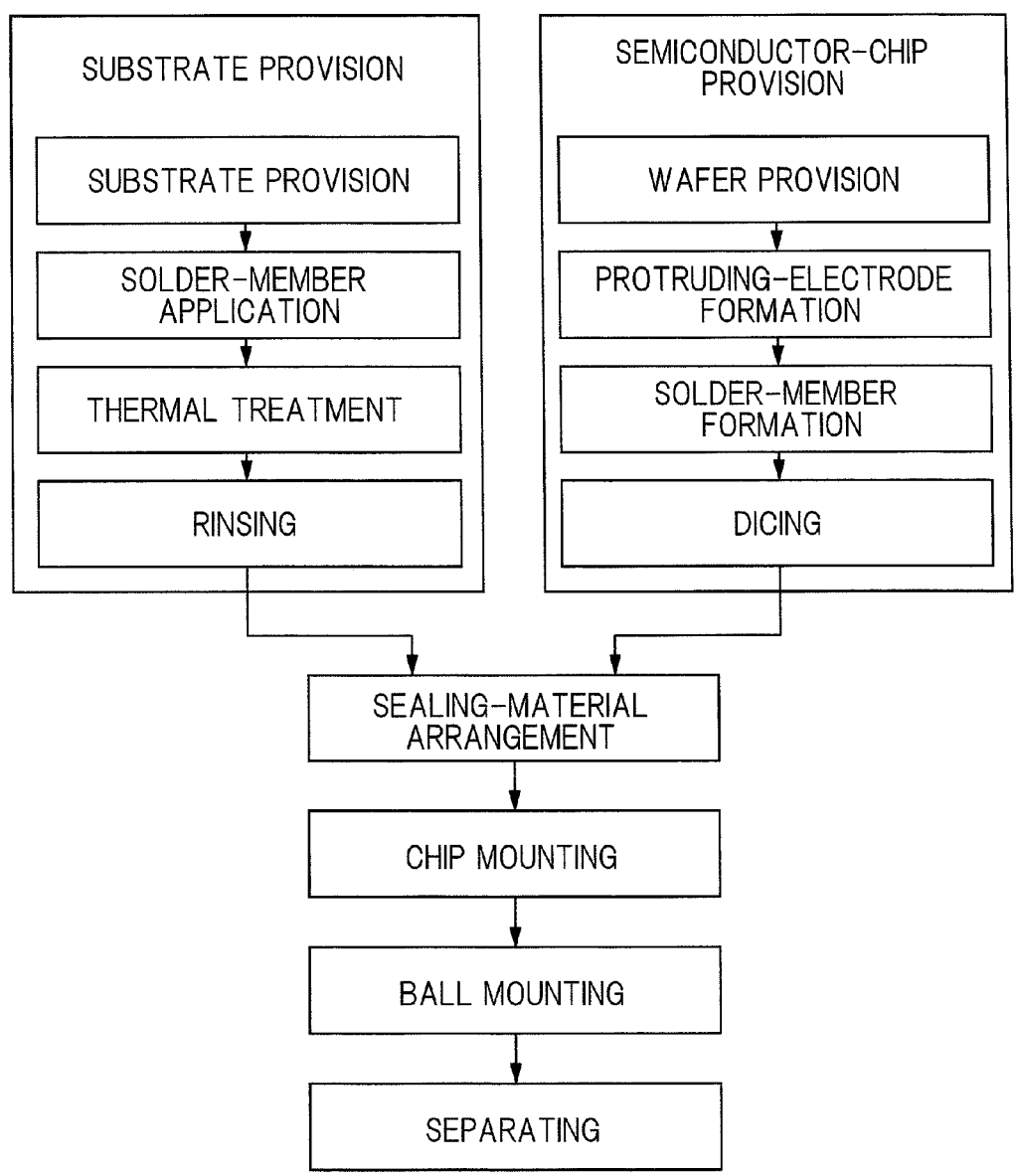
FIG. 40 is an explanatory diagram illustrating outline of steps of manufacturing a semiconductor device, which is a modified example relative to FIG. 10.

However, from the studies made by the inventors of the present application, it has been found that the application of the configuration of the terminals 11 explained in the present embodiment provides a more preferable manufacturing method than that of the application of the configuration of the terminals 11 explained in the above-described first embodiment. In the present section, as a modified example of the method of manufacturing the semiconductor device explained in the above-described first embodiment, an aspect in which the application of the configuration of the terminals 11 explained in the present embodiment is more preferable will be explained. FIG. 40 is an explanatory diagram illustrating an outline of manufacturing steps of a semiconductor device that is a modified example of that illustrated in FIG. 10.

A manufacturing step illustrated in FIG. 40 is different from the manufacturing step illustrated in FIG. 10 explained in the above-described first embodiment in a timing at which the chip mounting step is performed. That is, the manufacturing step illustrated in FIG. 10 adopts a method in which, subsequent to the electrical connection of the semiconductor chips 2 with the wiring substrate 20, the connection portion is sealed with the under fill resin 6 (hereinafter, the method is referred to as "post injection method"). On the other hand, the manufacturing step illustrated in FIG. 40 adopts a method in which, prior to the mounting of the semiconductor chip 2 on the wiring substrate 20 in the chip mounting step, a sealing material is arranged on the chip mounting region (in a sealing-material arrangement step illustrated in FIG. 40), and then, the semiconductor chip 2 is pressed onto the wiring substrate 20 via an adhesive material so as to be electrically connected to the wiring substrate 20 (hereinafter, the method is referred to as "previous coating method").

In the case of the post injection system explained in the above-described first embodiment, as illustrated in FIG. 29, resin is supplied from a nozzle 27 arranged in the vicinity of a space between the semiconductor chip 2 and the wiring substrate 20, the under fill resin 6 is filled into the space by utilizing capillary action. In this case, since the resin is filled into the space by utilizing the capillary action, process time (time required for the resin injection) for one product formation region 20a becomes long. Moreover, a space for moving the nozzle 27 along the side surface 2c of the semiconductor chip 2 is required. Therefore, a width of the under fill resin 6 spreading on the periphery of the semiconductor chip 2 tends to be thick.

On the other hand, in the case of the previous coating method illustrated in FIG. 40, the sealing material is previously arranged between the semiconductor chip 2 and the wiring substrate 20, and therefore, this method is more preferable than the above-described post injection system in that the process time for one product formation region 20a is shortened so that the manufacturing efficiency is improved. Moreover, it is not necessary to move the nozzle 27 along the side surface 2c of the semiconductor chip 2, and therefore, the amount (protruding amount) of the sealing material 6A (see FIGS. 34 and 35) spreading on the periphery of the semiconductor chip 2 is reduced, and thus, this method is advantageous more than the post injection system by this reduction from a viewpoint of downsizing of the semiconductor device. Further, even when the arrangements (layouts) of the pad 2d formed on the front surface 2a of the semiconductor chip 2 and the protruding electrode 4 formed on this pad 2d are complicated (in such an aspect that the pad 2d and the protruding electrode 4 are formed in the center portion of the front surface 2a), this method is more advantageous than the post injection system from a viewpoint of the filling property of the sealing material 6A.

However, according to the studies made by the inventors of the present application, it has been found that the amount of the solder member 5 (see FIG. 35) in the case of the previous coating method flowing round to the side surface 11d (see FIG. 35) of the narrow portion 11n (see FIG. 35) is less than the amount thereof in the case of the post injection system since the sealing material 6A (see FIGS. 34 and 35) previously arranged in the chip mounting region tends to easily interrupt the deformation of the solder member 5 in the reflow treatment. When the amount of the solder member 5 flowing round to the side surface 11d of the narrow width portion 11n is decreased, the bonding strength between the solder member 5 and the terminal 11 is decreased, and therefore, this causes the reduction of the reliability.

Accordingly, as a result of further studies made by the inventors of the present application, it has been found that the bonding strength between the solder member 5 and the terminal 11 can be improved even in the case of application of the previous coating method by the application of the configuration of the terminals 11 of the present embodiment explained with reference to FIGS. 32 to 39 since the amount of the solder member 5 flowing round to the side surface 11$d$ of the narrow width portion 11$n$ is previously increased prior to the bonding with the protruding electrode 4.

Hereinafter, the method of manufacturing the semiconductor device illustrated in FIG. 40 will be explained in detail by mainly describing a difference from the aspect explained in the above-described first embodiment.

Substrate Provision Step

Figure 41:
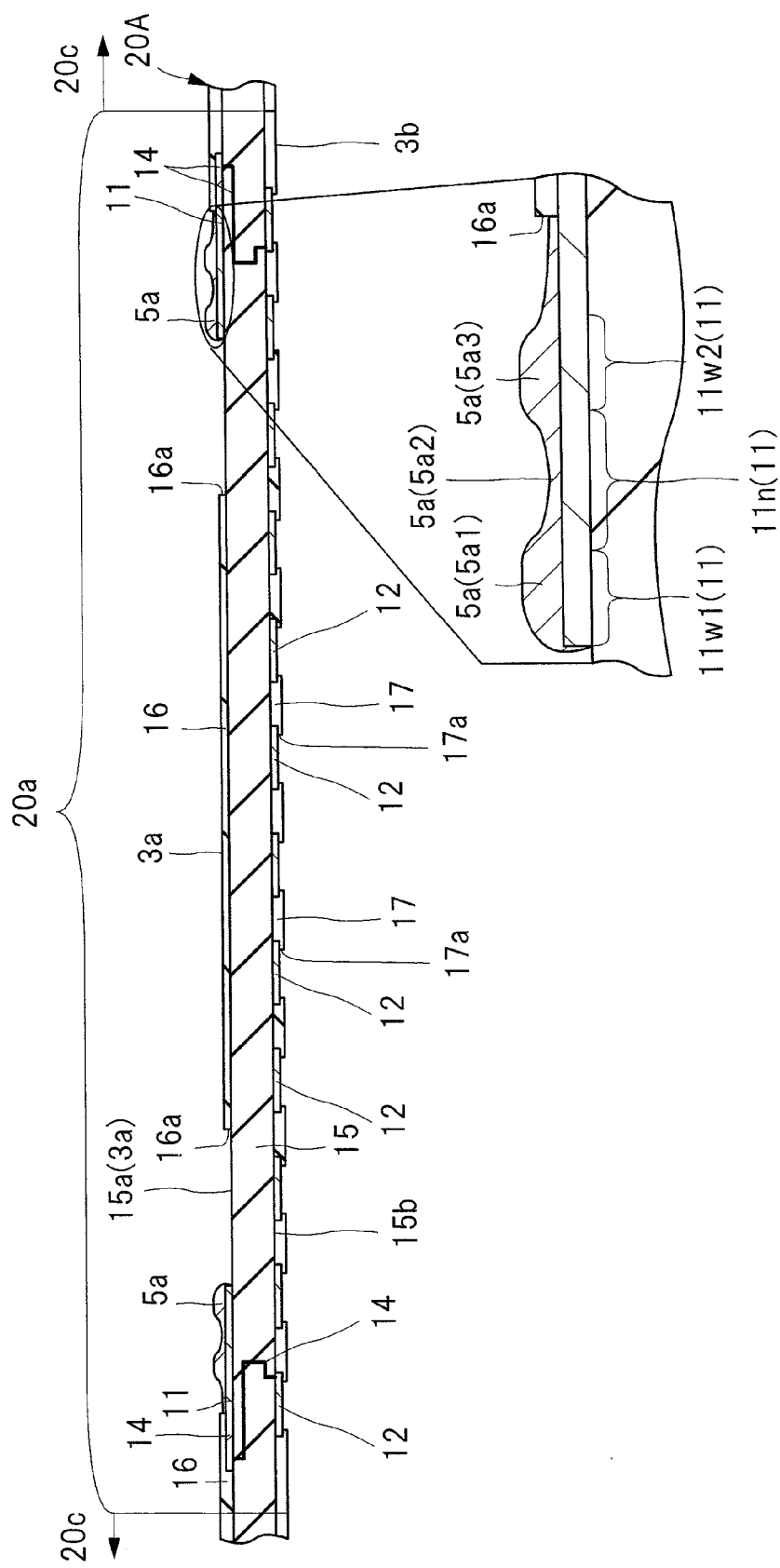
FIG. 41 is an enlarged cross-sectional view illustrating a modified example relative to FIG. 12.

First, in a substrate provision step illustrated in FIG. 40, a wiring substrate 20A is provided as illustrated in FIG. 41. FIG. 41 is an enlarged cross-sectional view illustrating a modified example of FIG. 12. The wiring substrate 20 provided in the substrate provision step and illustrated in FIG. 41 is different from that of the above-described first embodiment in the shape of the terminal 11 formed in the product formation region 20$a$ and the shape of the solder member 5$a$ formed on the terminal 11. That is, as explained with reference to FIG. 37, the substrate is different from the wiring substrate 20 explained in the above-described first embodiment in that each of the plurality of terminals 11 provided on the wiring substrate 20A (see FIG. 41) provided in the present embodiment has the wide width portion 11$w$1 bonded to one end portion NE1 of the narrow width portion 11$n$ and has the wide width portion 11$w$2 bonded to the other end portion NE2.

Moreover, as illustrated in FIG. 37, the solder member 5$a$ previously formed on each terminal 11 includes: a solder member 5$a$1 that is a portion bonded to the wide width portion 11$w$; a solder member 5$a$3 that is a portion bonded to the wide width portion 11$w$2; and a solder member 5$a$2 that is a portion bonded to the narrow width portion 11$n$. Further, the widths of the solder members 5$a$1 and 5$a$3 (that is, lengths thereof in a Y direction illustrated in FIG. 37) are larger than the width W2 of the wide width portion 11$w$1 and the width W3 of the wide width portion 11$w$2, respectively. On the other hand, the width W4 of the solder member 5$a$2 is larger than the width W1 of the narrow width portion 11$n$, but smaller than the widths W2 and W3. As seen from comparison between FIGS. 37 and 38, the narrow width portion 11$n$ is formed between the adjacent wide width portions 11$w$ in the present embodiment, and therefore, the width W4 of the solder member 5$a$2 is larger than the width W4 of the solder member 5$a$2 illustrated in FIG. 38.

As described above, while the solder member 5$a$ previously formed on the terminal 11 included in the wiring substrate 20A provided in the present first embodiment is different from the solder member 5$a$ explained in the above-described embodiment in the shape, the method of forming the solder member 5$a$ is the same as the method explained in the above-described first embodiment. For example, the method of forming the solder member explained in the above-described first embodiment with reference to FIG. 13 or the method of forming the solder member that is the modified example explained with reference to FIG. 14 may be adopted.

Except for the above-described different points, the wiring substrate 20A of the present embodiment is the same as the wiring substrate 20 explained in the above-described first embodiment. For example, as similar to the wiring substrate 20 illustrated in FIG. 11, the wiring substrate 20A is provided with a plurality of product formation regions 20$a$ inside the frame portion 20$b$. Moreover, except for the above-described different points, the substrate provision step of the present embodiment is the same as the substrate provision step explained in the above-described first embodiment. Therefore, the repetitive explanations thereof will be omitted.

Sealing-Material Arrangement Step

Figure 42:
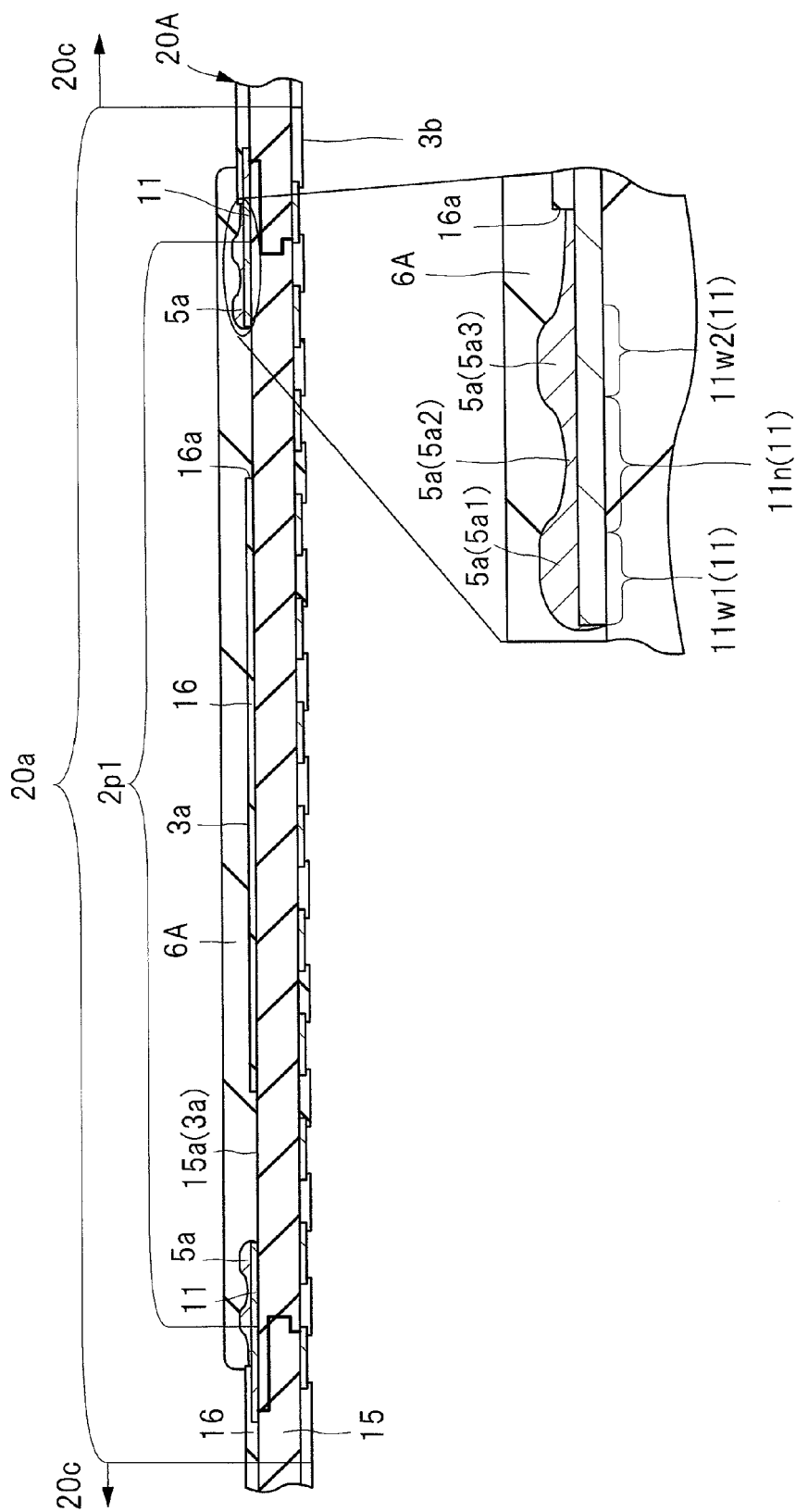
FIG. 42 is an enlarged cross-sectional view illustrating a state in which a sealing material is arranged in a product-forming region of the wiring substrate illustrated in FIG. 41.
Figure 43:
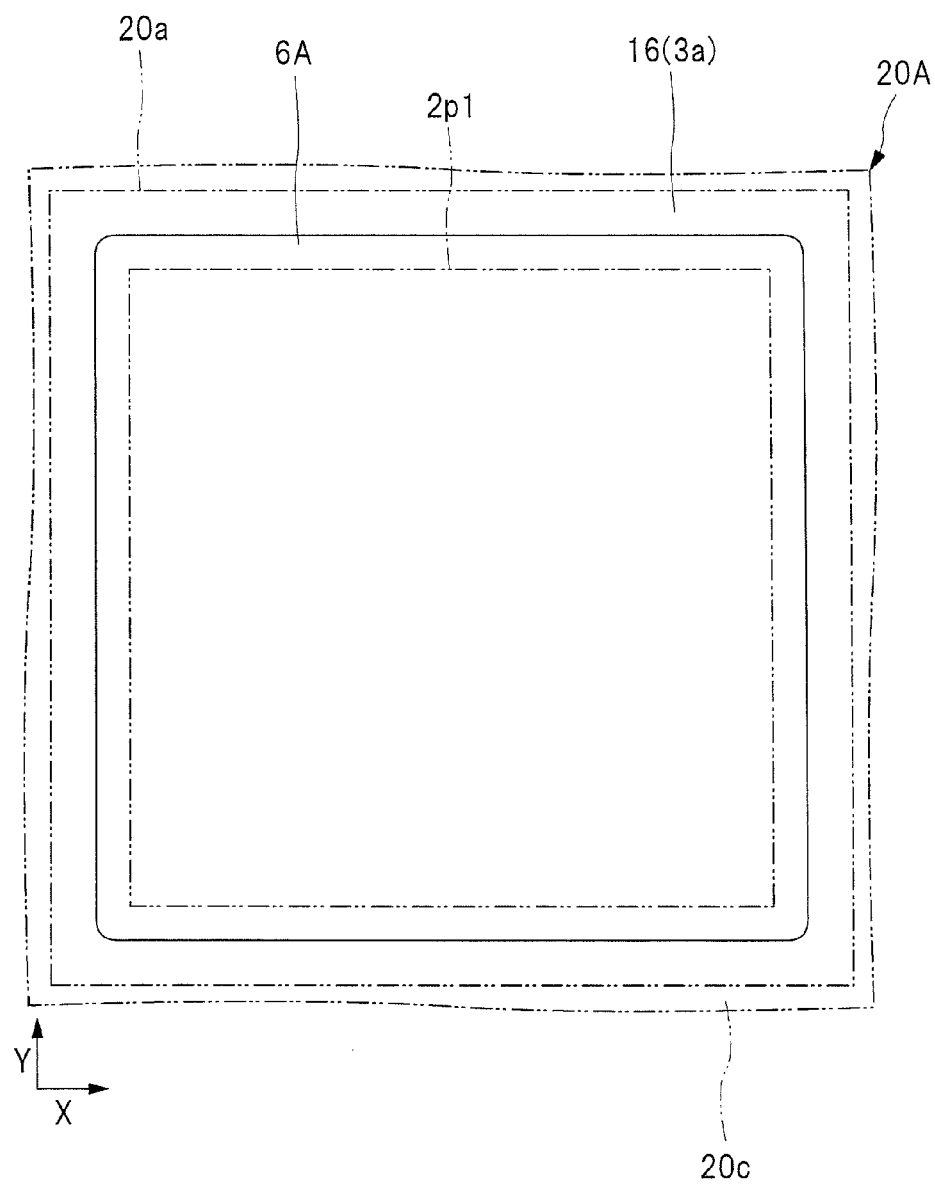
FIG. 43 is an explanatory view illustrating the product-forming region illustrated in FIG. 42.

Next, in a sealing-material arrangement step illustrated in FIG. 40, an insulating sealing material 6A is arranged on a chip mounting region 2$p$1 of the product formation region 20$a$ of the wiring substrate 20A as illustrated in FIGS. 42 and 43. FIG. 42 is an enlarged cross-sectional view illustrating a state in which the sealing material is arranged on the product formation region of the wiring substrate illustrated in FIG. 41. Moreover, FIG. 43 is an enlarged plan view illustrating the product formation region illustrated in FIG. 42.

The sealing material 6A arranged on the product formation region 20$a$ in the present step is made of an insulating (non-conductive) material (such as a resin material). Moreover, the sealing material 6A is made of a resin material that is hardened (raised) in a degree of hardness (hardness) by applying energy thereto, and includes, for example, a thermosetting resin in the present embodiment. Further, the sealing material 6A obtained prior to the hardening is softer than the terminal 11 illustrated in FIG. 42, and therefore, can be deformed by pressing the semiconductor chip 2 (see FIG. 34) thereto in the chip mounting step illustrated in FIG. 40.

Moreover, the sealing materials 6A obtained prior to the hardening are roughly classified into the following two types depending on difference in a handling method. One of them is made of a paste-like resin (insulating material paste) referred to as NCP (Non-Conductive Paste), and there is a method of application of the material onto the chip mounting regions 2$p$1 from a nozzle not illustrated. The other is made of a previously film-like shaped resin (insulating film) referred to as NCF (Non-Conductive Film), and there is a method of carrying and pasting the film-state material onto the chip mounting region 2$p$1. The examples illustrated in FIGS. 42 and 43 illustrate an example in which the sealing material 6A being the insulating material film (NCF) is arranged on the chip mounting region 2$p$1 and is pasted thereon so as to be tightly adhered onto the upper surface 3$a$ of the wiring substrate 20A. Although not illustrated, an insulating material paste (NCP) may be also used as a modified example.

As illustrated in FIG. 34, the sealing material 6A has a function for sealing the protruding electrode 4 to be the electrical connection portion between the semiconductor chip 2 and the wiring substrate 3. Therefore, it is preferred to arrange the sealing material 6A so as not to cause a space between the front surface 2$a$ of the semiconductor chip 2 and the upper surface 3$a$ of the wiring substrate 3. Therefore, in the present embodiment, as illustrated in FIG. 43, the sealing material 6A being the insulating film is arranged so as to cover entirely the chip mounting region 2$p$1 to be a planned region on which the semiconductor chip 2 (see FIG. 34) is to be formed. In this case, as illustrated in FIG. 42, the solder members 5$a$ formed on the terminal 11 and the periphery of the terminal 11 are covered with the sealing material 6A.

However, when an insulating material paste is used as a modified example, it is only required to cover at least a part of the chip mounting region 2$p$1 by the sealing material 6A being the insulating paste in the present step since the insulating material paste is pressed and spread in the chip mounting step illustrated in FIG. 40.

Chip Mounting Step

Figure 44:
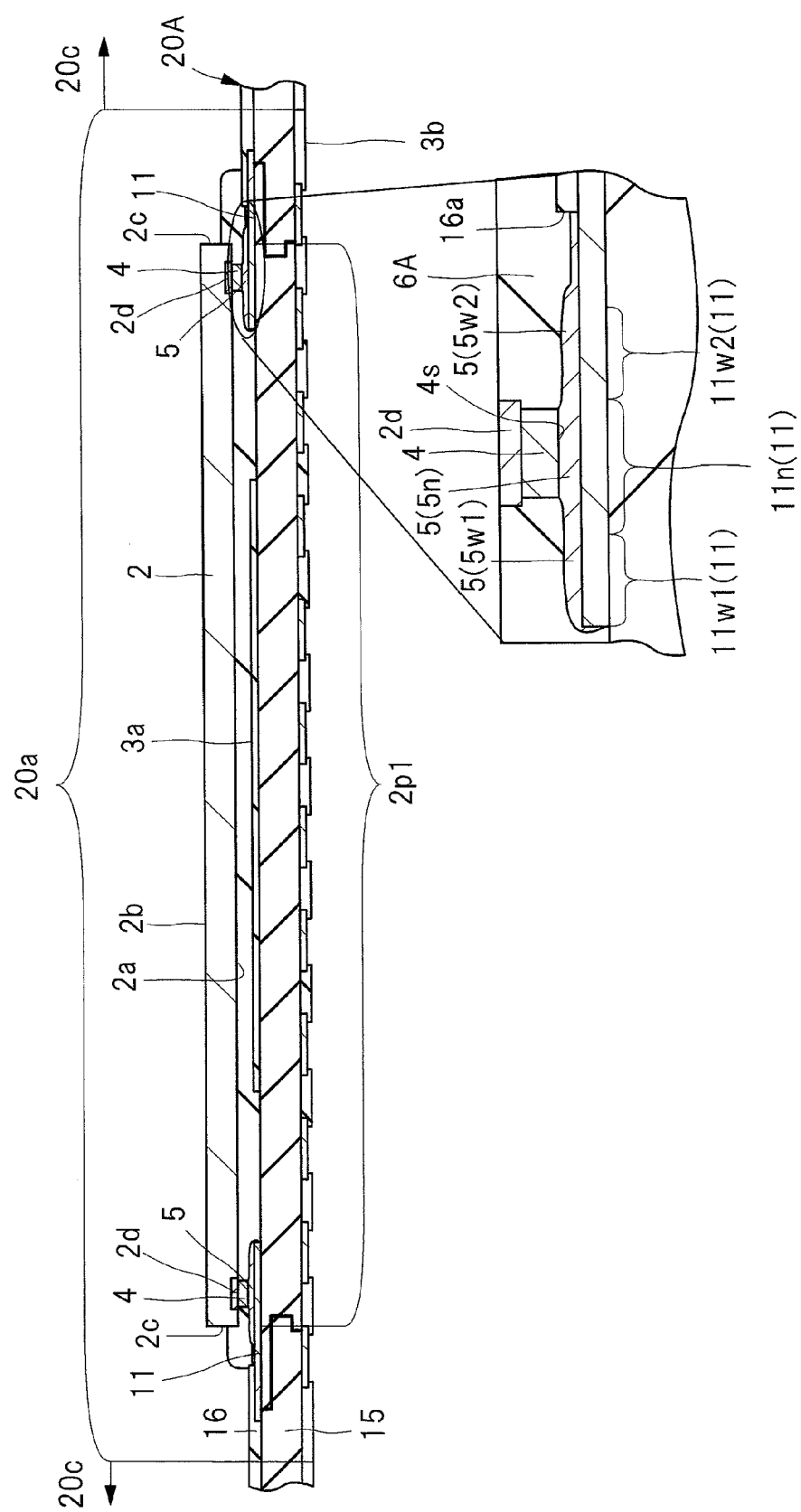
FIG. 44 is an enlarged cross-sectional view illustrating a state in which a semiconductor chip is mounted on the wiring substrate illustrated in FIG. 42.
Figure 45:
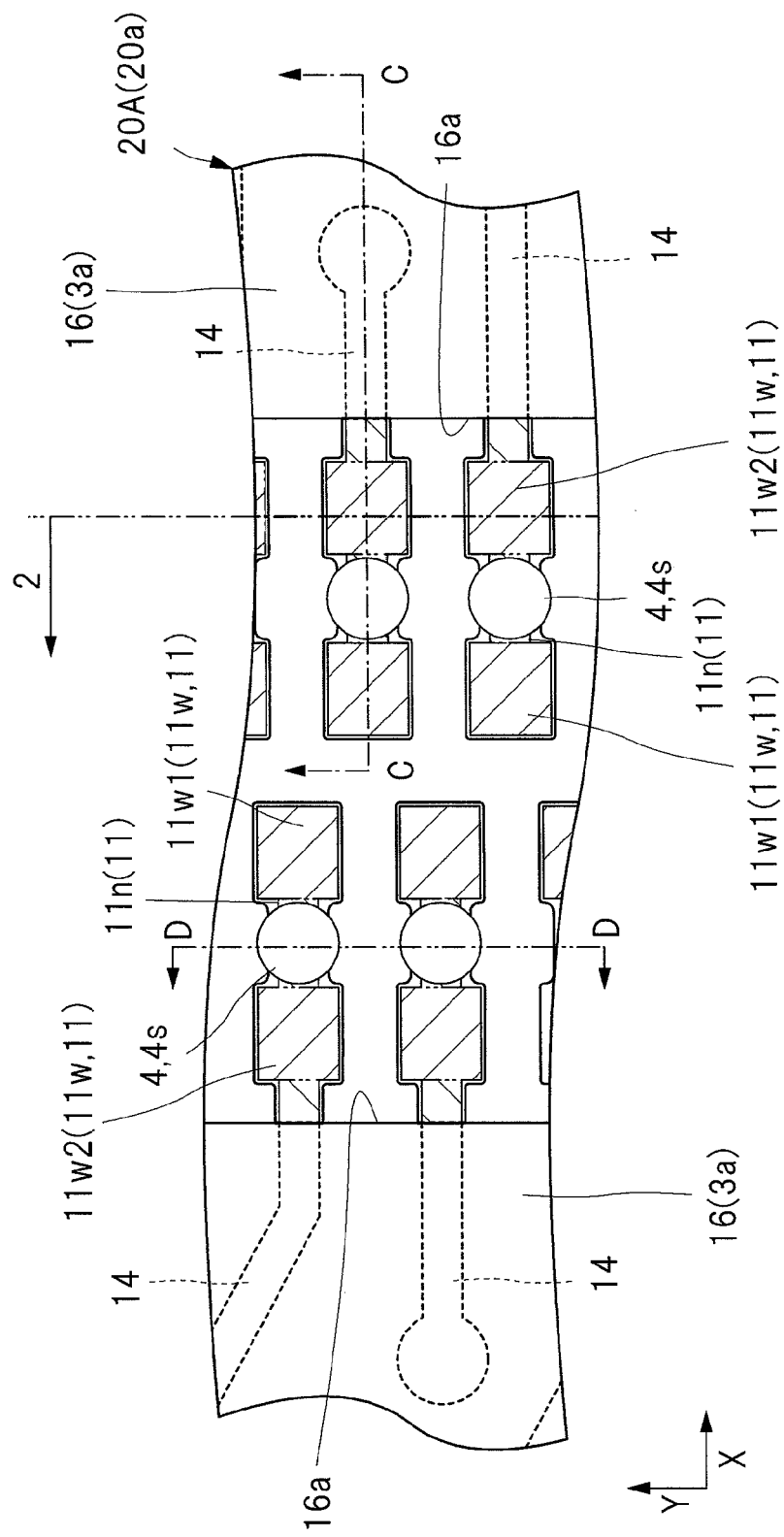
FIG. 45 is an enlarged plan view illustrating a planar positional relation between a protruding electrode and a terminal when a semiconductor chip is arranged on the wiring substrate.
Figure 46:
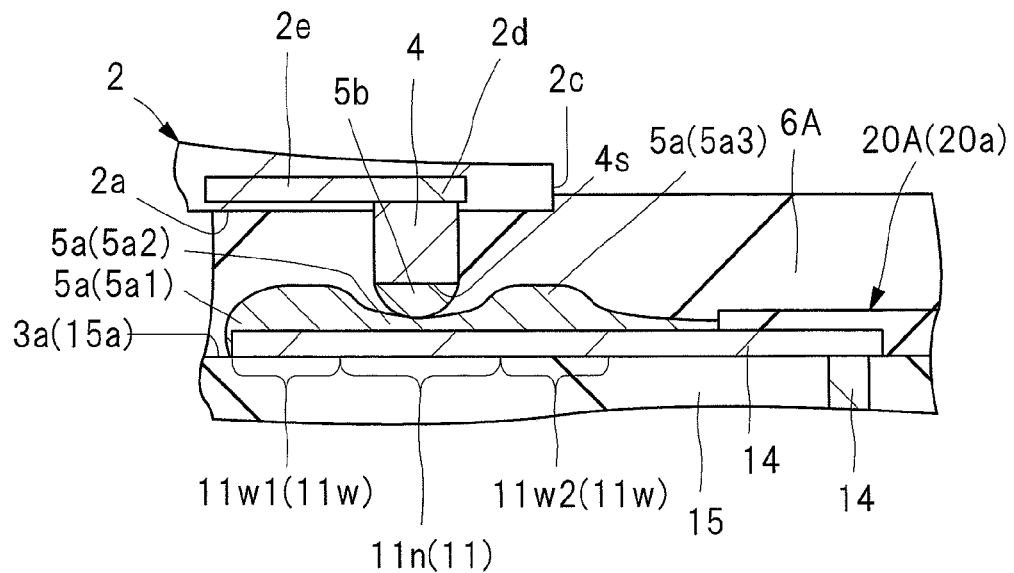
FIG. 46 is an enlarged cross-sectional view taken along a line C-C of FIG. 45.
Figure 47:
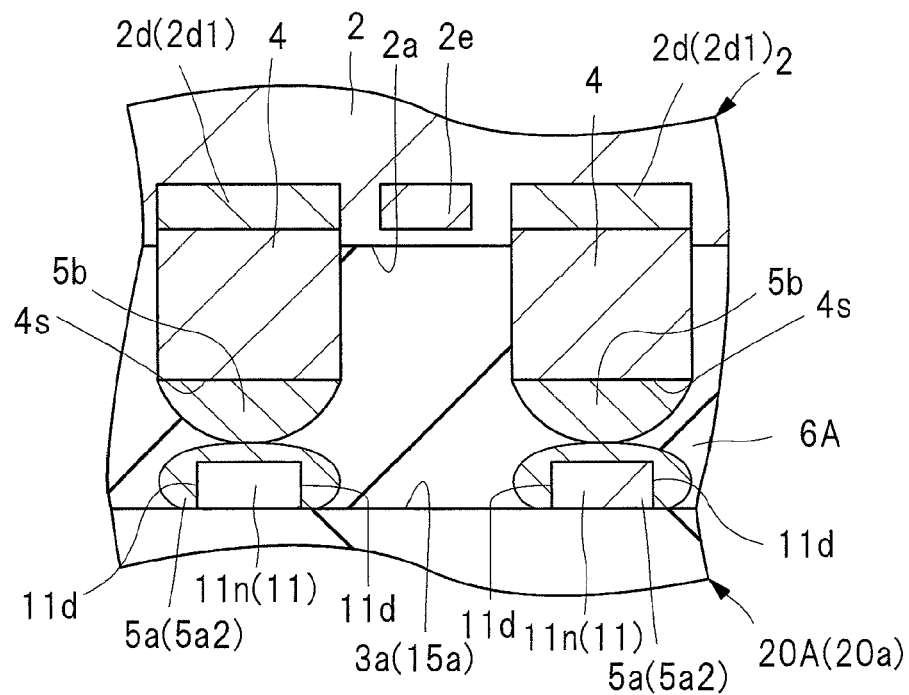
FIG. 47 is an enlarged cross-sectional view taken along a line D-D of FIG. 45.
Figure 48:
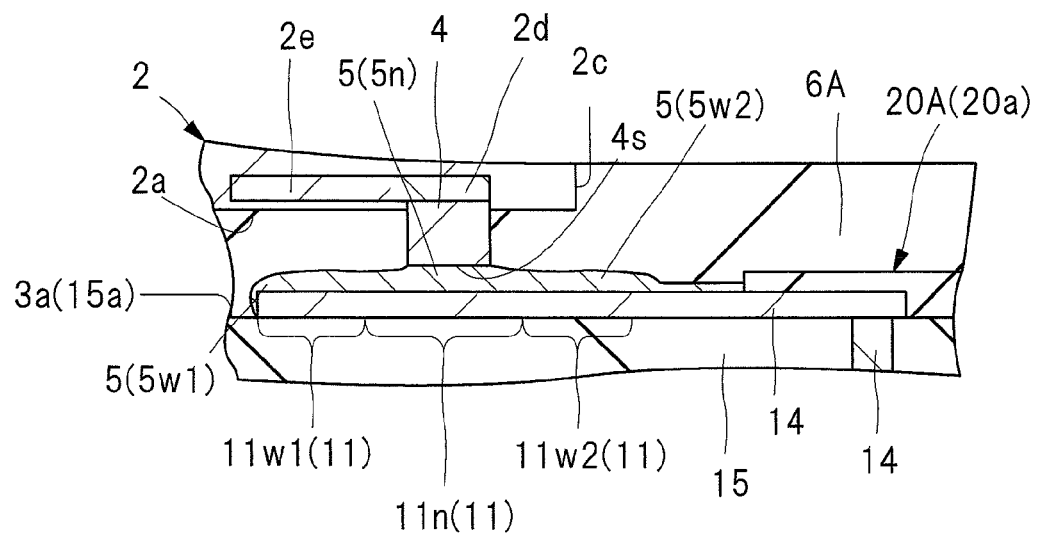
FIG. 48 is an enlarged cross-sectional view illustrating a state in which the contacted solder members as illustrated in FIG. 46 are integrated with each other.
Figure 49:
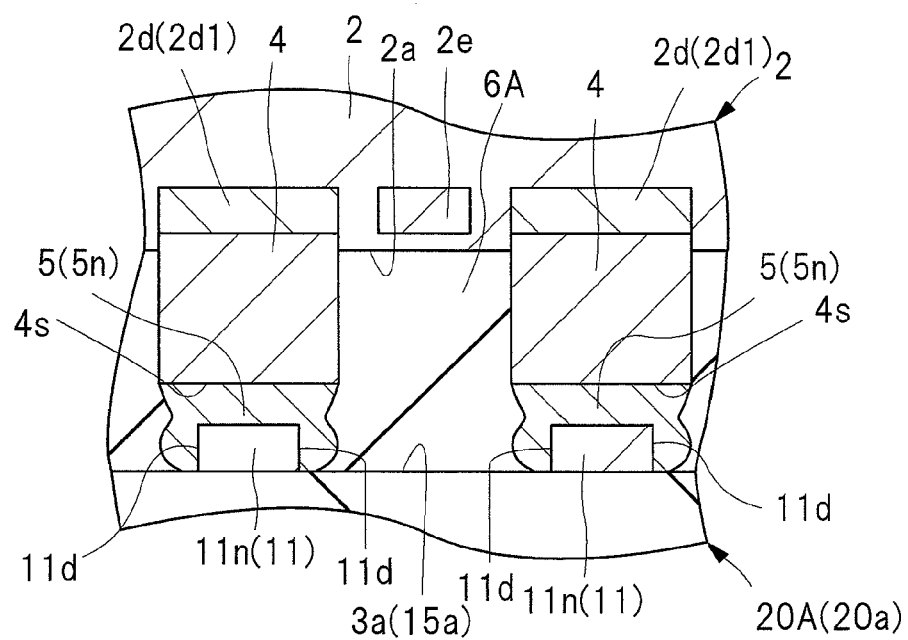
FIG. 49 is an enlarged cross-sectional view illustrating a state in which the contacted solder members as illustrated in FIG. 47 are integrated with each other.
Figure 50:
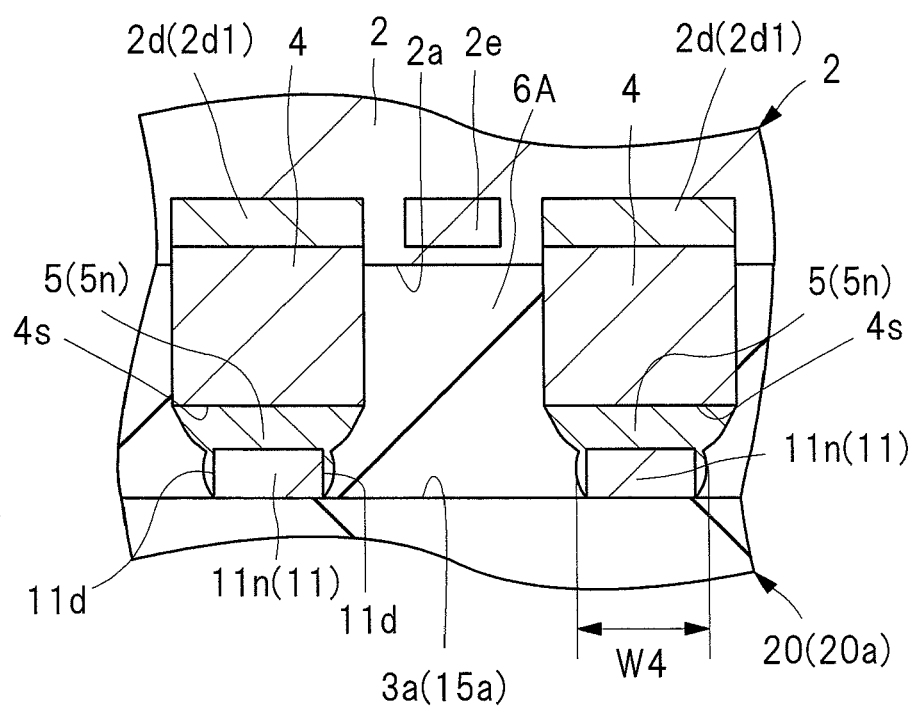
FIG. 50 is an enlarged cross-sectional view illustrating a studied example relative to FIG. 49.

Also, in a chip mounting step illustrated in FIG. 40, as illustrated in FIG. 44, the semiconductor chip 2 is arranged on the chip mounting region 2p1 so that the front surface 2a faces to the upper surface 3a of the wiring substrate 20A, and the plurality of terminals 11 and the plurality of pads 2d are electrically connected to each other. FIG. 44 is an enlarged cross-sectional view illustrating a state in which the semiconductor chip is mounted on a wiring substrate illustrated in FIG. 42. Moreover, FIG. 45 is an enlarged plan view illustrating a planar positional relation between the protruding electrode and the terminal obtained when the semiconductor chip is arranged on the wiring substrate. Further, FIG. 46 is an enlarged cross-sectional view taken along a line C-C of FIG. 45, and FIG. 47 is an enlarged cross-sectional view taken along a line D-D of FIG. 45. Also, FIG. 48 is an enlarged cross-sectional view illustrating a state in which the contacted solder members as illustrated in FIG. 46 are formed integrally with each other, and FIG. 49 is an enlarged cross-sectional view illustrating a state in which the contacted solder members as illustrated in FIG. 47 are formed integrally with each other. Moreover, FIG. 50 is an enlarged cross-sectional view illustrating a study example of FIG. 49.

In the present step, first, as illustrated in FIGS. 45 to 47, the semiconductor chip 2 is arranged on the wiring substrate 20A so that the front surface 2a faces to the upper surface 3a of the wiring substrate 20A (in a semiconductor-chip arrangement step). At this time, as illustrated in FIGS. 46 and 47, the center of the tip surface 4s of the protruding electrode 4 is positioned between the wide width portion 11w1 and the wide width portion 11w2 of the terminal 11. In other words, in the present step, the center of the tip surface 4s of the protruding electrode 4 is arranged on the narrow width portion 11n of the terminal 11 (at a position overlapping the narrow width portion 11n). In still other words, in the present step, a solder member 5b mounted on the tip surface 4s of the protruding electrode 4 is arranged so as to face to the solder member 5a2 of the solder members 5a formed on the terminal 11, the solder member 5a2 being a portion bonded to the narrow width portion 11n of the terminal 11.

Moreover, by making the distance between the front surface 2a of the semiconductor chip 2 and the upper surface 3a of the wiring substrate 20A shorter, the solder members 5b and 5a are in contact with each other. In the present step, for example, by pressing a pressing jig not illustrated from the rear surface 2b side (see FIG. 44) of the semiconductor chip 2, the protruding electrode 4 is penetrated through the sealing material 6A so that the solder members 5a and 5b can be in contact with each other. At this time, the sealing member 6A is tightly adhered to the front surface 2a of the semiconductor chip 2.

In the above-described first embodiment, it has been explained that the solder members 5a and 5b are preferably previously heated (are subjected to the previous thermal step) from the viewpoint of shortening the time required for the temperatures of the solder members 5a and 5b to reach the melting points or higher. However, as illustrated in FIG. 40, in the case of the application of the previous coating method, the previous heating hardens the sealing material 6A, and therefore, is a factor of interruption of the deformation of the solder members 5a and 5b. Therefore, in the case of the previous coating method, it is preferred to maintain the soft sealing material 6A without performing the previous heating treatment.

Next, as illustrated in FIGS. 46 and 47, the solder members 5a and 5b are heated up to the melting points or higher in the state in which the solder members 5a and 5b are in contact with each other. When the solder members 5a and 5b are softened, the distance between the semiconductor chip 2 and the wiring substrate 20A can be further shortened than that in the state illustrated in FIGS. 46 and 47. As explained in the above-described first embodiment, the heating temperature is varied depending on the melting points of the solder members 5a and 5b. However, when a tin-silver (Sn—Ag) based lead-free solder is applied, they are heated at a temperature from 240° C. to 280° C. In the present step, since the solder members 5a and 5b are heated in contact with each other, the solder member 5a can be heated by, for example, heat transfer from the solder member 5b. And, when each of the solder members 5a and 5b is melted, the solder members 5a and 5b are formed integrally with each other. That is, the solder members 5a and 5b are brought into a so-called "wet state". By cooling the melted solder after the integral formation, the solder member 5 as illustrated in FIGS. 48 and 49 is formed.

Here, as explained in the above-described first embodiment, in the case of the application of the post injection system, since the solder member is melted in a state with a void space in the periphery of the solder members 5a and 5b, the melted solder is deformed by the surface tension of the solder component so as to form nearly the spherical shape. However, as illustrated in FIG. 40, in the case of the application of the previous coating method, the sealing material 6A is arranged in the periphery of the solder members 5a and 5b in the step of melting the solder members 5a and 5b. Since the sealing material 6A contains the thermosetting resin, the sealing material 6A is partially started to be hardened by the heat transfer from the solder members 5a and 5b. Therefore, the partially-hardened sealing material 6A becomes the factor of the interruption of the deformation of the solder members. In other words, in the case of the application of the previous coating method, the fluidity of the melted solder is lower than that in the case of the application of the post injection system.

Therefore, in the case of the application of the previous coating method, the shape of the solder member 5 is limited in accordance with melting rates of the solder members 5a and 5b and with a hardening rate of the sealing material 6A. There are various modified examples as the shape of the solder member 5. For example, when the sealing material 6A in the periphery of the solder members 5a and 5b is hardened before the solder members 5a and 5b illustrated in FIG. 47 are formed integrally with each other, a side surface of the solder member 5n is constricted in the planar view as illustrated in FIG. 49 in some cases. In this manner, in the case of the application of the previous coating method, the fluidity of the melted solder is lowered, and therefore, the shapes of the solder members 5a and 5b obtained prior to the chip mounting step tend to be reflected.

Incidentally, for example, as illustrated in FIG. 38, in the case when, the wide width portion 11w is bonded to one end portion of the narrow width portion 11n while the wide width portion 11w is not bonded to the other end portion, the width W4 of the solder member 5a2 in the bonding region with the protruding electrode 4 (see FIG. 39) is narrowed as described above. Therefore, for example, as illustrated in FIG. 50, the width W4 of the solder member 5n is smaller than the width of the protruding electrode 4 in some cases.

In other words, in the bonding region with the protruding electrode 4, the width of the solder member 5n flowing round to the side surface 11d of the narrow width portion 11n is thin. In this case, the thinning becomes a cause of the reduction of the bonding strength between the solder member 5 and the terminal 11.

On the other hand, according to the present embodiment, as illustrated in the above-described FIG. 37, prior to the present step, the width W4 of the solder member 5a2 previously formed in the bonding region with the protruding electrode 4 can be increased. Moreover, from the viewpoint of increasing the width W4 of the solder member 5a2, it is particularly preferred to set the length L1 of the narrow width portion 11n illustrated in FIG. 37 as large as the width W2 of the wide width portion 11w1 and the width W3 of the wide width portion 11w2 or as being smaller than the widths W2 and W3. In this manner, according to the present embodiment, even in the case of the application of the previous coating method in which the fluidity of the melted solder is reduced by the sealing material 6A, the width of the solder member 5n flowing round to the side surface 11d of the narrow width portion 11n can be increased as illustrated in FIG. 49 by increasing the width W4 of the solder member 5a2.

That is, according to the present embodiment, even in the case of the application of the previous coating method, the width of the solder member 5n flowing round to the side surface 11d of the terminal 11 can be increased in the vicinity of the bonding region with the protruding electrode 4, and therefore, the bonding strength between the solder member 5n and the terminal 11 can be improved. And, by improving the bonding strength between the solder member 5n and the terminal 11, the reliability of the semiconductor device 1A illustrated in FIG. 32 can be improved.

Note that each step of the manufacturing steps of FIG. 40 except for the substrate provision step, the sealing-material arrangement step, and the chip mounting step described above are the same as those of the above-described first embodiment, the repetitive explanations thereof will be omitted.

Modified Example of Second Embodiment

As described above, basic configurations of the present embodiment have been explained, and various modified examples can be applied to the present embodiment. Hereinafter, preferable aspects of the present embodiment will be further explained with modified examples thereof.

First Modified Example

Extending Distance of Wide Width Portion

Figure 51:
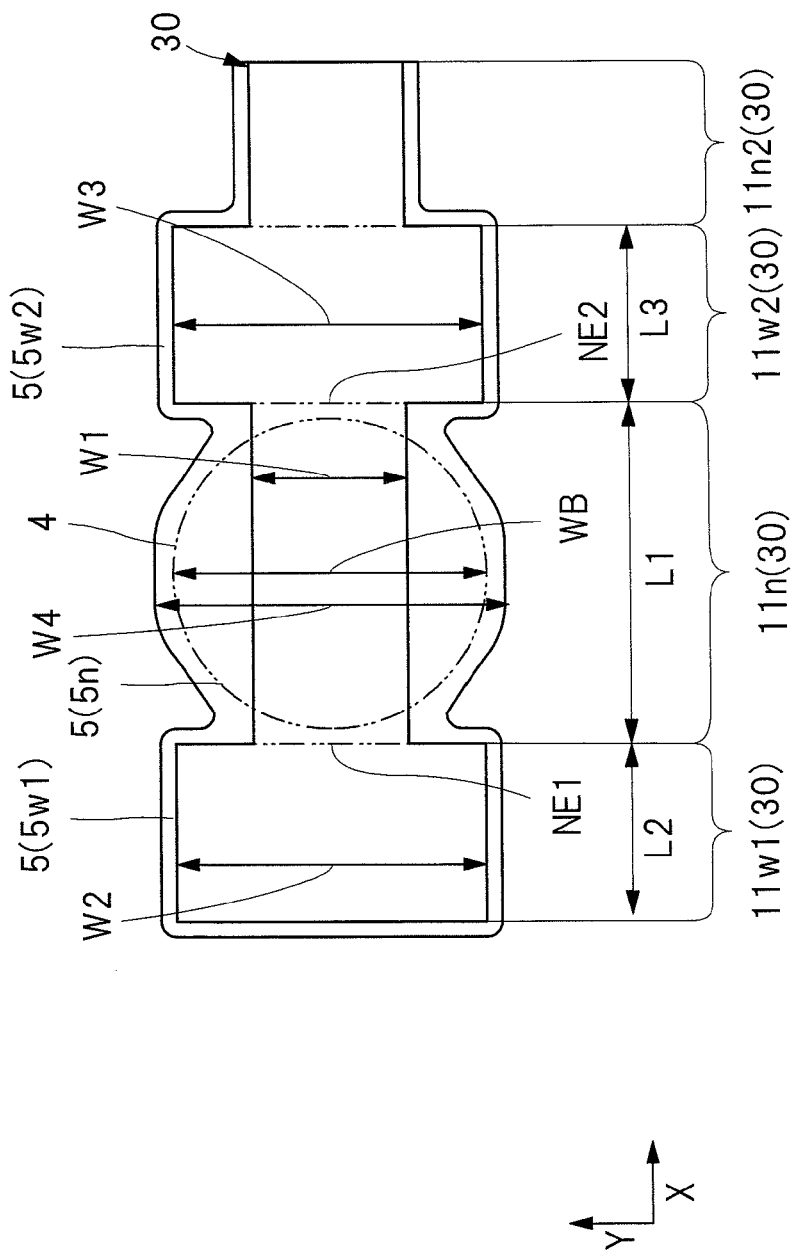
FIG. 51 is an enlarged plan view illustrating a terminal which is a modified example relative to FIG. 33.

First, lengths L2 and L3 of the wide width portions 11w1 and 11w2 in the X direction illustrated in FIG. 33 will be explained. FIG. 51 is an enlarged plan view illustrating a terminal in the modified example of FIG. 33. The terminal 30 illustrated in FIG. 51 is different from the terminal 11 illustrated in FIG. 33 in that the lengths L2 and L3 of the wide width portions 11w1 and 11w2 are shorter than the widths W2 (a length in the Y direction) and the width W3 (a length in the Y direction), respectively. That is the same as the terminal 11 illustrated in FIG. 33 in other points. As described above, when the solder member is applied onto the terminal 30 by using the printing method, and then, the solder member is heated and melted, the melted solder is deformed in accordance with the shape of the terminal 30.

That is, when there are the wide width portion and the narrow width portion in the metal pattern extending in a certain direction, the melted solder tends to be gathered toward the wide width portion.

This tendency occurs regardless of the lengths L2 and L3 of the wide width portions 11w1 and 11w2, and therefore, the melted solder can be gathered toward the wide width portions 11w1 and 11w2 side provided on the both ends of the narrow width portion 11n if the wide width portions 11w1 and 11w2 are formed. Therefore, as illustrated in FIG. 51, for example, the wide width portions 11w having lengths L2 and L3 that are shorter than the widths W2 and W3 can be applied. A plane area of the terminal 30 illustrated in FIG. 51 can be smaller than that of the terminal 11 illustrated in FIG. 33, and therefore, the separated distance between the adjacent terminals 11 can be made wider. In other words, since the plane area of the terminal 30 illustrated in FIG. 51 can be smaller than that of the terminal 11 illustrated in FIG. 33, an arrangement pitch between the plurality of terminals 30 can be further reduced.

However, depending on a relation between the plane area of the wide width portion 11w1 and the applied amount of the entire solder member 5a, the amount of the solder member 5n to be bonded to the narrow width portion 11n is increased as illustrated in FIG. 33 in some cases. Therefore, from a viewpoint of reducing the amount of the solder member 5a2 in the bonding region with the protruding electrode 4 so as to reduce the protruded amount thereof, it is preferred to form the lengths L2 and L3 of the wide width portions 11w1 and 11w2 to be long as illustrated in FIG. 33. According to the studies made by the inventors of the present application, by forming the lengths L2 and L3 of the wide width portions 11w1 and 11w2 to be longer than the widths W2 and W3, respectively, the amount of the solder member 5n arranged on the narrow width portion 11n can be stably reduced.

Second Modified Example

Extending Distance of Narrow Width Portion

Figure 52:
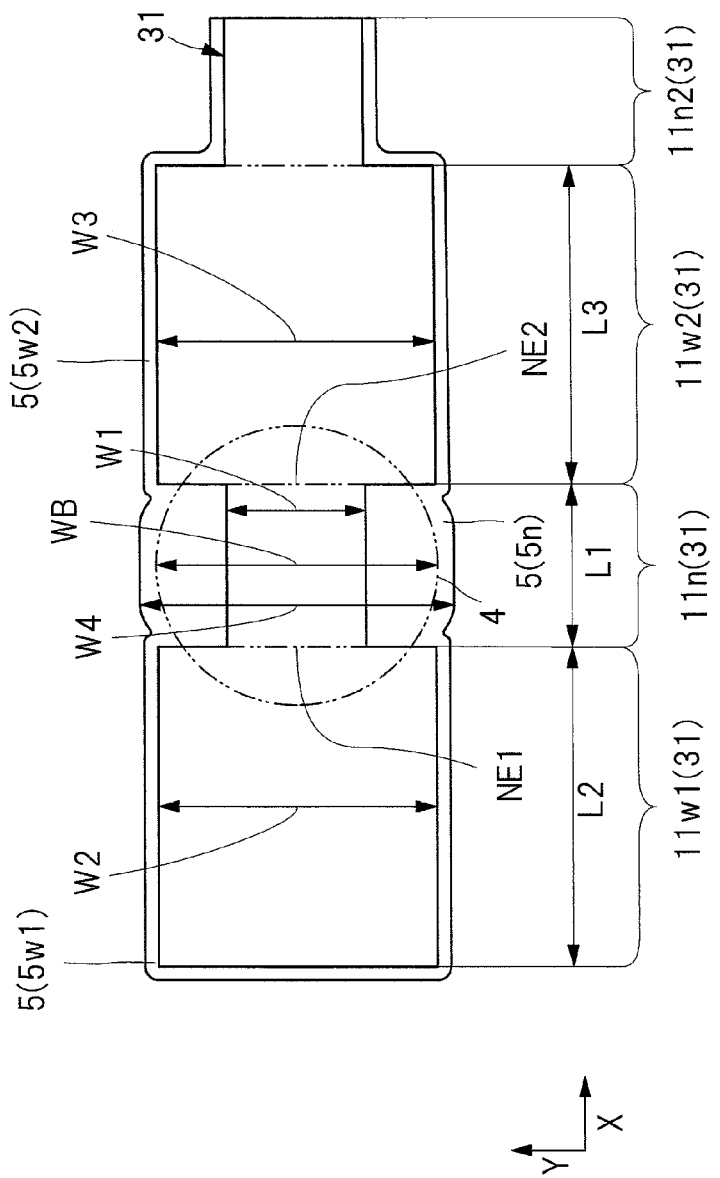
FIG. 52 is an enlarged plan view illustrating a terminal which is another modified example relative to FIG. 33.

Next, the separated distance L1 between the end portions NE1 and NE2, that is, an extending distance of the narrow width portion 11n will be explained. FIG. 52 is an enlarged plan view illustrating a terminal in another modified example of FIG. 33. The terminal illustrated in FIG. 52 is different from the terminal 11 illustrated in FIG. 33 in that the separated distance L1 between the wide width portions 11w1 and 11w2, that is, the extending distance of the narrow width portion 11n along the X direction, is shorter than the width WB of the protruding electrode 4. That is the same as the terminal 11 illustrated in FIG. 33 in other points.

As illustrated in FIG. 52, when the separated distance L1 between the wide width portions 11w1 and 11w2 is shorter than the width WB of the protruding electrode 4, a part of the tip surface of the protruding electrode 4 is arranged at a position where it overlaps each of the wide width portions 11w1 and 11w2. In this case, in comparison with the terminal 11 illustrated in FIG. 33, the plane area of the narrow width portion 11n is relatively small, and therefore, the protruded amount of the solder member 5n is easily increased.

However, as explained by using FIG. 37, when the narrow width portion 11n is bonded between the adjacent wide width portions 11w1 and 11w2, the amount of the solder member 5a2 formed on the narrow width portion 11n is less than the amounts of the solder members 5a1 and 5a3 formed on the wide width portions 11w1 and 11w2. This phenomenon similarly occurs also in the case of the short extending distance of the narrow width portion 11n as seen in the terminal 31. Therefore, by bonding the protruding electrode 4 and the terminal 31 to each other so that the center of the tip surface of the protruding electrode 4 overlaps the narrow width portion 11n, the protruding electrode 4 can be bonded to a region where the amount of the solder member 5a (see FIG. 37) is relatively small. Moreover, in the case of the arrangement of the wide width portions 11w1 and 11w2 in the vicinity of the narrow width portion 11n that is the bonding region with the protruding electrode 4, when the solder members 5a and 5b (see FIG. 47) are melted to be formed integrally with each other, the melted solder tends to partially flow out toward the wide width portions 11w1 and 11w2. Therefore, by arranging the center of the tip surface of the protruding electrode 4 so as to be positioned between the wide width portions 11w1 and 11w2 in the above-described chip mounting step, the protruded amount of the solder member 5n can be reduced.

Moreover, in the case of the terminal 31, the plane area of the bonding region with the protruding electrode 4 which is formed of the wide width portions 11w1 and 11w2 and the narrow width portion 11n can be smaller than that of the terminal 11 illustrated in FIG. 33. Therefore, from the viewpoint of reducing the plane area of the terminal 11, the terminal 31 is more preferably used.

Moreover, as described above, in the case of the application of the previous coating method when the sealing material 6A is arranged, the shape of the previously-formed solder member 5a is difficult to deform, and therefore, it is preferred to increase the amount of the solder member 5a2 flowing round to the side surface 11d of the narrow width portion 11n from the viewpoint of improving the bonding strength between the solder member 5 and the narrow width portion 11n. In the case of the terminal 31, since the extending distance of the narrow width portion 11n is short, the amount of the solder member 5a2 flowing round to the side surface 11d of the narrow width portion 11n can be more than that of the terminal 11 illustrated in FIG. 33. Therefore, from the viewpoint of improving the bonding strength between the terminal 11 and the solder member 5, the separated distance L1 between the wide width portions 11w1 and 11w2 is preferably shorter than the width WB of the protruding electrode 4 as illustrated in FIG. 52.

As described above, from the viewpoint of improving the bonding strength between the solder member 5 and the narrow width portion 11n and reducing the protruded amount of the solder member 5n, it is particularly preferred to form the separated distance L1 between the wide width portions 11w1 and 11w2 to be equal to the width WB of the protruding electrode 4.

Third Modified Example

Shape of Terminal

Figure 53:
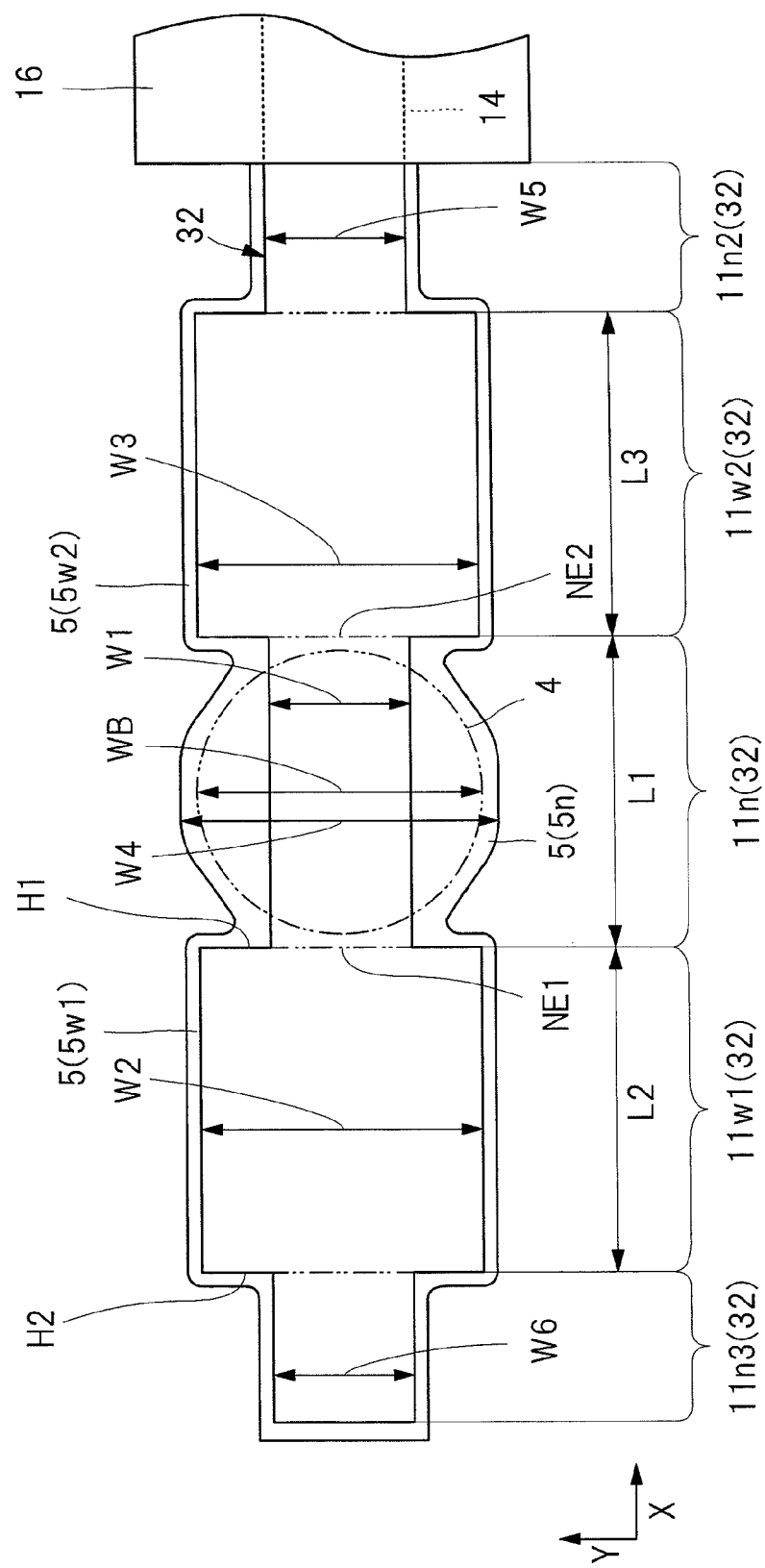
FIG. 53 is an enlarged plan view illustrating a terminal which is still another modified example relative to FIG. 33.

Next, a modified example in which shapes of members to be bonded to the wide width portion 11w1 and the wide width portion 11w2 are made equal to each other will be explained. FIG. 53 is an enlarged plan view illustrating a terminal in another modified example of FIG. 33. The terminal 32 illustrated in FIG. 53 is different from the terminal 11 illustrated in FIG. 33 in that a narrow width portion 11n3 is formed on an opposite side of a side on which the wide width portion 11w1 is bonded to the narrow width portion 11n. That is the same as the terminal 11 illustrated in FIG. 33 in other points.

In addition to the wide width portions 11w1 and 11w2 and the narrow width portion 11n, the terminal 32 illustrated in FIG. 53 is provided with the following portion. That is, the terminal 32 has a narrow width portion 11n2 that is a portion having a width W5 (a length along the Y direction) smaller than the widths W2 and W3 (lengths along the Y direction) and being arranged between the wide width portion 11w2 and a wire 14. The narrow width portion 11n2 is coated with a solder resist film 16, and is made of the same material and is formed with the same width as that of the wire 14 electrically connected (integrally formed) with the terminal 32. Note that the narrow width portion 11n2 also has the terminal 11 illustrated in FIG. 33, the terminal 30 illustrated in FIG. 51, and the terminal 31 illustrated in FIG. 52.

Moreover, the terminal 32 has a narrow width portion 11n3 that is a portion having a width W6 (a length in the Y direction) smaller than the widths W2 and W3 and being arranged on a side H2 on an opposite side of a side H1 of the wide width portion 11w1, which is bonded to the narrow width portion 11n. That is, the terminal 32 has the narrow width portion 11n3 that is bonded to the side opposite to the narrow width portion 11n through the wide width portion 11w1.

Moreover, the width W5 of the narrow width portion 11n2 and the width W6 of the narrow width portion 11n3 are equal to each other, and are also equal to the width (the length in the Y direction) of the wire 14, in, for example, the example illustrated in FIG. 53. In the case of the terminal 11 illustrated in FIG. 33, it has been explained that the areas of the wide width portions 11w1 and 11w2 and the shapes thereof are preferably made equal to each other from the viewpoint of setting the amounts of the melted solder gathered onto the wide width portion 11w1 and the melted solder gathered onto the wide width portion 11w2 to be equal to each other. However, while the narrow width portion 11n2 is bonded to the wide width portion 11w2, a portion corresponding to the narrow width portion 11n2 is not bonded to the wide width portion 11w1, and therefore, they are technically different from each other in the gathering state of the melted solder.

Accordingly, in the terminal 32 illustrated in FIG. 53, the narrow width portion 11n3 having the same width W6 as that of the narrow width portion 11n2 is bonded to the wide width portion 11w1. Thus, the amount of the melted solder that gathers to the wide width portion 11w1 and the amount of the melted solder that gathers to the wide width portion 11w2 are made equal to each other with high accuracy.

Figure 54:
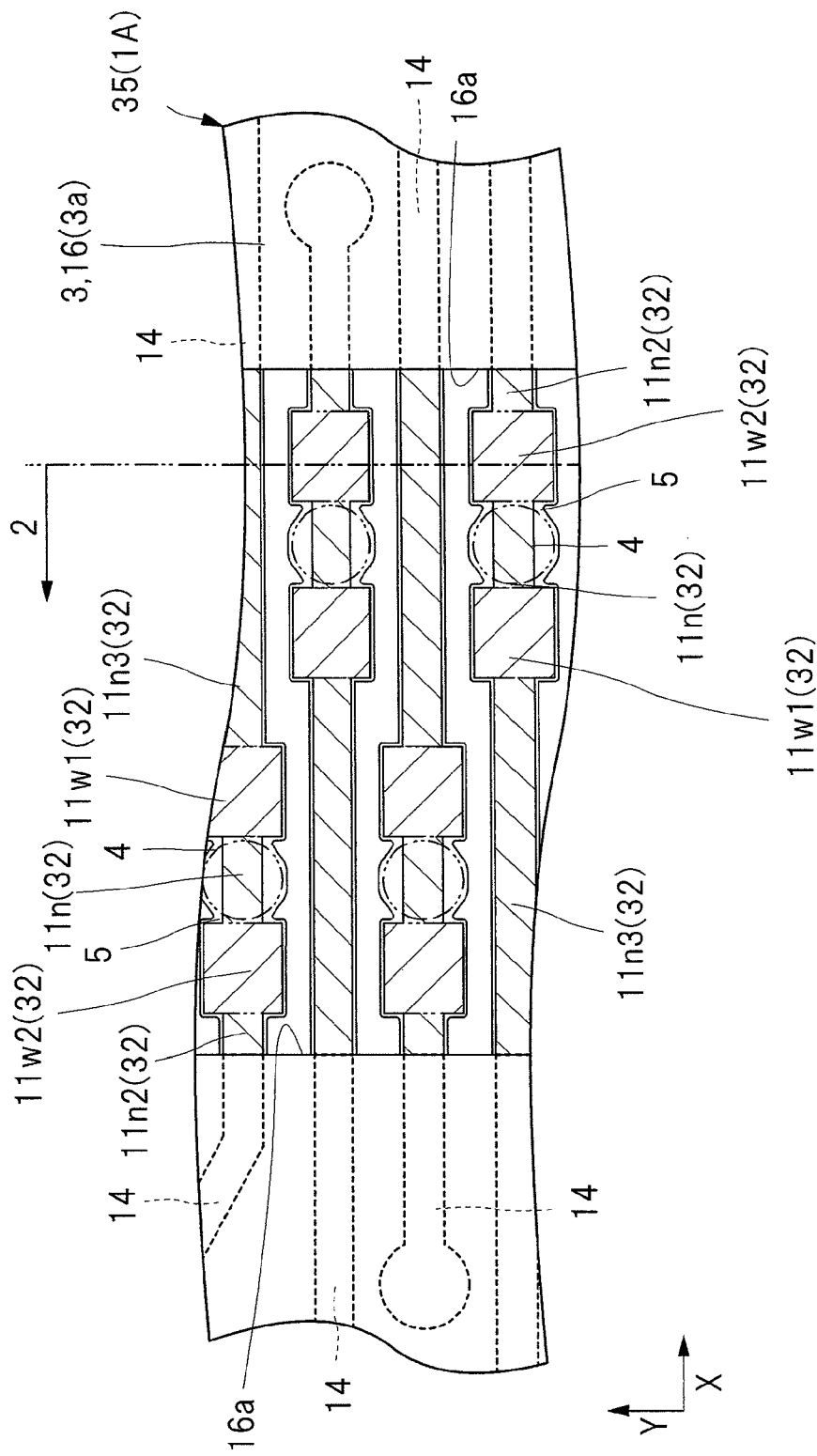
FIG. 54 is an enlarged plan view illustrating a modified example relative to FIG. 32.

Moreover, the further application of the configuration of the terminal 32 illustrated in FIG. 53 can be applied to the configuration illustrated in FIG. 54. FIG. 54 is an enlarged plan view illustrating a modified example of FIG. 32. For example, each of the aspects described above has been explained as the aspect in which, while one end portion of each of the terminals 11, 30, 31, and 32 is not bonded to another conductor pattern, the other end portion thereof is bonded to the wire 14.

In an example illustrated in FIG. 54, the both end portions of the terminal 32 are bonded to the respective wires 14. A wiring substrate 35 illustrated in FIG. 42 is different from the wiring substrate 3 illustrated in FIG. 32 in that the both ends of the terminal 32 are bonded to the respective wires 14 coated with the solder resist film 16. That is the same as the wiring substrate 3 in other points.

As illustrated in FIG. 54, when the both end portions of the terminal 32 are bonded to the respective wires 14, the terminals can be bonded to a wiring layer in a lower layer (a wire of the wiring layer in the lower layer) via either one of the wires 14. That is, while it is required to form a via wire in order to electrically connect to the wire of the wiring layer in the lower layer, the both end portions of the terminal 32 are bonded to the respective wires 14 in the case of the wiring substrate 35. Therefore, the degree of freedom in layout for the via wire can be improved.

Other Modified Example

In the foregoing, the invention made by the present inventors has been concretely described based on the embodiments. However, it is needless to say that the present invention is not limited to the foregoing embodiments and various modifications and alterations can be made within the scope of the present invention.

Figure 55:
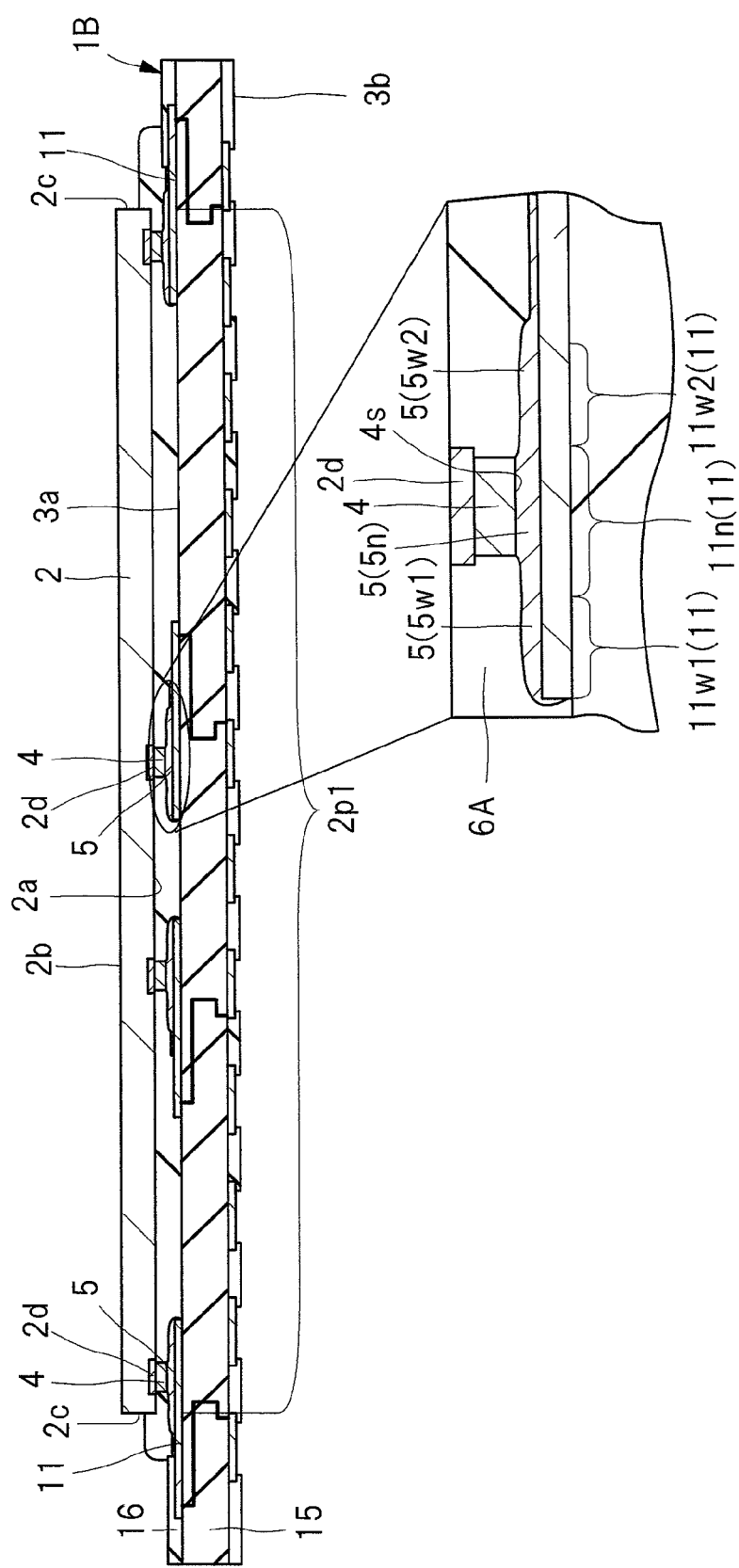
FIG. 55 is a cross-sectional view illustrating a semiconductor device which is a modified example relative to FIG. 2.

For example, in the above-described embodiments, the explanations have been made regarding the aspect in which the plurality of protruding electrodes 4 formed on the peripheral edge of the semiconductor chip 2 are bonded to the terminals, 11, 30, 31, and 32, formed on the wiring substrates 3, 20, 20A, and 35. However, for example, as similar to the semiconductor device 1B illustrated in FIG. 55, the pad 2d and the protruding electrode 4 are formed in the center portion of the front surface 2a of the semiconductor chip 2, and this protruding electrode 4 is electrically connected to the wiring substrate 3 in some cases. FIG. 55 is a cross-sectional view illustrating a semiconductor device in a modified example of FIG. 2. In this case, the configurations of the terminals 11, 30, 31, and 32 explained in the above-described embodiments can be applied as bonding leads bonded to the protruding electrode 4 formed in the center portion of the front surface 2a of the semiconductor chip 2.

Moreover, for example, in the above-described embodiments, the explanations have been made regarding the semiconductor device 1 in which one semiconductor chip 2 is mounted on the wiring substrate 3 by using the flip-chip mounting system. However, the number of the semiconductor chips mounted on the wiring substrate is not limited to one. For example, the invention can be applied to a semiconductor device of an SIP (System in Package) type in which a plurality of semiconductor chips are stacked. Moreover, for example, the invention can be applied to a semiconductor device referred to as POP (Package on Package) formed by stacking another semiconductor device on the wiring substrate 3.

Further, for example, in the above-described embodiments, the explanations have been made regarding the aspect of the bonding with the protruding electrode 4 made of, for example, copper (Cu) and formed into the column shape, via the solder member 5. However, various modified examples can be applied. For example, even in usage of a protruding electrode made of gold (Au) and formed by using a ball bonding technique is used, when the protruding electrode is bonded to a solder member coated on the terminal 11 in a state in which a solder member has been previously adhered on the protruding electrode, the short-circuit failure occurs in some cases depending on the protruded amount of the solder member as described above. Therefore, by using the techniques explained in the above-described embodiments, this problem can be suppressed.

Further, for example, in the above-described embodiments, as the explanations for the method of manufacturing the semiconductor device, the explanations have been made regarding the aspect of usage of so-called multiple-piece taking substrate having the plurality of product formation regions 20a. However, as a modified example, a wiring substrate previously separated into individual product formation regions each corresponding to one semiconductor device can be also used. In this case, the separating step illustrated in FIGS. 10 and 40 can be omitted.

What is claimed is:

1. A method of manufacturing a semiconductor device, comprising:
   (a) providing a wiring substrate including a chip mounting surface, a plurality of terminals formed on the chip mounting surface, and a plurality of first solder members respectively arranged on the plurality of terminals,
   wherein each of the plurality of terminals includes a first portion, a second portion and a third portion,
   wherein, in plan view, the first, second and third portions are arranged along a first direction,
   wherein, in plan view, the first portion is arranged between the second portion and the third portion, and
   wherein, in plan view, a width of each of the second and third portions is larger than a width of the first portion, said width of each of the first, second, and third portions being measured along a second direction perpendicular to the first direction; and
   (b) after the step (a), arranging a semiconductor chip over the wiring substrate such that a front surface of the semiconductor chip faces to the chip mounting surface of the wiring substrate, and electrically connecting a plurality of pads formed on the front surface with the plurality of terminals via a plurality of protruding electrodes respectively formed on the plurality of pads and the plurality of first solder members, respectively,
   wherein, in plan view, the plurality of terminals are arranged side-by-side with each other, and
   wherein, in the step (b), the semiconductor chip is arranged over the wiring substrate such that a center of each of the plurality of protruding electrodes is positioned between the second portion and the third portion of the respective terminal, and such that each of the plurality of protruding electrodes does not overlap with the second and third portions of the respective terminal in plan view.

2. The method of manufacturing the semiconductor device according to claim 1, wherein an area of the second portion and an area of the third portion are equal to each other in plan view.

3. The method of manufacturing the semiconductor device according to claim 2, wherein the second width of the second portion and the third width of the third portion are equal to each other.

4. The method of manufacturing the semiconductor device according to claim 3,
   wherein a plurality of second solder members are attached to end surfaces of the plurality of protruding electrodes, respectively, and
   wherein, in the step (b), the plurality of first solder members and the second solder members are melted to be bonded to each other.

5. The method of manufacturing the semiconductor device according to claim 4, wherein, in the step (b), the protruding electrodes are arranged so that a part of a tip end surface of each of the protruding electrodes overlaps the second portion and the third portion in plan view.

6. The method of manufacturing the semiconductor device according to claim 4, wherein a length of the second portion in the first direction is larger than the second width, and a length of the third portion in the first direction is larger than the third width.

7. The method of manufacturing the semiconductor device according to claim 4, wherein the wiring substrate provided in the step (a) includes:
an insulating film formed so as to cover the chip mounting surface and so as to expose the terminals, and
a plurality of wires being covered with the insulating film and being electrically connected to the terminals, and
each of the terminals includes:
a fourth portion being arranged between a first wire of the wires and a third portion to which the first wire is electrically connected, and
a fifth portion being connected to a side opposite to the first portion via the second portion,
the fourth portion has a fourth width smaller than the second width and the third width in the second direction, and the fifth portion has a fifth width equal to the fourth width in the second direction.

8. The method of manufacturing the semiconductor device according to claim 4, wherein
each of the plurality of first solder members includes:
a first part positioned on the first portion of the respective terminal;
a second part positioned on the second portion of the respective terminal; and
a third part positioned on the third portion of the respective terminal,
in the step (a), a thickness of the first part of each of the plurality of first solder members is thinner than a thickness of the second part and a thickness of the third part of each of the first solder members.

9. The method of manufacturing the semiconductor device according to claim 8, wherein the method further includes:
(c) subsequent to the step (b), supplying a resin to a portion between the chip mounting surface of the wiring substrate and the semiconductor chip, and sealing a bonding portion between the plurality of pads of the semiconductor chip and the plurality of terminals of the wiring substrate.

10. The method of manufacturing the semiconductor device according to claim 8, wherein the method further includes:
(c) subsequent to the step (a) but prior to the step (b), arranging an insulating sealing member so as to cover a chip mounting region of the chip mounting surface of the wiring substrate.

11. The method of manufacturing the semiconductor device according to claim 10, wherein a thermosetting resin is contained in the sealing member.

12. The method of manufacturing the semiconductor device according to claim 1, wherein in the step (a), the plurality of first solder members are respectively formed on the plurality of terminals by:
(a1) providing the wiring substrate including the chip mounting surface, and the plurality of terminals formed on the chip mounting surface;
(a2) after the step (a1), applying a solder paste so as to cover the plurality of terminals as one batch; and
(a3) after the step (a2), performing a thermal treatment on the wiring substrate.

13. The method of manufacturing the semiconductor device according to claim 1, wherein, prior to step (b), the plurality of first solder members are formed by:
applying a solder paste layer that covers each of the plurality of terminals formed on the chip mounting surface of the wiring substrate; and
subjecting the solder paste layer to a thermal treatment.

* * * * *